US011514753B2

(12) United States Patent
Davis et al.

(10) Patent No.: US 11,514,753 B2
(45) **Date of Patent: *Nov. 29, 2022**

(54) DISTRIBUTED SIDE WAGERING METHODS AND SYSTEMS

(71) Applicant: IGT, Las Vegas, NV (US)

(72) Inventors: Dwayne Davis, Reno, NV (US); Christiaan R. Champagne, Reno, NV (US); Damien C. Ennis, Reno, NV (US); Michael P. Khamis, Reno, NV (US); David N. Myers, Reno, NV (US); David Palmer, Reno, NV (US); Richard E. Rowe, Las Vegas, NV (US); Richard J. Schneider, Las Vegas, NV (US); Darryll Pleasant, Las Vegas, NV (US)

(73) Assignee: IGT, Las Vegas, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/935,403

(22) Filed: Jul. 22, 2020

(65) Prior Publication Data

US 2021/0012613 A1 Jan. 14, 2021

Related U.S. Application Data

(63) Continuation of application No. 15/964,535, filed on Apr. 27, 2018, now abandoned, which is a
(Continued)

(51) Int. Cl.
*G07F 17/32* (2006.01)

(52) U.S. Cl.
CPC .......... *G07F 17/3244* (2013.01); *G07F 17/32* (2013.01); *G07F 17/322* (2013.01);
(Continued)

(58) Field of Classification Search
CPC .... G07F 17/32; G07F 17/322; G07F 17/3225; G07F 17/3239; G07F 17/3241; G07F 17/3244
See application file for complete search history.

(56) References Cited

U.S. PATENT DOCUMENTS

| | | |
|---|---|---|
| 3,708,219 A | 1/1973 | Forlini et al. |
| 4,333,715 A | 6/1982 | Brooks |

(Continued)

FOREIGN PATENT DOCUMENTS

| | | |
|---|---|---|
| GB | 2403429 | 1/2005 |
| WO | WO-99/42889 | 8/1999 |

(Continued)

OTHER PUBLICATIONS

U.S. Non-Final Office Action dated Oct. 6, 2010 from U.S. Appl. No. 11/642,410.

(Continued)

*Primary Examiner* — Seng H Lim
(74) *Attorney, Agent, or Firm* — Neal, Gerber & Eisenberg LLP

(57) ABSTRACT

Various techniques are disclosed for facilitating side wagering activities conducted at a casino which includes a casino gaming network. In at least one embodiment, the gaming network includes a plurality of gaming devices, including a first gaming device. A side wager request may be received for placing a first side wager relating to a first target. An identity of a first player associated with generating the first side wager request may be determined. A first side wager session may be automatically initiated. In at least one embodiment, the placing of the first side wager includes placing first wager on a game play-related event or activity associated with the second person, wherein an outcome of the game play-related event or activity is influenced by a decision or action of the second person. In one embodiment,
(Continued)

the first side wager includes first side wager criteria specifying that an outcome of the first side wager is related to at least one event associated with a different player's game play which is associated with the first target.

20 Claims, 29 Drawing Sheets

Related U.S. Application Data continuation of application No. 15/072,043, filed on Mar. 16, 2016, now Pat. No. 9,972,169, which is a continuation of application No. 12/344,115, filed on Dec. 24, 2008, now Pat. No. 9,292,996, which is a continuation-in-part of application No. 12/265,627, filed on Nov. 5, 2008, now abandoned, and a continuation-in-part of application No. 11/642,410, filed on Dec. 19, 2006, now Pat. No. 7,980,948.

(60) Provisional application No. 61/010,084, filed on Jan. 4, 2008.

(52) U.S. Cl.
CPC ...... *G07F 17/3225* (2013.01); *G07F 17/3239* (2013.01); *G07F 17/3241* (2013.01); *H05K 999/99* (2013.01)

(56) References Cited

U.S. PATENT DOCUMENTS

| | | | |
|---|---|---|---|
| 4,517,558 | A | 5/1985 | Davids |
| 4,607,844 | A | 8/1986 | Fullerton |
| 4,621,814 | A | 11/1986 | Stepan et al. |
| 4,659,182 | A | 4/1987 | Aizawa |
| 4,718,672 | A | 1/1988 | Okada |
| 4,911,449 | A | 3/1990 | Dickinson et al. |
| 4,912,548 | A | 3/1990 | Shanker et al. |
| 5,086,354 | A | 2/1992 | Bass et al. |
| 5,113,272 | A | 5/1992 | Reamey |
| 5,132,839 | A | 7/1992 | Travis |
| 5,248,142 | A | 9/1993 | Breeding |
| 5,288,081 | A | 2/1994 | Breeding |
| 5,319,491 | A | 6/1994 | Selbrede |
| 5,325,830 | A | 7/1994 | Hammer |
| 5,342,047 | A | 8/1994 | Heidel et al. |
| 5,364,100 | A | 11/1994 | Ludlow et al. |
| 5,376,587 | A | 12/1994 | Buchmann et al. |
| 5,393,061 | A | 2/1995 | Manship et al. |
| 5,467,893 | A | 11/1995 | Landis et al. |
| 5,472,194 | A | 12/1995 | Breeding et al. |
| 5,494,296 | A | 2/1996 | Grassa |
| 5,539,547 | A | 7/1996 | Ishii et al. |
| 5,544,892 | A | 8/1996 | Breeding |
| 5,580,055 | A | 12/1996 | Hagiwara |
| 5,585,821 | A | 12/1996 | Ishikura et al. |
| 5,589,980 | A | 12/1996 | Bass et al. |
| 5,745,197 | A | 4/1998 | Leung et al. |
| 5,752,881 | A | 5/1998 | Inoue |
| 5,764,317 | A | 6/1998 | Sadovnik et al. |
| 5,788,574 | A | 8/1998 | Ornstein et al. |
| 5,839,730 | A | 11/1998 | Pike |
| 5,839,731 | A | 11/1998 | Feola |
| 5,910,046 | A | 6/1999 | Wada et al. |
| 5,951,397 | A | 9/1999 | Dickinson |
| 5,956,180 | A | 9/1999 | Bass et al. |
| 5,967,893 | A | 10/1999 | Lawrence et al. |
| 6,001,016 | A | 12/1999 | Walker et al. |
| 6,015,346 | A | 1/2000 | Bennett |
| 6,019,374 | A | 2/2000 | Breeding |
| 6,027,115 | A | 2/2000 | Griswold et al. |
| 6,039,650 | A | 3/2000 | Hill |
| 6,050,895 | A | 4/2000 | Luciano et al. |
| 6,054,969 | A | 4/2000 | Haisma |
| 6,056,641 | A | 5/2000 | Webb |
| 6,059,658 | A | 5/2000 | Mangano et al. |
| 6,135,884 | A | 10/2000 | Hedrick et al. |
| 6,149,522 | A | 11/2000 | Alcorn et al. |
| 6,159,098 | A | 12/2000 | Slomiany et al. |
| 6,165,069 | A | 12/2000 | Sines et al. |
| 6,213,875 | B1 | 4/2001 | Suzuki |
| 6,244,596 | B1 | 6/2001 | Kondratjuk |
| 6,251,014 | B1 | 6/2001 | Stockdale et al. |
| 6,252,707 | B1 | 6/2001 | Kleinberger et al. |
| 6,254,481 | B1 | 7/2001 | Jaffe |
| 6,264,561 | B1 | 7/2001 | Saffari |
| 6,315,666 | B1 | 11/2001 | Mastera et al. |
| 6,336,857 | B1 | 1/2002 | McBride |
| 6,337,513 | B1 | 1/2002 | Clevenger et al. |
| 6,347,996 | B1 | 2/2002 | Gilmore et al. |
| 6,368,216 | B1 | 4/2002 | Hedrick et al. |
| 6,379,244 | B1 | 4/2002 | Sagawa et al. |
| 6,394,907 | B1 | 5/2002 | Rowe |
| 6,398,220 | B1 | 6/2002 | Inoue |
| 6,416,827 | B1 | 7/2002 | Chakrapani et al. |
| 6,435,970 | B1 | 8/2002 | Baerlocher et al. |
| 6,444,496 | B1 | 9/2002 | Edwards et al. |
| 6,445,185 | B1 | 9/2002 | Damadian et al. |
| 6,491,583 | B1 | 12/2002 | Gauselmann |
| 6,503,147 | B1 | 1/2003 | Stockdale et al. |
| 6,511,375 | B1 | 1/2003 | Kaminkow |
| 6,512,559 | B1 | 1/2003 | Hashimoto et al. |
| 6,514,141 | B1 | 2/2003 | Kaminkow et al. |
| 6,517,073 | B1 | 2/2003 | Vancura |
| 6,517,433 | B2 | 2/2003 | Loose et al. |
| 6,517,437 | B1 | 2/2003 | Wells et al. |
| 6,547,664 | B2 | 4/2003 | Saunders |
| 6,575,541 | B1 | 6/2003 | Hedrick et al. |
| 6,585,591 | B1 | 7/2003 | Baerlocher et al. |
| 6,607,195 | B2 | 8/2003 | Vancura |
| D480,961 | S | 10/2003 | Deadman |
| 6,646,695 | B1 | 11/2003 | Gauselmann |
| 6,652,378 | B2 | 11/2003 | Cannon et al. |
| 6,659,864 | B2 | 12/2003 | McGahn et al. |
| 6,661,425 | B1 | 12/2003 | Hiroaki |
| 6,676,517 | B2 | 1/2004 | Beavers |
| 6,685,567 | B2 | 2/2004 | Cockerille et al. |
| 6,695,703 | B1 | 2/2004 | McGahn |
| 6,702,675 | B2 | 3/2004 | Poole et al. |
| 6,712,694 | B1 | 3/2004 | Nordman |
| 6,715,756 | B2 | 4/2004 | Inoue |
| 6,717,728 | B2 | 4/2004 | Putilin |
| 6,722,979 | B2 | 4/2004 | Gilmore et al. |
| 6,789,801 | B2 | 9/2004 | Snow |
| 6,802,777 | B2 | 10/2004 | Seelig et al. |
| 6,804,763 | B1 | 10/2004 | Stockdale et al. |
| 6,817,945 | B2 | 11/2004 | Seelig et al. |
| 6,817,946 | B2 | 11/2004 | Motegi et al. |
| 6,863,608 | B1 | 3/2005 | LeMay et al. |
| 6,866,586 | B2 | 3/2005 | Oberberger et al. |
| 6,887,157 | B2 | 5/2005 | LeMay et al. |
| 6,890,259 | B2 | 5/2005 | Breckner et al. |
| 6,906,762 | B1 | 6/2005 | Witehira et al. |
| 6,937,298 | B2 | 8/2005 | Okada |
| 7,128,647 | B2 | 10/2006 | Muir |
| 7,204,753 | B2 | 4/2007 | Ozaki et al. |
| 7,220,181 | B2 | 5/2007 | Okada |
| 7,252,288 | B2 | 8/2007 | Seelig et al. |
| 7,255,643 | B2 | 8/2007 | Ozaki et al. |
| 7,309,284 | B2 | 12/2007 | Griswold et al. |
| 7,322,884 | B2 | 1/2008 | Emori et al. |
| 7,326,115 | B2 | 2/2008 | Baerlocher |
| 7,329,181 | B2 | 2/2008 | Hoshino et al. |
| 7,503,849 | B2 | 3/2009 | Hornik et al. |
| 7,537,456 | B2 | 5/2009 | Snow |
| 7,566,274 | B2 | 7/2009 | Johnson et al. |
| 7,575,512 | B2 | 8/2009 | Kennedy |
| 7,618,319 | B2 | 11/2009 | Casey et al. |
| 7,753,798 | B2 | 7/2010 | Soltys et al. |
| 7,758,419 | B2 | 7/2010 | Rowe et al. |
| 7,775,524 | B2 | 8/2010 | Lutnick et al. |
| 7,822,641 | B2 | 10/2010 | Abbott et al. |

(56) References Cited

U.S. PATENT DOCUMENTS

| | | | |
|---|---|---|---|
| 7,878,892 | B2 | 2/2011 | Sines et al. |
| 7,963,845 | B2 | 6/2011 | Baerlocher |
| 7,980,948 | B2 | 7/2011 | Rowe et al. |
| 8,128,491 | B2 | 3/2012 | Vasquez et al. |
| 8,128,492 | B2 | 3/2012 | Vasquez et al. |
| 8,182,323 | B2 | 5/2012 | Okada |
| 8,206,212 | B2 | 6/2012 | Iddings et al. |
| 8,221,225 | B2 | 7/2012 | Laut |
| 8,231,456 | B2 | 7/2012 | Zielinski |
| 8,500,533 | B2 | 8/2013 | Lutnick et al. |
| 2001/0013681 | A1 | 8/2001 | Bruzzese et al. |
| 2002/0045472 | A1 | 4/2002 | Adams |
| 2002/0068635 | A1 | 6/2002 | Hill |
| 2002/0077712 | A1 | 6/2002 | Safaei et al. |
| 2002/0094869 | A1 | 7/2002 | Harkham |
| 2002/0173354 | A1 | 11/2002 | Winans et al. |
| 2003/0027624 | A1 | 2/2003 | Gilmore et al. |
| 2003/0032478 | A1 | 2/2003 | Takahama et al. |
| 2003/0032479 | A1 | 2/2003 | LeMay et al. |
| 2003/0060271 | A1 | 3/2003 | Gilmore et al. |
| 2003/0073497 | A1 | 4/2003 | Nelson |
| 2003/0087690 | A1 | 5/2003 | Loose et al. |
| 2003/0130028 | A1 | 7/2003 | Aida et al. |
| 2003/0176214 | A1 | 9/2003 | Burak et al. |
| 2003/0203756 | A1 | 10/2003 | Jackson |
| 2003/0224854 | A1 | 12/2003 | Joao |
| 2003/0234489 | A1 | 12/2003 | Okada |
| 2003/0236114 | A1 | 12/2003 | Griswold et al. |
| 2003/0236118 | A1 | 12/2003 | Okada |
| 2004/0002379 | A1 | 1/2004 | Parrott et al. |
| 2004/0023714 | A1 | 2/2004 | Asdale |
| 2004/0029636 | A1 | 2/2004 | Wells |
| 2004/0058731 | A1 | 3/2004 | Rossides |
| 2004/0063490 | A1 | 4/2004 | Okada |
| 2004/0066475 | A1 | 4/2004 | Searle |
| 2004/0070146 | A1 | 4/2004 | Snow |
| 2004/0084843 | A1 | 5/2004 | Snow |
| 2004/0090003 | A1 | 5/2004 | Snow |
| 2004/0090005 | A1 | 5/2004 | Snow |
| 2004/0116178 | A1 | 6/2004 | Okada |
| 2004/0145116 | A1 | 7/2004 | Calvo et al. |
| 2004/0147303 | A1 | 7/2004 | Imura et al. |
| 2004/0147314 | A1 | 7/2004 | LeMay et al. |
| 2004/0150162 | A1 | 8/2004 | Okada |
| 2004/0162146 | A1 | 8/2004 | Ooto |
| 2004/0166925 | A1 | 8/2004 | Emori et al. |
| 2004/0171423 | A1 | 9/2004 | Silva et al. |
| 2004/0183972 | A1 | 9/2004 | Bell |
| 2004/0192430 | A1 | 9/2004 | Burak et al. |
| 2004/0198485 | A1 | 10/2004 | Loose et al. |
| 2004/0207154 | A1 | 10/2004 | Okada |
| 2004/0209666 | A1 | 10/2004 | Tashiro |
| 2004/0209667 | A1 | 10/2004 | Emori et al. |
| 2004/0209668 | A1 | 10/2004 | Okada |
| 2004/0209671 | A1 | 10/2004 | Okada |
| 2004/0209678 | A1 | 10/2004 | Okada |
| 2004/0209683 | A1 | 10/2004 | Okada |
| 2004/0214635 | A1 | 10/2004 | Okada |
| 2004/0214637 | A1 | 10/2004 | Nonaka |
| 2004/0224747 | A1 | 11/2004 | Okada |
| 2004/0233663 | A1 | 11/2004 | Emslie et al. |
| 2004/0239582 | A1 | 12/2004 | Seymour |
| 2005/0003886 | A1 | 1/2005 | Englman et al. |
| 2005/0032571 | A1 | 2/2005 | Asonuma |
| 2005/0037843 | A1 | 2/2005 | Wells et al. |
| 2005/0049032 | A1 | 3/2005 | Kobayashi |
| 2005/0049046 | A1 | 3/2005 | Kobayashi |
| 2005/0062410 | A1 | 3/2005 | Bell et al. |
| 2005/0063055 | A1 | 3/2005 | Engel |
| 2005/0079913 | A1 | 4/2005 | Inamura |
| 2005/0085292 | A1 | 4/2005 | Inamura |
| 2005/0153772 | A1 | 7/2005 | Griswold et al. |
| 2005/0153775 | A1 | 7/2005 | Griswold et al. |
| 2005/0176493 | A1 | 8/2005 | Nozaki et al. |
| 2005/0176507 | A1 | 8/2005 | Ephrati et al. |
| 2005/0192090 | A1 | 9/2005 | Muir et al. |
| 2005/0192099 | A1 | 9/2005 | Nguyen et al. |
| 2005/0206582 | A1 | 9/2005 | Bell et al. |
| 2005/0208994 | A1 | 9/2005 | Berman |
| 2005/0233799 | A1 | 10/2005 | LeMay et al. |
| 2005/0233803 | A1 | 10/2005 | Yang |
| 2005/0239539 | A1 | 10/2005 | Inamura |
| 2005/0266912 | A1 | 12/2005 | Sekiguchi |
| 2005/0285337 | A1 | 12/2005 | Durham et al. |
| 2006/0040733 | A1 | 2/2006 | Baerlocher |
| 2006/0073882 | A1 | 4/2006 | Rozkin et al. |
| 2006/0092170 | A1 | 5/2006 | Bathiche et al. |
| 2006/0100014 | A1 | 5/2006 | Griswold et al. |
| 2006/0103951 | A1 | 5/2006 | Bell et al. |
| 2006/0125745 | A1 | 6/2006 | Evanicky |
| 2006/0135240 | A1 | 6/2006 | Barshack |
| 2006/0166727 | A1 | 7/2006 | Burak |
| 2006/0189382 | A1 | 8/2006 | Muir et al. |
| 2006/0191177 | A1 | 8/2006 | Engel |
| 2006/0258446 | A1 | 11/2006 | Nguyen et al. |
| 2006/0284574 | A1 | 12/2006 | Emslie et al. |
| 2006/0290594 | A1 | 12/2006 | Engel et al. |
| 2007/0004510 | A1 | 1/2007 | Underdahl et al. |
| 2007/0010315 | A1 | 1/2007 | Hein |
| 2007/0021198 | A1 | 1/2007 | Muir et al. |
| 2007/0129123 | A1 | 6/2007 | Eryou et al. |
| 2008/0020816 | A1 | 1/2008 | Griswold et al. |
| 2008/0020839 | A1 | 1/2008 | Wells et al. |
| 2008/0020840 | A1 | 1/2008 | Wells et al. |
| 2008/0020841 | A1 | 1/2008 | Wells et al. |
| 2008/0039192 | A1 | 2/2008 | Laut |
| 2008/0058049 | A1 | 3/2008 | Lutnick |
| 2008/0064467 | A1 | 3/2008 | Reiner |
| 2008/0070667 | A1* | 3/2008 | Lutnick ............... G07F 17/3258 463/16 |
| 2008/0146344 | A1 | 6/2008 | Rowe et al. |
| 2008/0149705 | A1 | 6/2008 | Giobbi et al. |
| 2008/0231611 | A1 | 9/2008 | Bathiche et al. |
| 2008/0305855 | A1 | 12/2008 | Czyzewski et al. |
| 2009/0029766 | A1 | 1/2009 | Lutnick et al. |
| 2009/0111573 | A1 | 4/2009 | Iddings |
| 2010/0130280 | A1 | 5/2010 | Arezina et al. |

FOREIGN PATENT DOCUMENTS

| | | |
|---|---|---|
| WO | WO-99/44095 | 9/1999 |
| WO | WO-01/15127 | 3/2001 |
| WO | WO-01/15128 | 3/2001 |
| WO | WO-01/15132 | 3/2001 |
| WO | WO-01/09664 | 8/2001 |
| WO | WO-2004/001486 | 12/2003 |
| WO | WO-2004/102520 | 11/2004 |
| WO | WO-2006/034192 | 3/2006 |
| WO | WO-2006/038819 | 4/2006 |
| WO | WO2007/032945 | 3/2007 |
| WO | WO2007/073534 | 6/2007 |

OTHER PUBLICATIONS

U.S. Notice of Allowance dated May 5, 2011 from U.S. Appl. No. 11/642,410.

PCT International Search Report and Written Opinion dated Oct. 29, 2008 from PCT/US2007/087788.

PCT International Search Report and Written Opinion dated Jul. 6, 2009 from PCT/US2008/088473.

* cited by examiner

400

1600

2000

2400

2404

| Session ID | Type | Initial Wager | Current Amount | Elapsed Time | Status |
|---|---|---|---|---|---|
| 101 | Star Wars | $20.00 | $50.45 | 1:06 | completed |
| 102 | Player A | $100.00 | $98.00 | 1:30 | placed-active |
| 103 | EGM 301 | $50.00 | $50.00 | 0:00 | pending |
| | | | | | |

| Promotions | | | | |
|---|---|---|---|---|
| Session ID | Type | Min. Wager | Session Time | Promotion |
| P201 | Wheel of Fortune 2 | $10.00 | 1:00 | Double winnings |
| P202 | Star Wars | $20.00 | 2:00 | Free breakfast |
| P203 | Video Blackjack | $5.00 | 0:30 | $5 bonus credit |

2406

Fig. 24

DISTRIBUTED SIDE WAGERING METHODS AND SYSTEMS

PRIORITY CLAIM

This application is a continuation of, claims priority to and the benefit of U.S. patent application Ser. No. 15/964,535, filed on Apr. 27, 2018, which is a continuation of, claims priority to and the benefit of U.S. patent application Ser. No. 12/344,115, filed on Dec. 24, 2008, which claims priority to and the benefit of U.S. Provisional Application No. 61/010,084, filed on Jan. 4, 2008, and which is a continuation-in-part application of, claims priority to and the benefit of U.S. patent application Ser. No. 12/265,627, filed on Nov. 5, 2008, and which is a continuation-in-part application, claims priority to and the benefit of U.S. patent application Ser. No. 11/642,410, filed on Dec. 19, 2006, the entire contents of which are each incorporated by reference herein.

BACKGROUND OF THE INVENTION

This invention relates to distributed side wagering methods and systems which may be implemented at gaming casinos.

Gaming devices and casino gaming establishments are popular entertainment, attracting many visitors annually. In an effort to provide a satisfying gaming opportunity for their players while keeping their overhead costs to a minimum, casino operators have attempted to meet the projected playing needs of their players while simultaneously seeking to preserve resources required by superfluous machines, which, in turn, requires additional square footage to house such machines and the concomitant services to support the additional machines and square footage.

BRIEF DESCRIPTION OF THE DRAWINGS

FIG. 24 shows an example of a user interface system display 2400 in accordance with a specific embodiment.

DETAILED DESCRIPTION OF THE PREFERRED EMBODIMENTS

Overview

Figure 1:
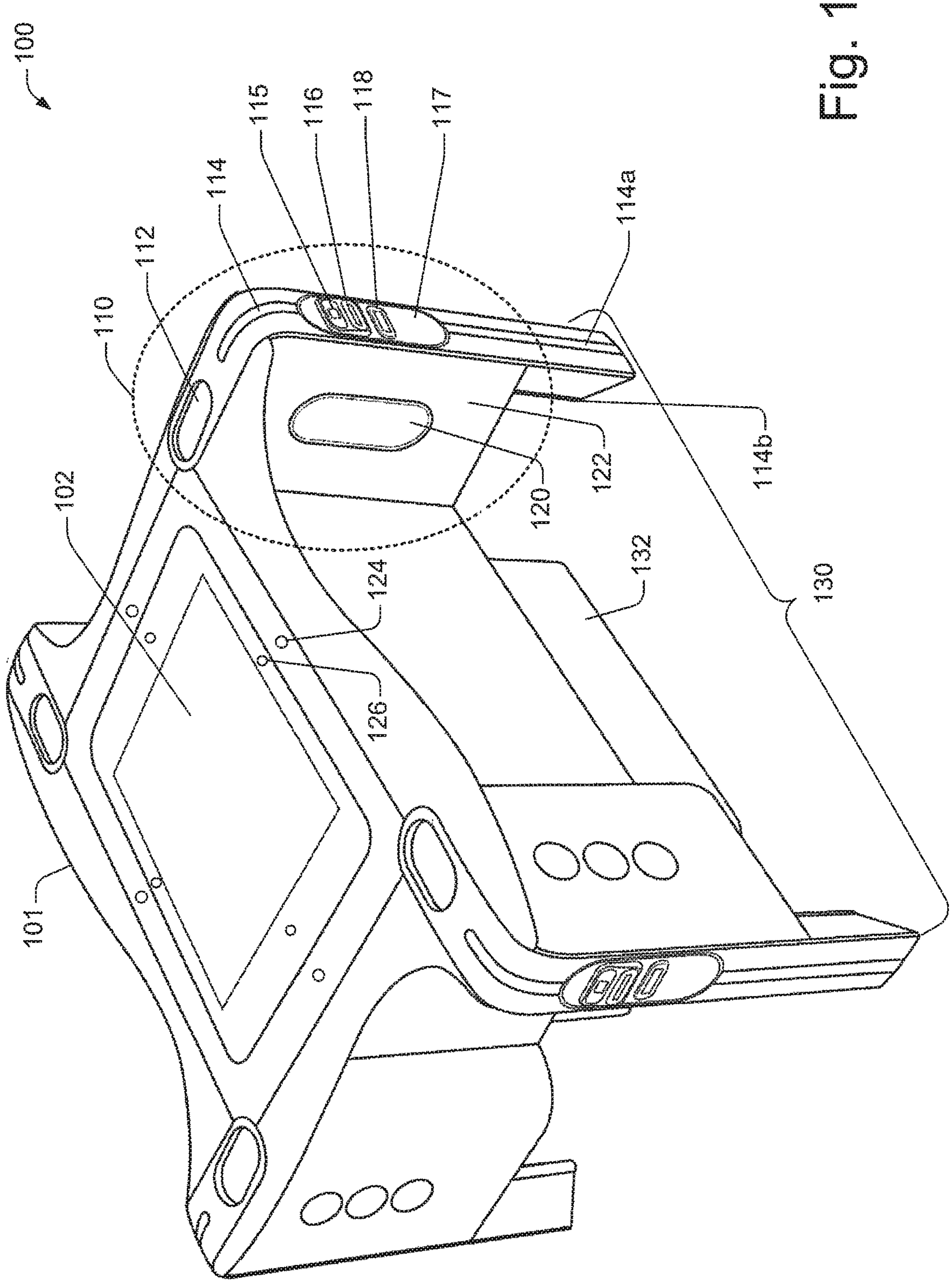
FIG. 1 shows a top perspective view of a multi-player gaming table system with an electronic display in accordance with a specific embodiment.

Various aspects of the present invention are directed to different methods, systems, and computer program products for facilitating side wagering activities conducted at a casino which includes a casino gaming network. In at least one embodiment, the gaming network includes a plurality of gaming devices, including a first gaming device. A side wager request may be received for placing a first side wager relating to a first target. In at least one embodiment, the first target may be selected from a group of possible targets which, for example, may include, but are not limited to one or more of the following (or combination thereof): casino players, game tables, electronic gaming devices (EGDs), game themes, game denominations, game paytables, etc. An identity of a first player associated with generating the first side wager request may be determined. A first side wager session may be automatically initiated. In at least one embodiment, the initiation of the first side wager session may include automatically placing the first side wager at the casino gaming network, and associating the placed first side wager with the identified first player. In at least one embodiment, the placing of the first side wager includes placing first wager on a game play-related event or activity associated with the second person, wherein an outcome of the game play-related event or activity is influenced by a decision or action of the second person. In one embodiment, the first side wager includes first side wager criteria specifying that an outcome of the first side wager is related to at least one event associated with a different player's game play which is associated with the first target.

Other aspects of the present invention are directed to different methods, systems, and computer program products for facilitating side wagering activities conducted at a casino which includes a casino gaming network. In at least one embodiment, the gaming network includes a plurality of gaming devices, including a first gaming device. The gaming network may also include a first wireless handheld device operable to facilitate side wagering activities. A first side wager request for placing a first side wager relating to a first gaming device may be received at the handheld device. A unique identifier may be determined for use in identifying a first player associated with initiating the first side wager request. At least one operation may be automatically performed at the first handheld device for facilitating initiation of a first side wager session. In at least one embodiment, the initiation of the first side wager session may include placing the first side wager at the casino gaming network, and associating the placed first side wager with the identified first player. Additionally, in at least one embodiment, the first side wager may include first side wager criteria specifying that an outcome of the first side wager is related to at least one event associated with a different player's game play activities at a gaming device or gaming table. In at least one embodiment, the placing of the first side wager includes placing first wager on a game play-related event or activity associated with the second person, wherein an outcome of the game play-related event or activity is influenced by a decision or action of the second person.

Additional objects, features and advantages of the various aspects of the present invention will become apparent from the following description of its preferred embodiments, which description should be taken in conjunction with the accompanying drawings.

Specific Example Embodiments

Various techniques will now be described in detail with reference to a few example embodiments thereof as illustrated in the accompanying drawings. In the following description, numerous specific details are set forth in order to provide a thorough understanding of one or more aspects and/or features described or reference herein. It will be apparent, however, to one skilled in the art, that one or more aspects and/or features described or reference herein may be practiced without some or all of these specific details. In other instances, well known process steps and/or structures have not been described in detail in order to not obscure some of the aspects and/or features described or reference herein.

One or more different inventions may be described in the present application. Further, for one or more of the invention(s) described herein, numerous embodiments may be described in this patent application, and are presented for illustrative purposes only. The described embodiments are not intended to be limiting in any sense. One or more of the invention(s) may be widely applicable to numerous embodiments, as is readily apparent from the disclosure. These embodiments are described in sufficient detail to enable those skilled in the art to practice one or more of the invention(s), and it is to be understood that other embodiments may be utilized and that structural, logical, software, electrical and other changes may be made without departing from the scope of the one or more of the invention(s). Accordingly, those skilled in the art will recognize that the one or more of the invention(s) may be practiced with various modifications and alterations. Particular features of one or more of the invention(s) may be described with reference to one or more particular embodiments or figures that form a part of the present disclosure, and in which are shown, by way of illustration, specific embodiments of one or more of the invention(s). It should be understood, however, that such features are not limited to usage in the one or more particular embodiments or figures with reference to which they are described. The present disclosure is neither a literal description of all embodiments of one or more of the invention(s) nor a listing of features of one or more of the invention(s) that must be present in all embodiments.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. To the contrary, a variety of optional components are described to illustrate the wide variety of possible embodiments of one or more of the invention(s).

Further, although process steps, method steps, algorithms or the like may be described in a sequential order, such processes, methods and algorithms may be configured to work in alternate orders. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the invention(s), and does not imply that the illustrated process is preferred.

When a single device or article is described, it will be readily apparent that more than one device/article (whether or not they cooperate) may be used in place of a single device/article. Similarly, where more than one device or article is described (whether or not they cooperate), it will be readily apparent that a single device/article may be used in place of the more than one device or article.

The functionality and/or the features of a device may be alternatively embodied by one or more other devices that are not explicitly described as having such functionality/features. Thus, other embodiments of one or more of the invention(s) need not include the device itself.

In at least one embodiment, a wager-based game may be defined as a game in which one or more players can place a wager or bet on an outcome that is uncertain at the time the wager is made. Typically, casinos provide their patrons with a variety of different wager-based gaming opportunities including, for example, gaming machines (e.g., slot machines and/or other electronic gaming machines), table games (e.g., Blackjack, Roulette, Craps, Baccarat, Poker, etc.), etc.

In some wager-based games, a wager made by a player is accepted by a "house", which may be representative of a gaming establishment hosting the particular game, for example. If the outcome is realized, the house provides a payout based on the wager made in accordance with established rules governing the particular game. Many popular casino games (e.g., Blackjack, Roulette, Craps, Baccarat, etc.), fall into this category of wager-based games. In such games, payouts on player wagers are typically provided by the house when the player wins in accordance with the rules of the respective games, as may be the case if a player holds a hand (of playing cards) that beats the hand of a house dealer, or if the player successfully predicts the outcome of a random event associated with the roll of dice or the spinning of a wheel, for example.

In another form of wager-based games, wagers are made between multiple players of a game, played between players and not against a house. Some variations of the game of poker (e.g., Texas Hold'em, Seven Card Stud, Omaha, etc.) fall into this category of wager-based games. In such games, wagers may be made by players at various stages during the play of a hand, each player betting that he will "win" the hand in accordance with the rules of the particular game being played. At the completion of a hand, each winner is then generally entitled to at least a portion of all wagers made during the play of that hand. In these types of games, although a house does not typically participate by playing a hand, in games hosted by a gaming establishment, a portion of all wagers made during the play of the hand (i.e., a rake) may be collected by the house before payouts are distributed to each winner.

Generally speaking, wager-based games include both games of skill and games of chance. For example, according to one implementation, a game of chance may be defined as a game that includes at least one element wherein a randomness affects the outcome of the game, either positively or negatively. For example, a typical slot game is a game of chance because the reels stop at randomly determined positions. On the other hand, a game of skill has at least one element wherein the player can intentionally affect the outcome of the game, in a known manner, either positively or negatively. According to specific embodiments, skill may include strategy, physical skill, coordination, etc. For example, poker is considered to be a game of skill because the player decides what cards to hold, how to bet, whether to bluff, etc. The outcome for a game of skill may typically be dependent upon or effected by the skill level of the player (or players) participating in the game of skill. Conversely, the outcome for a game of chance typically has little or no dependence upon the skill level of the player (or players) participating in the game of chance.

Various embodiments described herein are directed to various side wagering (also referred to as back betting, side betting, proxy betting, etc.) systems implemented in a casino gaming network. According to different embodiments, the gaming network may include electronic gaming machines and/or gaming tables which are operable to allow players at the gaming machines/gaming tables to participate in various side wagering activities. In at least one embodiment, a player at a gaming machine or gaming table is able to participate in various side wagering activities while concurrently being engaged in an active gaming session at that gaming machine/gaming table.

According to specific embodiments, a patron or player desiring to place a side wager may be referred to as a "side wagering player" or SWP. In at least one embodiment, a side wager may be characterized as (or may be defined to include) the placing of a wager by a patron or player (e.g., by an SWP) on an event and/or activity, wherein the outcome of the event/activity is dependent, at least in part, upon the decisions and/or actions of a third party. In at least one embodiment, the third party may include, but is not limited to, one or more of the following (or combinations thereof):

- a person;
- a casino player;
- a casino patron;
- a machine;
- a electronic system;
- etc.

In some embodiments, a side wager may be characterized as relating to a gaming-related activity where the SWP is not an active player of the gaming activity and/or where the gaming activity is not under control of the SWP.

In at least one embodiment, an SWP may place one or more side wagers on events which may be associated with various types of different targets. For example, in at least one embodiment, an SWP may place one or more side wagers on events (e.g., game play events, game outcome events, bonusing events, etc.) associated with one or more "target" players. Further, in at least one embodiment, an SWP may place one or more side wagers on events associated with one or more "target" gaming machines in the casino. In one embodiment, a side wager may be defined to include a wager placed by an SWP on an event relating to a game play activity being conducted by (or associated with) another player. In this regard, an SWP is a person who does not have control of game play decisions and/or wagering decisions relating to the game(s) being played by the other player(s) upon which the SWP has placed one or more side wagers.

Additionally, in at least one embodiment, a "target" player may correspond to a "primary" player at gaming machine or gaming table who may be defined as a person who is physically present at the gaming machine/gaming table, and who is actively engaged in game play and/or wagering decisions at that gaming machine/gaming table. Further, in at least one embodiment, the SWP may correspond to a "secondary player" or "non-primary" player who may be defined as a person who does not have control of game play decisions and/or wagering decisions relating to the game(s) being played by the other player(s) upon which the SWP has placed one or more side wagers.

According to various embodiments of the present invention, the definition of wager-based games and electronic gaming machines may vary according to different jurisdictional requirements/regulations. Shown below are various examples of how different types of entities may define various casino gaming related terms:

Nevada Gaming Regulation 1

Issuance of Regulations: Construction; Definitions 1.060 "Card game" defined. "Card game" means a game in which the licensee is not party to wagers and from which the licensee receives compensation in the form of a rake-off a time buy-in, or other fee or payment from a player for the privilege of playing, and includes but is not limited to the following: Poker, bridge, whist, solo and panguingui.

1.080 "Counter game" defined. "Counter game" means a game in which the licensee is party to wagers and wherein the licensee documents all wagering activity. The term includes, but is not limited to bingo, keno, race books, and sports pools. The term does not include table games, card games and slot machines.

Nevada Gaming Regulation 29

Slot Machine Tax and License Fees 29.020 Definition. "Slot machine" means any mechanical, electrical or other device, contrivance or machine which, upon insertion of a coin, currency, token or similar object therein, or upon payment of any consideration whatsoever, is available to play or operate, the play or operation of which, whether by reason of the skill of the operator or application of the element of chance, or both, may deliver or entitle the person playing or operating the machine to receive cash, premiums, or merchandise, tokens or anything of value whatsoever, whether the payoff is made automatically from the machine or in any other manner whatsoever.

Gaming Labs International (www.gaminglabs.com) Standards:

1.5.1 General Statement. A gaming device at a minimum will contain embodiment of randomness in determination of prizes, contain some form of activation to initiate the selection process, and contain a methodology for delivery of the determined outcome. The gaming device may be separated in parts, where some may be within or outside the player terminal (e.g., gaming devices that function with a system).

In at least one embodiment of the present invention, a pay table of a gaming device may refer to the standard winnings paid or credited to the player by the device itself. A bonus award may refer to credits either credited to a machine or credited to a player account by a bonus system, or bonus points credited to a player account by the bonus system. A system award may refer to a benefit that is paid or credited to a player of a gaming device or table that is not based on either the pay table or a bonus award. Examples of system awards include a complementary meal or show ticket, a drawing ticket, or bonus points or machine credits not based on a gaming device pay table. Together bonus awards and system awards may be referred to herein as incentive awards.

FIG. 1 shows a top perspective view of a multi-player gaming table system 100 with an electronic display in accordance with a specific embodiment. As illustrated in the example of FIG. 1, gaming table system 100 includes an intelligent gaming table 101 which includes a main table display system 102, and a plurality of individual player stations 130. In at least one embodiment, the various devices, components, and/or systems associated with a given player station may collectively be referred to as a player station system.

In at least one embodiment, the intelligent gaming table may include at least a portion of functionality similar to that described with respect to the various interactive gaming table embodiments disclosed in U.S. patent application Ser. No. 11/938,179, by Wells et al., entitled "TRANSPARENT CARD DISPLAY," filed on Nov. 9, 2007, the entirety of which is incorporated herein by reference for all purposes. In some embodiments the main table display system 102 may be implemented using over-head video projection systems and/or below the table projection systems. The projection system may also be orientated to the side of the table or even within the bolster. Using mirrors, many different arrangements of projection systems are possible. Examples of various projection systems that may be utilized herein are described in U.S. patent application Ser. No. 10/838,283 (US Pub no. 20050248729), Ser. No. 10/914,922 (US Pub. No. 20060036944), Ser. No. 10/951,492 (US Pub no. 20060066564), Ser. No. 10/969,746 (US Pub. No. 20060092170), Ser. No. 11/182,630 (US Pub no. 20070015574), Ser. No. 11/350,854 (US Pub No. 20070201863), Ser. No. 11/363,750 (US Pub no. 20070188844), Ser. No. 11/370,558 (US Pub No. 20070211921), each of which is incorporated by reference in its entirety and for all purposes. In some embodiments, video displays, such as LCDs (LiqPPD Crystal Display), Plasma, OLEDs (Organic Light Emitting Display), Transparent (T) OLEDs, Flexible (F)OLEDs, Active matrix (AM) OLED, Passive matrix (PM) OLED, Phosphorescent (PH) OLEDs, SEDs (surface-conduction electron-emitter display), an EPD (Electrophoretic display), FEDs (Field Emission Displays) or other suitable display technology may be embedded in the upper surface 102 of the interactive gaming table 100 to display video images viewable in each of the video display areas. EPD displays may be provided by E-ink of Cambridge, Mass. OLED displays of the type list above may be provided by Universal Display Corporation, Ewing, N.J.

In at least one embodiment, main table display system 102 may include multi-touch technology for supporting multiple simultaneous touch points, for enabling concurrent real-time multi-player interaction. In at least one embodiment, the main table display system and/or other systems of the intelligent gaming table may include at least a portion of technology (e.g., multi-touch, surface computing, object recognition, gesture interpretation, etc.) and/or associated components thereof relating to Microsoft Surface™ technology developed by Microsoft Corporation of Redmond, Wash.

According to various embodiments, each player station system of the intelligent gaming table 101 may include, but is not limited to, one or more of the following (or combinations thereof):

- funds center system 110
- microphone(s) (e.g., 124)
- camera(s) (e.g., 126)
- speaker(s) 120
- drink holder 112
- candle(s) and/or light pipe(s) 114, **114*a*, 114*b***
- ticket I/O device 116
- bill acceptor 118
- input devices (e.g., multi-switched input device 115)
- access door 122
- etc.

As illustrated in the example embodiment of FIG. 1, each leg of the table houses a "funds center" system (e.g., 110) with it's own external and internal components which are associated with a respective player station (e.g., 130) at the table. In at least one embodiment, the housing and interfaces of each funds center system may be configured or designed as a modular component that is interchangeable with other funds center systems of the intelligent gaming table and/or of other intelligent gaming tables. In one embodiment, each funds center system may be configured or designed to have substantially similar or identical specifications and/or components. Similarly, in some embodiments, other components and/or systems of the intelligent gaming table may be configured or designed as a modular component that is interchangeable with other similar components/systems of the same intelligent gaming table and/or of other intelligent gaming tables.

In at least one embodiment, the funds center system and/or other components The modular legs may be swapped out and/or replaced without having to replace other components relating to "funds centers" associated with the other player stations.

In at least one embodiment, funds center system (e.g., 50, FIG. 4) may include, but is not limited to, one or more of the following (or combinations thereof):

- power distribution components
- non-volatile memory (and/or other types of memory)
- bill acceptor
- ticket I/O
- player tracking I/O
- meters (e.g., hard and/or soft meters)
- meter detect circuitry
- speakers/microphones
- processor(s)
- interface(s)
- display(s)
- Independent security system
- door detect switches candles, light pipes, etc.
input devices
wireless communication components
camera
gesture detection mechanisms
etc.

As illustrated in the example embodiment of FIG. 1, each leg of the table houses a "funds center" system (e.g., 110) with it's own external and internal components which are associated with a respective player station (e.g., 130) at the table. In at least one embodiment, the housing and interfaces of each funds center system may be configured or designed as a modular component that is interchangeable with other funds center systems of the intelligent multi-player electronic gaming system and/or of other intelligent multi-player electronic gaming systems. In one embodiment, each funds center system may be configured or designed to have substantially similar or identical specifications and/or components. Similarly, in some embodiments, other components and/or systems of the intelligent multi-player electronic gaming system may be configured or designed as a modular component that is interchangeable with other similar components/systems of the same intelligent multi-player electronic gaming system and/or of other intelligent multi-player electronic gaming systems.

In at least one embodiment, the funds center system and/or other components The modular legs may be swapped out and/or replaced without having to replace other components relating to "funds centers" associated with the other player stations.

In at least one embodiment, game feedback may be automatically dynamically generated for individual players, and may be communicated to the intended player(s) via visual and/or audio mechanisms.

For example, in one embodiment, game feedback for each player may include customized visual content and/or audio content which, for example, may be used to convey real-time player feedback information (e.g., to selected players), attraction information, etc.

In at least one embodiment, the intelligent multi-player electronic gaming system may include illumination components, such as, for example, candles, LEDs, light pipes, etc., aspects of which may be controlled by candle control system 469. According to different embodiments, illumination components may be included on the table top, legs, sides (e.g., down lighting on the sides), etc., and may be used for functional purposes, not just aesthetics.

For example, in one embodiment, the light pipes may be operable to automatically and dynamically change colors based on the occurrences of different types of events and/or conditions. For example, in at least one embodiment, the light pipes may be operable to automatically and dynamically change colors and/or display patterns to indicate different modes and/or states at the gaming table, such as, for example: game play mode, bonus mode, service mode, attract mode, game type in play, etc. In a lounge of such tables, where core games are being played by multiple players and/or at multiple tables, it may be useful to be able to visually recognize the game(s) in play at any one the table. For example, blue lights may indicate a poker game; green lights may indicate a blackjack game; flickering green lights may indicate that a player just got blackjack; an orange color may indicate play of a bonus mode, etc. For example, in one embodiment, 6 tables each displaying a strobing orange light may indicate to an observer that all 6 are in the same bonus round.

In addition to providing a natural, organic way of interacting with the multi-touch display surface, additional benefits are provided by using a light change on a light pipe to prompt a player to their turn, and/or to prompt attention to a particular game state or other event/condition.

In one embodiment, various colors may be displayed around the table when a player is hot or when the players at the table are winning more then the house. Something to reflect a "hot" table. Sound may also be used to tie to celebrations when people are winning. The notion of synchronizing sound and light to a game celebration provides useful functionality. Additionally, the table may be able to provide tactile feedback too. For example, the chairs may be vibrated around the table game based on game play, bonus mode, etc. According to different embodiments, vibration maybe on the seat, surface and/or around the table wrapper. This may be coupled with other types of sound/light content. Collectively these features add to the overall experience and can be much more than just an extension of a conventional "candle."

In at least one embodiment, the intelligent multi-player electronic gaming system may also be configured or designed to display various types of information relating to the performances of one or more players at the gaming system. For example, in one embodiment where the intelligent multi-player electronic gaming system is configured as an electronic baccarat gaming table, game history information (e.g., player wins/loss, house wins/loss, draws) may be displayed on an electronic display of the electronic baccarat gaming table, which may be viewable to bystanders. Similarly, in at least one embodiment, a player's game history relating to each (or selected) player(s) occupying a seat/station at the gaming table may also be displayed. For example, in at least one embodiment, the display of the player's game history may include a running history of the player's wins/losses (e.g., at the current gaming table) as a function of time. This may allow side wagerers to quickly identify "hot" or "lucky" players by visually observing the player's displayed game history data.

In at least one embodiment, the gaming table may include wireless audio, video and/or data communication to various types of mobile or handheld electronic devices. In one embodiment, incorporating Bluetooth™ or Wi-Fi for a wireless device integration (audio channel, or whatever) provides additional functionality, such as, for example, the ability for a game to wirelessly "recognize" a player when they walk up, and automatically customize aspects of the player's player station system (e.g., based on the player's predefined preferences) to create an automated, unique, real-time customized experience for the player. For example, in one embodiment, the player walks up, and light pipes (e.g., associated with the player's player station) automatically morph to the player's favorite color, the player's wireless Bluetooth™ headset automatically pairs with the audio channel associated with the player's player station, etc.

According to a specific embodiment, the intelligent multi-player electronic gaming system may be operable to enable a secondary game to be played by one player at the intelligent multi-player electronic gaming system concurrently while a primary game is being played by other players. In at least one embodiment, both the primary and secondary games may be simultaneously or concurrently displayed on the main gaming table display.

In one embodiment, a single player secondary game may be selected by a player on a multiple player electronic table game surface from a plurality of casino games concurrent to game play activity on the primary multiplayer electronic table game. In one embodiment, the player is given the opportunity to select a secondary single player game during various times such as, for example, while other players are playing the multiplayer primary table game. This facilitates keeping the player interested during multiplayer games where the pace of the game is slow and/or where the player has time between primary play decisions to play the secondary game.

For example, in one embodiment, while the player is waiting for his or her turn, the player may engage in play of a selected secondary game. During the play of the single player secondary game, if the primary multiplayer game requires the player to make a decision (and/or to provide input relating to the primary table game), the secondary single player game state may automatically saved and/or made to temporarily disappear or fade from the display, for example, to avoid any delay or distraction from the primary multiplayer game decision. Once the game decision has been made, the secondary single player game may automatically reappear within the players play area, whereupon that player may continue where he/she left off. In other embodiments, display of the secondary game may be closed, removed, minimized, sent to the background, made translucent, etc. to allow for and/or direct attention of the player to primary game play.

Examples of single player secondary games may include, but are not limited to, one or more of the following (or combinations thereof): keno, bingo, slot games, card games, and/or other similar single player wager based games. In an alternative embodiment, the secondary game may include a skill-based game such as trivia, brickbreaker, ka-boom, chess, etc. In one embodiment, the secondary game play session may be funded on a per session basis. In other embodiments, the secondary game play session may be funded on a flat rate bases, or per game. In one embodiment, rewards relating to the secondary game play session may or may not be awarded based on player's game performance. Other embodiments include multiple player secondary games where the player may engage in game play with a group of players.

Figure 2:
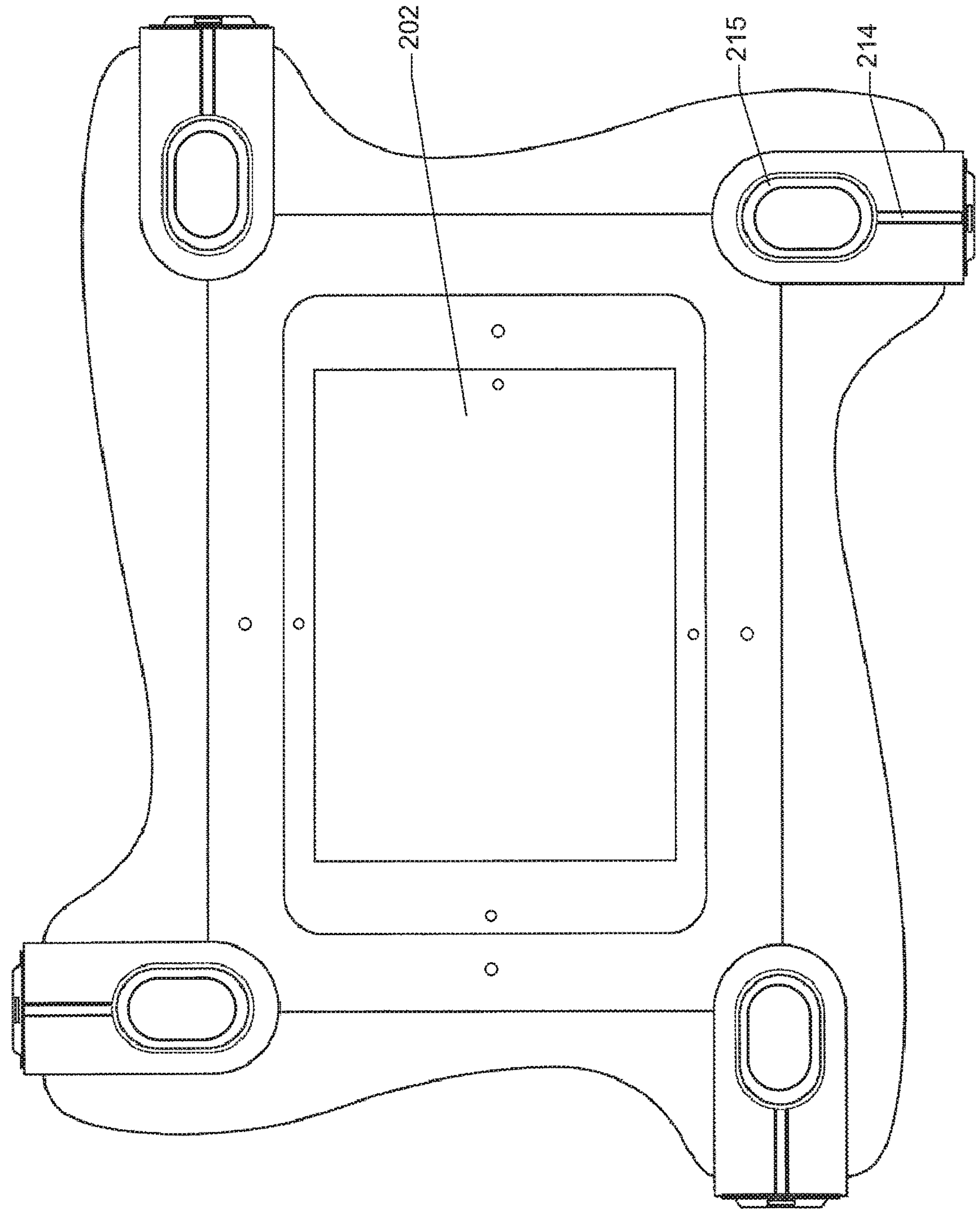
FIG. 2 shows a top view of a multi-player gaming table system with an electronic display in accordance with an alternate embodiment.

FIG. 2 shows a top view of a multi-player gaming table system with an electronic display in accordance with an alternate embodiment. In the example of FIG. 2, illumination elements (e.g., light pipes, LEDs, etc) may also be included around the drink holder region 215 of each player station.

Figure 3A:
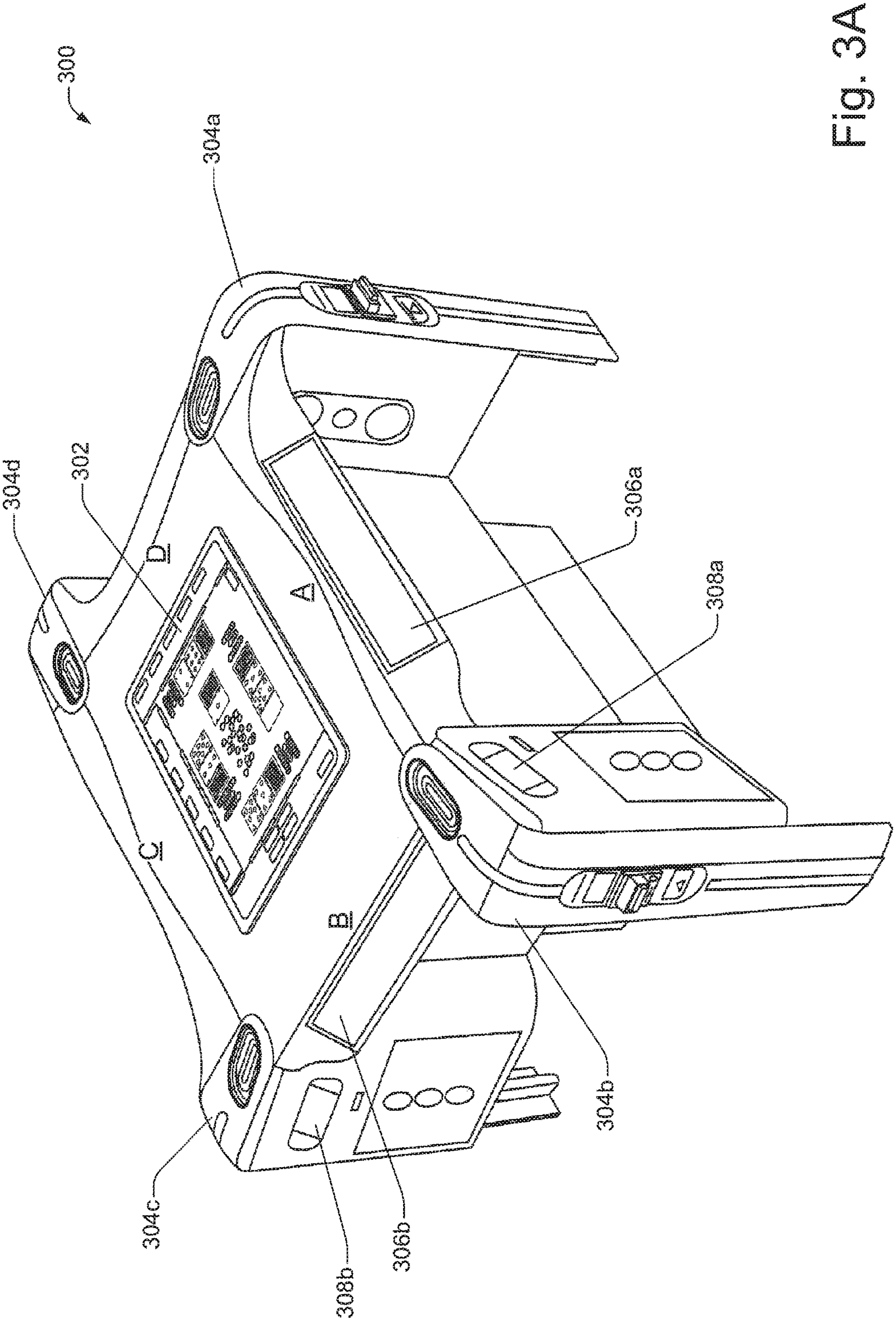
FIG. 3A shows a perspective view of an alternate example embodiment of a multi-player gaming table system having a multi-touch electronic display surface.

FIG. 3A shows a perspective view of an alternate example embodiment of a multi-player gaming table system having a multi-touch electronic display surface. In the example of FIG. 3A, the intelligent multi-player electronic gaming system 300 is configured as a multi-player electronic table gaming system which includes 4 player stations (e.g., A, B, C, D), with each player station having a respective funds center system (e.g., 304*a*, 304*b*, 304*c*, 304*d*). In one embodiment, a rectangular shaped intelligent multi-player electronic gaming system may include 2 player stations of relatively narrower width (e.g., B, D) than the other 2 player stations (e.g., A, C).

As illustrated in the example embodiment of FIG. 3A, electronic table gaming system 300 includes a main display 302 which may be configured or designed as a multi-touch, multi-player interactive display surface having a multipoint or multi-touch input interface. According to different embodiments, various regions of the multi-touch, multi-player interactive display surface may be allocated for different uses which, for example, may influence the content which is displayed in each of those regions. For example, as described in greater detail below with respect to FIG. 3B, the multi-touch, multi-player interactive display surface may include one or more designated multi-player shared access regions, one or more designated personal player regions, one or more designated dealer or house regions, and or other types of regions of the multi-touch, multi-player interactive display surface which may be allocated for different uses by different persons interacting with the multi-touch, multi-player interactive display surface.

Additionally, as illustrated in the example embodiment of FIG. 3A, each player station may include an auxiliary display (e.g., 306*a*, 306*b*) which, for example, may be located or positioned below the gaming table surface. In this way, content displayed on a given auxiliary display (e.g., 306*a*) associated with a specific player/player station (e.g., Player Station A), may not readily be observed by the other players at the electronic table gaming system.

In at least one embodiment, each auxiliary display at a given player station may be provided for use by the player occupying that player station. In at least one embodiment, an auxiliary display (e.g., 306*a*) may be used to display various types of content and/or information to the player occupying that player station (e.g., Player Station A). For example, in some embodiments, auxiliary display 306*a* may be used to display (e.g., to the player occupying Player Station A) private information, confidential information, sensitive information, and/or any other type of content or information which the player may deem desirable or appropriate to be displayed at the auxiliary display. Additionally, in at least some embodiments, as illustrated in the example embodiment of FIG. 3A, each player station may include a secondary auxiliary display (e.g., 306*a*, 306*b*).

Figure 3B:
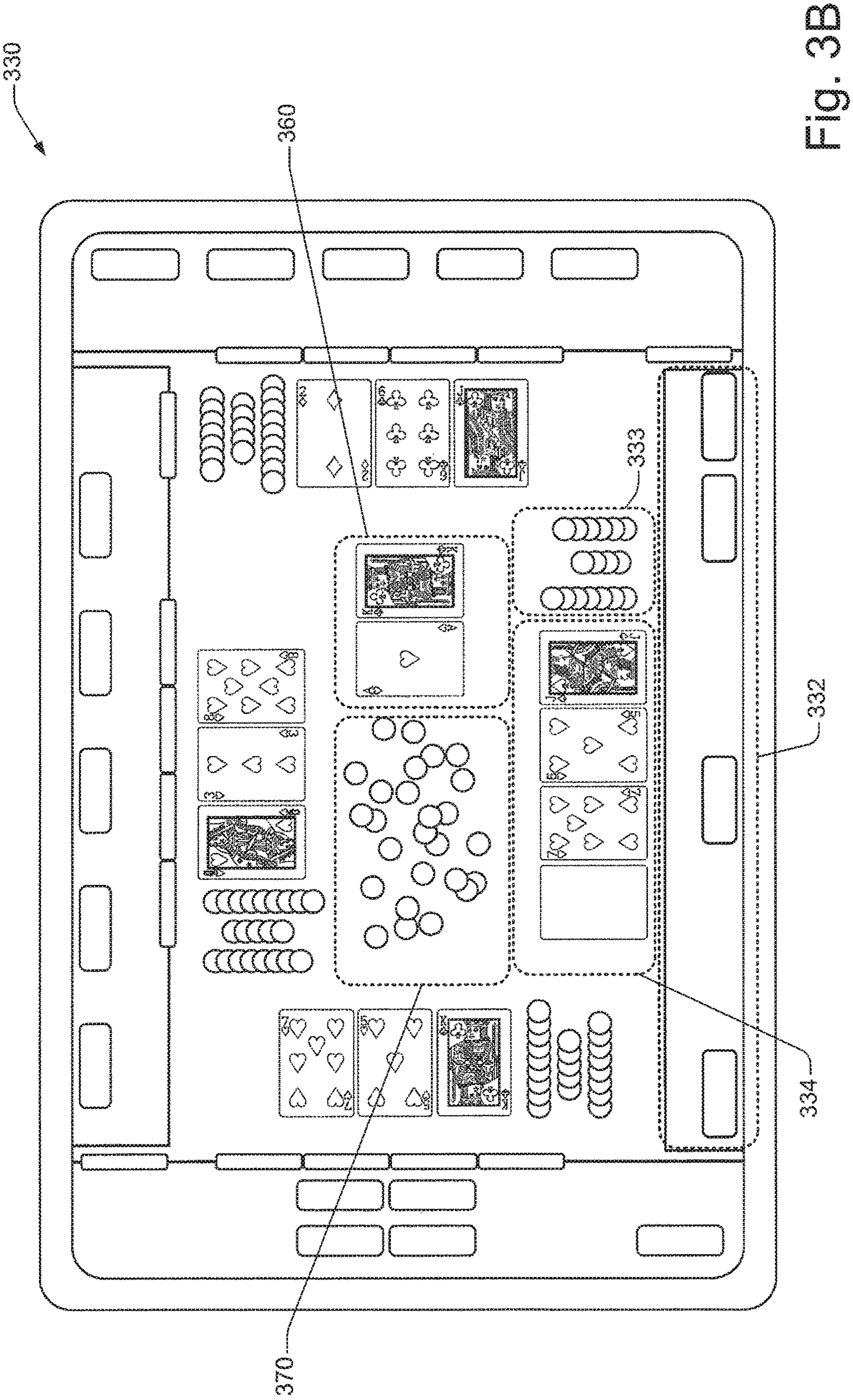
FIG. 3B shows an example embodiment of a multi-touch, multi-player interactive display surface 350 in accordance with various aspects described herein.

FIG. 3B shows an example embodiment of a multi-touch, multi-player interactive display surface 350 in accordance with various aspects described herein. For example, in at least one embodiment, multi-touch, multi-player interactive display surface 350 may be representative of content which, for example, may be displayed at display surface 302 of FIG. 3A.

As mentioned previously, various regions of the multi-touch, multi-player interactive display surface 350 may be automatically, periodically and/or dynamically allocated for different uses which, for example, may influence the content which is displayed in each of those regions. In at least some embodiments, regions of the multi-touch, multi-player interactive display surface 350 may be automatically and dynamically allocated for different uses based upon the type of game currently being played at the electronic table gaming system.

According to various embodiments, the multi-touch, multi-player interactive display surface may be configured to include one or more of the following types of regions (or combinations thereof):

- One or more regions designated for use as a multi-player shared access region (e.g., 370). For example, in one embodiment, a multi-player shared access may be configured to permit multiple different users (e.g., players) to simultaneously or concurrently interact with the same shared-access region of the multi-touch, multi-player interactive display surface. An example of a multi-player shared access region is represented by common wagering 370, which, for example, may be accessed (e.g., serially and/or concurrently) by one or more players at the electronic table gaming system for placing one or more wagers.

- One or more regions designated for use as a common display region in which multi-player shared-access is not available (e.g., 360). For example, in one embodiment, a common display region may be configured to present to gaming related content (e.g., common cards which are considered to be part of each player's hand) and/or wagering related content which is not intended to be accessed or manipulated by any of the players.
- One or more regions (e.g., 352, 354, 353) designated for use as a personal player region. In at least one embodiment, each personal player region may be associated with a specific player at the electronic table gaming system, and may be configured to display personalized content relating to the specific player associated with that specific personal player region. For example, a personal player region may be used to display personalized game related content (e.g., cards of a player's hand), personalized wager related content (e.g., player's available wagering assets), side wager related information, and/or any other types of content relating to the specific player associated with that specific personal player region. In at least one embodiment, the multi-touch, multi-player interactive display surface may include a plurality of different personal player regions which are associated with a specific player at the electronic table gaming system. One or more of these personal player regions may be configured to permit the player to interact with and/or modify the content displayed within those specific player regions, while one or more of the player's other personal player regions may be configured only to allow the player to observe the content within those personal player regions, and may not permit the player to interact with and/or modify the content displayed within those specific player regions. In some embodiments, a personal player region may be configured to allow the associated player to interact with and/or modify only a portion of the content displayed within that particular personal player region.
- One or more regions (e.g., 352, 353) designated for use as a personal player region and configured to permit the player to interact with and/or modify the content displayed within that specific player region.
- One or more regions (e.g., 354) designated for use as a personal player region and configured not to permit the player to interact with and/or modify the content displayed within that specific player region (which, for example, may include display of gaming play content relating to side wagering activities, etc.).
- One or more regions designated for use as a dealer or house region (e.g., 360). For example, in one embodiment, a dealer or house region may be configured to present to gaming related content (e.g., common cards which are considered to be part of each player's hand) and/or wagering related content which may be accessed and/or manipulated by the dealer or house, but which may not be accessed or manipulated by any of the players at the electronic table gaming system.
- One or more regions designated for use as other types of regions of the multi-touch, multi-player interactive display surface which may be used for displaying content related to different types of activities and/or services available at the electronic table gaming system.

It will be appreciated that the shape of the various intelligent multi-player electronic gaming system embodiments described herein is not limited to 4-sided gaming tables. According to different embodiments, the shape of the intelligent multi-player electronic gaming system may vary, depending upon various criteria (e.g., intended uses, floor space, cost, etc.). Various possible intelligent multi-player electronic gaming system shapes may include, but are not limited to, one or more of the following (or combinations thereof): round, circular, semi-circular, ring-shaped, triangular, square, oval, elliptical, pentagonal, hexagonal, D-shaped, star shaped, C-shaped, etc.

Figure 3C:
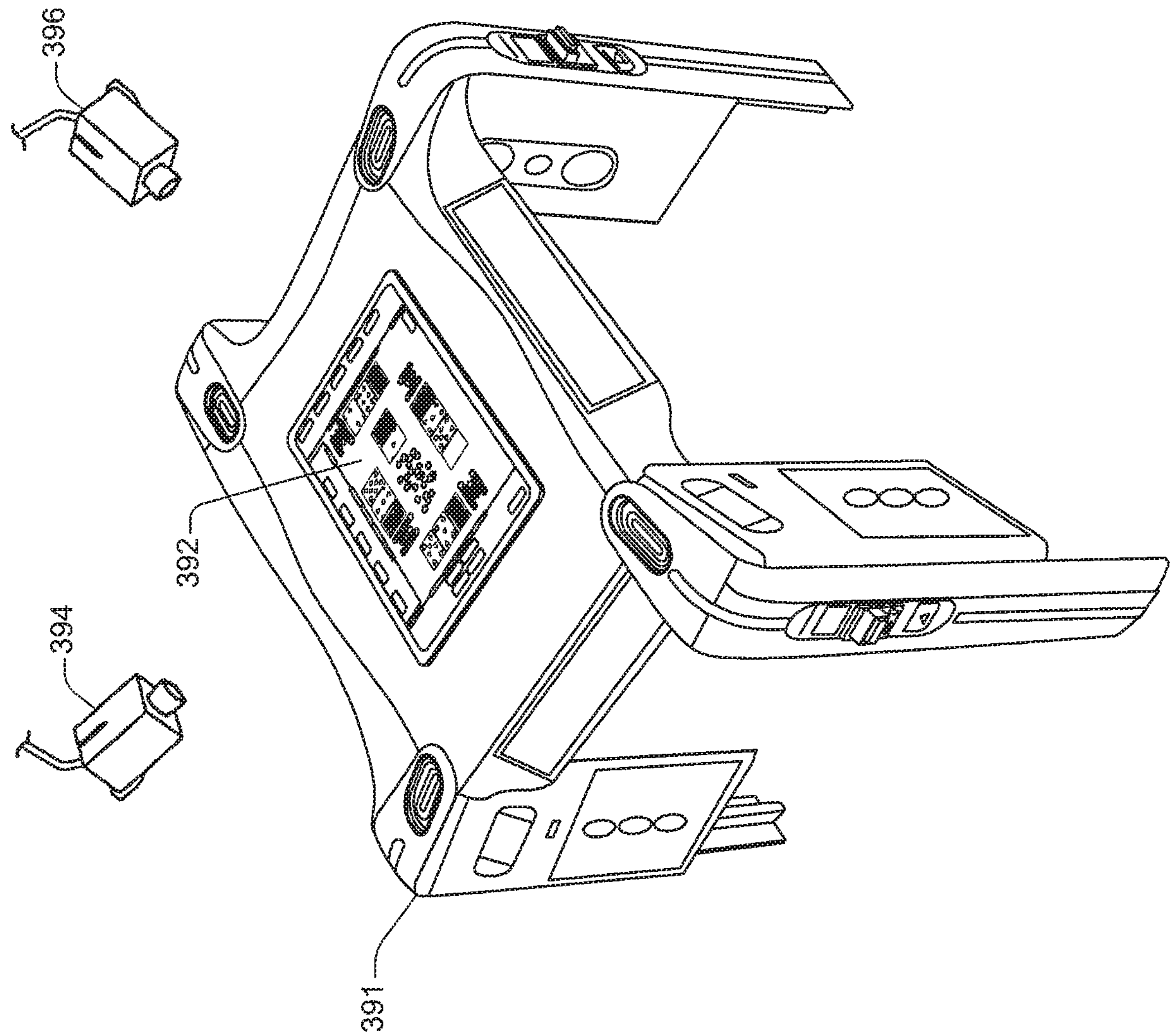
FIG. 3C shows an example embodiment of an intelligent multi-player electronic gaming system which, for example, may be configured or designed to include computer vision hand tracking functionality.

FIG. 3C shows an example embodiment of an intelligent multi-player electronic gaming system which, for example, may be configured or designed to include computer vision hand tracking functionality. For example, as illustrated in the example embodiment of FIG. 3B, a video display-based intelligent multi-player electronic gaming system 390 is illustrated which includes a multi-touch, multi-player interactive display surface 392. In one embodiment, display surface 392 may be implemented using a single, continuous video display screen (e.g., LCD display screen, OLED display screen, etc.), over which one or more multipoint or multi-touch input interfaces may be provided. In other embodiments, display surface 392 may be implemented using a multi-layered display system (e.g., which includes 2 or more display screens) having at least one multipoint or multi-touch input interface. In yet other embodiments, the intelligent gaming table system may include on or more separate (or individually distinct) touch screen displays (e.g., a respective, separate touch screen for each player station at the intelligent gaming table system).

As illustrated in the example embodiment of FIG. 3C, intelligent multi-player electronic gaming table 390 is operatively coupled to one or more cameras (e.g., 394 and/or 396) for use in identifying a particular user who is responsible for performing one or more of the touches, contacts and/or gestures detected at or near the multi-player gaming table system. In at least one embodiment, gaming system 390 may be configured or designed to include computer vision hand tracking functionality via the use of one or more visible spectrum cameras (e.g., 396, 394) mounted over the multi-touch, multi-person display surface 392.

Using one or more of the overhead cameras (e.g., 396, 394), users' hands which are placed at, over, or near to the intelligent gaming table 391 may be tracked using computer hand vision tracking techniques (which, for example, may be implemented using skin color segmentation techniques, RGB filtering techniques, etc.). Data from the overhead camera(s) may be used to identify and/or determine the different users' hand coordinates. In at least one embodiment, the computer hand vision tracking functionality may be utilized to determine the identities of non-players at or near a given gaming table (and/or other gaming device). Further, in at least one embodiment, the computer hand vision tracking functionality may be utilized to detect side wagering activities performed by players at the intelligent multi-player electronic gaming table and/or by non-players at or near the intelligent multi-player electronic gaming table.

Similar techniques may also be applicable to other types of intelligent multi-player electronic gaming systems. Other embodiments of intelligent multi-player electronic gaming systems (not shown) may be implemented as projection-based intelligent multi-player electronic gaming systems.

Figure 4:
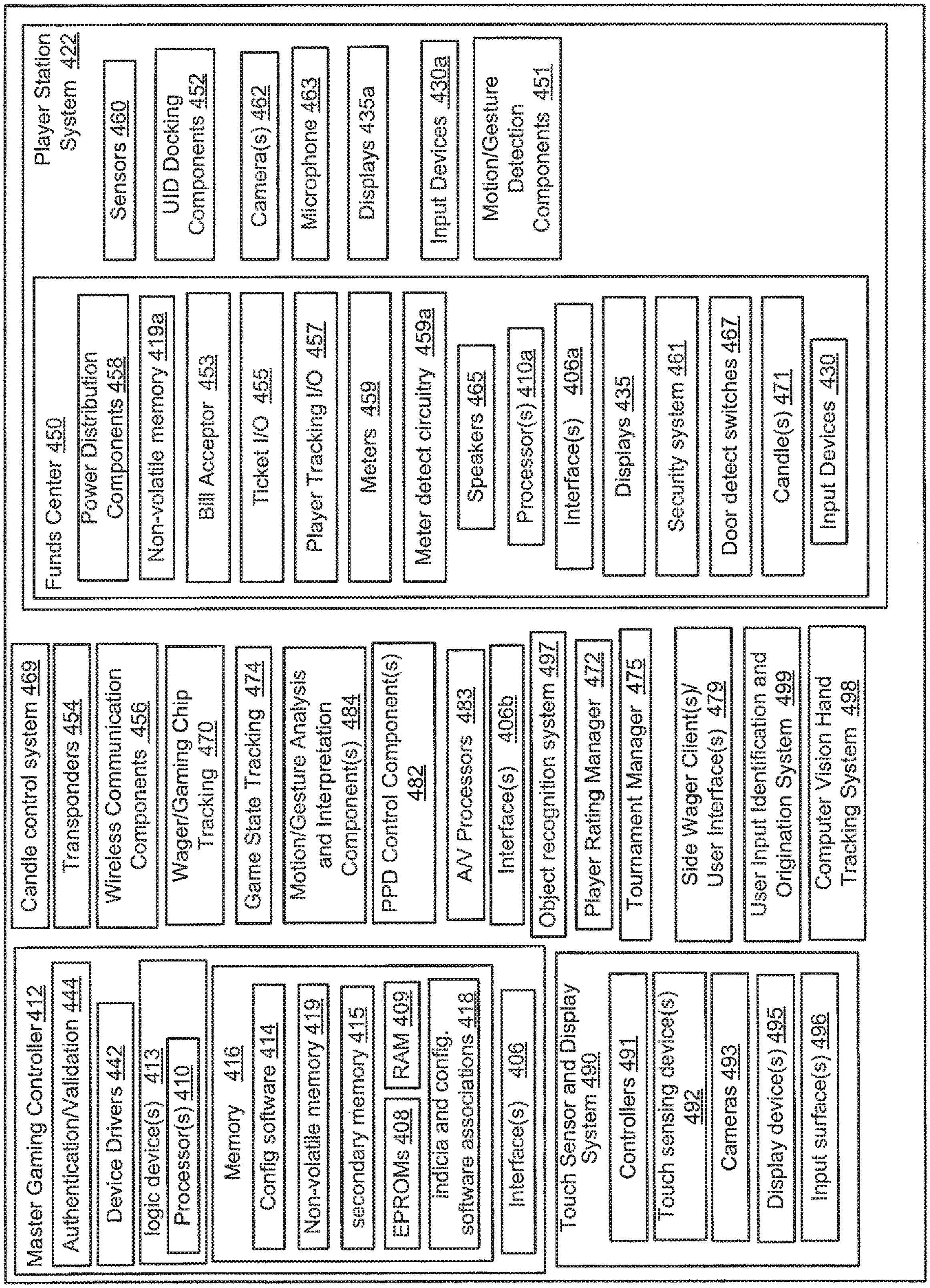
FIG. 4 is a simplified block diagram of an exemplary intelligent gaming table system 400 in accordance with a specific embodiment.

FIG. 4 is a simplified block diagram of an exemplary intelligent multi-player electronic gaming system 400 in accordance with a specific embodiment. As illustrated in the embodiment of FIG. 4, intelligent multi-player electronic gaming system 400 includes at least one processor 410, at least one interface 406, and memory 416. Additionally, as illustrated in the example embodiment of FIG. 4, intelligent multi-player electronic gaming system 400 includes at least one master gaming controller 412, a sensor and display system 490, multiple player station systems (e.g., player station system 422, which illustrates an example embodiment of one of the multiple player station systems), and/or various other components, devices, systems such as, for example, one or more of the following (or combinations thereof):

- Candle control system 469 which, for example, may include functionality for determining and/or controlling the appearances of one or more candles, light pipes, etc.;
- Transponders 454;
- Wireless communication components 456;
- Gaming chip/wager token tracking components 470;
- Games state tracking components 474;
- Motion/gesture analysis and interpretation components 484;
- Personal Player Device (PPD) control components 482;
- Audio/video processors 483 which, for example, may include functionality for detecting, analyzing and/or managing various types of audio and/or video information relating to various activities at the intelligent multi-player electronic gaming system;
- Various interfaces 406*b* (e.g., for communicating with other devices, components, systems, etc.);
- Object recognition system 497 which, for example, may include functionality for identifying and recognizing one or more objects placed on or near the main table display surface;
- Player rating manager 473;
- Tournament manager 475;
- Flat rate table game manager 477;
- Side wager client(s)/user interface(s) 479 which may be operable for enabling players at the gaming table to access and perform various types of side wager related activities;
- User input identification and origination system 499 which, for example, may be operable to perform one or more functions for determining and/or identifying an appropriate origination entity (such as, for example, a particular player, dealer, and/or other user interacting with a touch-based display surface of an intelligent multi-player electronic gaming system) to be associated with each (or selected ones of) the various contacts, movements, and/or gestures detected at or near the intelligent multi-player electronic gaming system;
- Computer Vision Hand Tracking System 498 which, for example, may be operable to track users' hands at, over and/or near the intelligent multi-player electronic gaming system and/or determine the different users' hand coordinates while gestures are being performed by the users on or over the display surface.
- etc.

In at least one embodiment, user input identification/origination system 499 may be operable to determine and/or identify an appropriate origination entity (e.g., a particular player, dealer, and/or other user at the gaming system) to be associated with each (or selected ones of) the various contacts, movements, and/or gestures detected at or near the intelligent multi-player electronic gaming system. In one embodiment, the user input identification/origination system may be operable to function in a multi-player environment, and may include functionality for initiating and/or performing one or more of the following functions (or combinations thereof):

- concurrently detecting multiple different input data from different players at the gaming table;
- determining a unique identifier for each active player at the gaming table;
- automatically determining, for each input detected, the identity of the player (or other person) who provided that input;
- automatically associating each detected input with an identifier representing the player (or other person) who provided that input;
- etc.

In some embodiments, the user input identification/origination system may be operatively coupled to one or more cameras (e.g., 493, 462, etc.) and/or other types of sensor devices described herein (such as, for example, microphones 463, sensors 460, multipoint sensing device(s) 496, etc.) for use in identifying a particular user who is responsible for performing one or more of the touches, contacts and/or gestures detected at or near the intelligent multi-player electronic gaming system.

In at least one embodiment, object recognition system 497 may include functionality for identifying and recognizing one or more objects placed on or near the main table display surface. It may also determine and/or recognize various characteristics associated with physical objects placed at or near the intelligent multi-player electronic gaming system, such as, for example, one or more of the following (or combinations thereof): positions, shapes, orientations, and/or other detectable characteristics of the object.

One or more cameras (e.g., 493, 462, etc.) may be utilized with a machine vision system to identify shapes and orientations of physical objects placed at or near the intelligent multi-player electronic gaming system. In some embodiments, cameras may also be mounted below a touch-based display surface (such as, for example, in situations where the presence of an object may be detected from the beneath the display surface). In at least one embodiment, the cameras may operable to detect visible and/or infrared light. Also, a combination of visible and infrared light detecting cameras may be utilized. In another embodiment, a stereoscopic camera may be utilized.

In response to detecting a physical object placed on the first surface, the intelligent multi-player electronic gaming system may be operable to open a video display window at a particular region of the one or more displays. In a particular embodiment, the physical object may include a transparent portion that allows information displayed in the video display window (e.g., which may be opened directly under or below the transparent object) to be viewed through the physical object.

In at least one embodiment, at least some of the physical objects described herein may include light-transmissive properties that vary within the object. For instance, in some embodiments, half of an object may be transparent and the other half may be opaque, such that video images rendered below the object may be viewed through the transparent half of the object and blocked by the opaque portion. In another example, the outer edges of object may be opaque while within the outer edges of object that are opaque, the object may be transparent, such that video images rendered below it may be viewed through the transparent portion. In yet another example, the object may include a plurality of transparent portions surrounded by opaque or translucent portions to provide multiple viewing windows through the object.

In some embodiments, one or more objects may include an RFID tag that allows the transmissive properties of the object, such as locations of transparent and non-transparent portions of the object or in the case of overhead projection, portions adapted for viewing projected images and portions not adapted for viewing projected images, to be identified.

In at least some embodiments, one or more objects may comprise materials that allow them to be more visible to a particular camera, such as including an infrared reflective material in an object to make it more visible under infrared light. Further, in one embodiment, a touch-based display surface may comprise a non-infrared reflecting material for enhancing detection of infrared reflecting objects placed on the display surface (e.g., via use of an infrared camera or infrared sensor). In addition, the intelligent multi-player electronic gaming system may include light emitters, such as an infrared light source, that helps to make an object more visible to a particular type of a camera/sensor.

The intelligent multi-player electronic gaming system may include markings, such as, for example, shapes of a known dimension, that allow the object detection system to self-calibrate itself in regards to using image data obtained from a camera for the purposes of determining the relative position of objects. In addition, the objects may include markings that allow information about the objects to be obtained. The markings may be symbol patterns like a bar-code or symbols or patterns that allow object properties to be identified. These symbols or patterns may be on a top, bottom, side or any surface of an object depending on where cameras are located, such as below or above the objects. The orientation of pattern or markings and how a machine vision system may perceive them from different angles may be known. Using this information, it may be possible to determine an orientation of objects on the display surface.

For example, in at least one embodiment, the object recognition system 497 may include a camera that may be able to detect markings on a surface of the object, such as, for example, a barcode and/or other types of displayable machine readable content which may be detected and/or recognized by an appropriately configured electronic device. The markings may be on a top surface, lower surface or side and may vary according to a shape of the object as well as a location of data acquisition components, such as cameras, sensors, etc. Such markings may be used to convey information about the object and/or its associations. For example, in one embodiment one portion of markings on the object may represent an identifier which may be used for uniquely identifying that particular object, and which may be used for determining or identifying other types of information relating to and/or associated with that object, such as, for example, an identity of an owner (or current possessor) of the object, historical data relating to that object (such as, for example, previous uses of the object, locations and times relating to previous uses of the object, prior owners/users of the object, etc.), etc. In some embodiments, the markings may be of a known location and orientation on the object and may be used by the object recognition system 497 to determine an orientation of the object.

In at least one embodiment, touch-based sensor and display system 490 may include one or more of the following (or combinations thereof):

Table controllers 491;

Singlepoint and/or Multipoint sensing device(s) 492 (e.g., multi-touch surface sensors/components);

Cameras 493;

Projector(s);

Display device(s) 495;

Input/touch surface(s) 496;

Etc.

In at least one embodiment, multi-touch sensor and display system 490 may include one or more of the following (or combinations thereof):

Display controllers 491;

Multipoint sensing device(s) 492 (e.g., multi-touch surface sensors/components);

Cameras 493;

Projector(s) 494;

Display surface(s) 495;

Input/touch surface 496;

Etc.

In at least one embodiment, one or more of the multipoint sensing device(s) 492 may be implemented using any suitable multipoint or multi-touch input interface (such as, for example, a multipoint touchscreen) which is capable of detecting and/or sensing multiple points touched simultaneously on the device 492 and/or multiple gestures gestured on the device 492. Thus, for example, in at least one embodiment, input/touch surface 496 may include at least one multipoint sensing device 492 which, for example, may be positioned over or in front of one or more of the display device(s) 495, and/or may be integrated with one or more of the display device(s).

For example, in one example embodiment, multipoint sensing device(s) 492 may include one or more multipoint touchscreen products available from CAD Center Corporation of Tokyo, Japan (such as, for example, one or more multipoint touchscreen products marketed under the trade name "NEXTRAX™." For example, in one embodiment, the multipoint sensing device(s) 492 may be implemented using a multipoint touchscreen configured as an optical-based device that triangulates the touched coordinate(s) using infrared rays (e.g., retroreflective system) and/or an image sensor.

In another example embodiment, multipoint sensing device(s) 492 may include a frustrated total internal reflection (FTIR) device, such as that described in the article, "Low-Cost Multi-touch Sensing Through Frustrated Total Internal Reflection," by Jefferson Y. Han, published by ACM New York, N.Y., Proceedings of the 18th Annual ACM Symposium on User Interface Software and Technology 2005, at 115-118, the entirety of which is incorporated herein by reference for all purposes.

For example, in one embodiment, a multipoint sensing device may be implemented as a FTIR-based multipoint sensing device which includes a transparent substrate (e.g., acrylic), an LED array, a projector (e.g., 494), a video camera (e.g., 493), a baffle, and a diffuser secured by the baffle. The projector and the video camera may form a touch-based display surface of the intelligent multi-player electronic gaming system. In one embodiment, the transparent substrate is edge-lit by the LED array (which, for example, may include high-power infrared LEDs or photodiodes placed directly against the edges of the transparent substrate). The video camera may include a band-pass filter to isolate infrared frequencies which are desired to be detected, and may be operatively coupled to the gaming system controller. The rear-projection projector may be configured or designed to project images onto the transparent substrate, which diffuses through the diffuser and rendered visible. Pressure can be sensed by the FTIR device by comparing the pixel area of the point touched. For example, a light touch will register a smaller pixel area by the video camera than a heavy touch by the same finger tip.

FTIR-based multipoint sensing device should preferably be capable of sensing or detecting multiple concurrent touches. For example, in one embodiment, when the fingers of a player touch or may contact with regions on the transparent substrate, an infrared light bouncing around inside the transparent substrate may be scattered in various directions, and these optical disturbances may be detected by the video camera (or other suitable sensor(s)). Gestures can also be recorded by the video camera, and data representing the multipoint gestures may be transmitted to the gaming system controller for further processing. In at least one embodiment, the data may include various types of characteristics relating to the detected gesture(s) such as, for example, velocity, direction, acceleration, pressure of a gesture, etc.

In other embodiments, a multipoint sensing device may be implemented using a transparent self-capacitance or mutual-capacitance touchscreen, such as that disclosed in PCT Publication No. WO2005/114369A3, entitled "Multipoint Touchscreen", by HOTELLING et al, the entirety of which is incorporated herein by reference for all purposes.

In other embodiments, a multipoint sensing device may be implemented using a multi-user touch surface such as that described in U.S. Pat. No. 6,498,590, entitled "MULTI-USER TOUCH SURFACE" by Dietz et al., the entirety of which is incorporated herein by reference for all purposes. For example, in one embodiment the multi-touch sensor and display system 490 may be implemented using one of the MERL DiamondTouch™ table products developed by Mitsubishi Electric Research Laboratories, and distributed by Circle Twelve Inc., of Framingham, Mass.

For example, in at least one embodiment, the intelligent multi-player electronic gaming system may be implemented as an electronic gaming table having a multi-touch display surface. The electronic gaming table may be configured or designed to transmit wireless signals to all or selected regions of the surface of the table. The table display surface may be configured or designed to include an array of embedded antennas arranged in a selectable in a grid array. In some embodiments, each user at the electronic gaming table may be provided with a chair which is operatively coupled to a sensing receiver. In other embodiments, users at the electronic gaming table may be provided with other suitable mechanisms (e.g., floor pads, electronic wrist bracelets, etc.) which may be operatively coupled to (e.g., via wired and/or wireless connections) one or more designated sensing receivers. In one embodiment, when a user touches the table surface, signals are capacitively coupled from directly beneath the touch point, through the user, and into a receiver unit associated with that user. The receiver can then determine which parts of the table surface the user is touching.

Other touch sensing technologies are suitable for use as the multipoint sensing device(s) 492, including resistive sensing, surface acoustic wave sensing, pressure sensing, optical sensing, and the like. Also, other mechanisms may be used to display the graphics on the display surface 302 such as via a digital light processor (DLP) projector that may be suspended at a set distance in relation to the display surface.

In at least one embodiment, at least some gestures detected by the intelligent multi-player electronic gaming system may include gestures where all or a portion of a player's hand and/or arm are resting on a surface of the interactive table. In some instances, the detection system may be operable to detect a hand gesture when the hand is a significant distance from the surface of the table. During a hand motion as part of a gesture that is detected for some embodiments, a portion of the player's hand such as a finger may remain in contact continuously or intermittently with the surface of the interactive table or may hover just above the table. In some instances, the detection system may require a portion of the player's hand to remain in contact with the surface for the gesture to be recognized.

In at least one embodiment, video images may be generated using one or more projection devices (e.g., 494) which may be positioned above, on the side(s) and/or below the multi-touch display surface. Examples of various projection systems that may be utilized herein are described in U.S. patent application Ser. No. 10/838,283 (US Pub no. 20050248729), Ser. No. 10/914,922 (US Pub. No. 20060036944), Ser. No. 10/951,492 (US Pub no. 20060066564), Ser. No. 10/969,746 (US Pub. No. 20060092170), Ser. No. 11/182,630 (US Pub no. 20070015574), Ser. No. 11/350,854 (US Pub No. 20070201863), Ser. No. 11/363,750 (US Pub no. 20070188844), Ser. No. 11/370,558 (US Pub No. 20070211921), each of which is incorporated by reference in its entirety and for all purposes.

According to various embodiments, display surface(s) 495 may include one or more display screens utilizing various types of display technologies such as, for example, one or more of the following (or combinations thereof): LCDs (LiqPPD Crystal Display), Plasma, OLEDs (Organic Light Emitting Display), TOLED (Transparent Organic Light Emitting Display), Flexible (F)OLEDs, Active matrix (AM) OLED, Passive matrix (PM) OLED, Phosphor-escent (PH) OLEDs, SEDs (surface-conduction electron-emitter display), EPD (Electrophoretic display), FEDs (Field Emission Displays) and/or other suitable display technology. EPD displays may be provided by E-ink of Cambridge, Mass. OLED displays of the type list above may be provided by Universal Display Corporation, Ewing, N.J.

In at least one embodiment, master gaming controller 412 may include one or more of the following (or combinations thereof):

- Authentication/validation components 444;
- Device drivers 442;
- Logic devices 413, which may include one or more processors 410;
- Memory 416, which may include one or more of the following (or combinations thereof): configuration software 414, non-volatile memory 415, EPROMS 408, RAM 409, associations 418 between indicia and configuration software, etc.;
- Interfaces 406;
- Etc.

In at least one embodiment, player station system 422 may include one or more of the following (or combinations thereof):

- Sensors 460;
- Personal Player Device (PPD) docking components 452;
- One or more cameras 462;
- One or more microphones 463;
- Secondary display(s) 435*a;*
- Input devices 430*a;*
- Motion/gesture detection components 451;
- Funds center system 450;
- Etc.

In at least one embodiment, funds center system 450 may include one or more of the following (or combinations thereof):

- Power distribution components 458;
- Non-volatile memory 419*a* (and/or other types of memory);
- Bill acceptor 453;
- Ticket I/O 455;
- Player tracking i/o 457;
- Meters 459 (e.g., hard and/or soft meters);
- Meter detect circuitry 459*a;*
- Speakers 465;
- Processor(s) 410*a;*
- Interface(s) 406*a;*
- Display(s) 435;
- Independent security system 461;
- Door detect switches 467;
- Candles, light pipes, etc. 471;
- Input devices 430;
- Etc.

In one implementation, processor 410 and master gaming controller 412 are included in a logic device 413 enclosed in a logic device housing. The processor 410 may include any conventional processor or logic device configured to execute software allowing various configuration and reconfiguration tasks such as, for example: a) communicating with a remote source via communication interface 406, such as a server that stores authentication information or games; b) converting signals read by an interface to a format corresponding to that used by software or memory in the intelligent multi-player electronic gaming system; c) accessing memory to configure or reconfigure game parameters in the memory according to indicia read from the device; d) communicating with interfaces, various peripheral devices 422 and/or I/O devices; e) operating peripheral devices 422 such as, for example, card readers, paper ticket readers, etc.; f) operating various I/O devices such as, for example, displays 435, input devices 430; etc. For instance, the processor 410 may send messages including game play information to the displays 435 to inform players of cards dealt, wagering information, and/or other desired information.

The intelligent multi-player electronic gaming system 400 also includes memory 416 which may include, for example, volatile memory (e.g., RAM 409), non-volatile memory 419 (e.g., disk memory, FLASH memory, EPROMs, etc.), unalterable memory (e.g., EPROMs 408), etc. The memory may be configured or designed to store, for example: 1) configuration software 414 such as all the parameters and settings for a game playable on the intelligent multi-player electronic gaming system; 2) associations 418 between configuration indicia read from a device with one or more parameters and settings; 3) communication protocols allowing the processor 410 to communicate with peripheral devices 422 and I/O devices 411; 4) a secondary memory storage device 415 such as anon-volatile memory device, configured to store gaming software related information (the gaming software related information and memory may be used to store various audio files and games not currently being used and invoked in a configuration or reconfiguration); 5) communication transport protocols (such as, for example, TCP/IP, USB, Firewire, IEEE1394, Bluetooth, IEEE 802.11x (IEEE 802.11 standards), hiperlan/2, HomeRF, etc.) for allowing the intelligent multi-player electronic gaming system to communicate with local and non-local devices using such protocols; etc. In one implementation, the master gaming controller 412 communicates using a serial communication protocol. A few examples of serial communication protocols that may be used to communicate with the master gaming controller include but are not limited to USB, RS-232 and Netplex (a proprietary protocol developed by IGT, Reno, Nev.).

A plurality of device drivers 442 may be stored in memory 416. Example of different types of device drivers may include device drivers for intelligent multi-player electronic gaming system components, device drivers for player station system components, etc. Typically, the device drivers 442 utilize a communication protocol of some type that enables communication with a particular physical device. The device driver abstracts the hardware implementation of a device. For example, a device drive may be written for each type of card reader that may be potentially connected to the intelligent multi-player electronic gaming system. Examples of communication protocols used to implement the device drivers include Netplex, USB, Serial, Ethernet 475, Firewire, I/O debouncer, direct memory map, serial, PCI, parallel, RF, Bluetooth™, near-field communications (e.g., using near-field magnetics), 802.11 (WiFi), etc. Netplex is a proprietary IGT standard while the others are open standards. According to a specific embodiment, when one type of a particular device is exchanged for another type of the particular device, a new device driver may be loaded from the memory 416 by the processor 410 to allow communication with the device. For instance, one type of card reader in intelligent multi-player electronic gaming system 400 may be replaced with a second type of card reader where device drivers for both card readers are stored in the memory 416.

In some embodiments, the software units stored in the memory 416 may be upgraded as needed. For instance, when the memory 416 is a hard drive, new games, game options, various new parameters, new settings for existing parameters, new settings for new parameters, device drivers, and new communication protocols may be uploaded to the memory from the master gaming controller 412 or from some other external device. As another example, when the memory 416 includes a CD/DVD drive including a CD/DVD designed or configured to store game options, parameters, and settings, the software stored in the memory may be upgraded by replacing a first CD/DVD with a second CD/DVD. In yet another example, when the memory 416 uses one or more flash memory 419 or EPROM 408 units designed or configured to store games, game options, parameters, settings, the software stored in the flash and/or EPROM memory units may be upgraded by replacing one or more memory units with new memory units which include the upgraded software. In another embodiment, one or more of the memory devices, such as the hard-drive, may be employed in a game software download process from a remote software server.

In some embodiments, the intelligent multi-player electronic gaming system 400 may also include various authentication and/or validation components 444 which may be used for authenticating/validating specified intelligent multi-player electronic gaming system components such as, for example, hardware components, software components, firmware components, information stored in the intelligent multi-player electronic gaming system memory 416, etc. Examples of various authentication and/or validation components are described in U.S. Pat. No. 6,620,047, entitled, “ELECTRONIC GAMING APPARATUS HAVING AUTHENTICATION DATA SETS,” incorporated herein by reference in its entirety for all purposes.

Player station system components/devices 422 may also include other devices/component(s) such as, for example, one or more of the following (or combinations thereof):

sensors 460, cameras 462, control consoles, transponders 454, personal player (or user) displays 453*a*, wireless communication component(s), wire/wireless power distribution component(s) 458, PPD docking component(s) 452, player tracking management component(s), game state tracking component(s), motion/gesture detection component(s) 451, card readers, bill validator/paper ticket readers, etc. Such devices may each comprise resources for handling and processing configuration indicia such as a microcontroller that converts voltage levels for one or more scanning devices to signals provided to processor 410. In one embodiment, application software for interfacing with one or more player station system components/devices may store instructions (such as, for example, how to read indicia from a portable device) in a memory device such as, for example, non-volatile memory, hard drive or a flash memory.

In at least one implementation, the intelligent multi-player electronic gaming system may include card readers such as used with credit cards, or other identification code reading devices to allow or require player identification in connection with play of the card game and associated recording of game action. Such a user identification interface can be implemented in the form of a variety of magnetic card readers commercially available for reading a user-specific identification information. The user-specific information can be provided on specially constructed magnetic cards issued by a casino, or magnetically coded credit cards or debit cards frequently used with national credit organizations such as VISA, MASTERCARD, AMERICAN EXPRESS, or banks and other institutions.

The intelligent multi-player electronic gaming system may include other types of participant identification mechanisms which may use a fingerprint image, eye blood vessel image reader, or other suitable biological information to confirm identity of the user. Still further it is possible to provide such participant identification information by having the dealer manually code in the information in response to the player indicating his or her code name or real name. Such additional identification could also be used to confirm credit use of a smart card, transponder, and/or player's PPD.

Sensors 460 may include, for example, optical sensors, pressure sensors, RF sensors, Infrared sensors, motion sensors, audio sensors, image sensors, thermal sensors, biometric sensors, etc. As mentioned previously, such sensors may be used for a variety of functions such as, for example: detecting the presence and/or monetary amount of gaming chips which have been placed within a player's wagering zone; detecting (e.g., in real time) the presence and/or monetary amount of gaming chips which are within the player's personal space; detecting the presence and/or identity of PPDs, detecting player (and/or dealer) movements/gestures, etc.

In one implementation, at least a portion of the sensors 460 and/or input devices 430 may be implemented in the form of touch keys selected from a wide variety of commercially available touch keys used to provide electrical control signals. Alternatively, some of the touch keys may be implemented in another form which are touch sensors such as those provided by a touchscreen display. For example, in at least one implementation, the intelligent multi-player electronic gaming system player displays (and/or PPD displays) may include input functionality for allowing players to provide their game play decisions/instructions (and/or other input) to the dealer using the touch keys and/or other player control sensors/buttons. Additionally, such input functionality may also be used for allowing players to provide input to other devices in the casino gaming network (such as, for example, player tracking systems, side wagering systems, etc.)

Wireless communication components 456 may include one or more communication interfaces having different architectures and utilizing a variety of protocols such as, for example, 802.11 (WiFi), 802.15 (including Bluetooth™), 802.16 (WiMax), 802.22, Cellular standards such as CDMA, CDMA2000, WCDMA, Radio Frequency (e.g., RFID), Infrared, Near Field Magnetic communication protocols, etc. The communication links may transmit electrical, electromagnetic or optical signals which carry digital data streams or analog signals representing various types of information.

An example of a near-field communication protocol is the ECMA-340 "Near Field Communication-Interface and Protocol (NFCIP-1)", published by ECMA International (www.ecma-international.org), herein incorporated by reference in its entirety for all purposes. It will be appreciated that other types of Near Field Communication protocols may be used including, for example, near field magnetic communication protocols, near field RF communication protocols, and/or other wireless protocols which provide the ability to control with relative precision (e.g., on the order of centimeters, inches, feet, meters, etc.) the allowable radius of communication between at least 4 devices using such wireless communication protocols.

Power distribution components 458 may include, for example, components or devices which are operable for providing wireless power to other devices. For example, in one implementation, the power distribution components 458 may include a magnetic induction system which is adapted to provide wireless power to one or more portable PPDs at the intelligent multi-player electronic gaming system. In one implementation, a PPD docking region may include a power distribution component which is able to recharge a PPD placed within the PPD docking region without requiring metal-to-metal contact.

In at least one embodiment, motion/gesture detection component(s) 451 may be configured or designed to detect user (e.g., player, dealer, and/or other persons) movements and/or gestures and/or other input data from the user. In some embodiments, each player station 422 may have its own respective motion/gesture detection component(s). In other embodiments, motion/gesture detection component(s) 451 may be implemented as a separate sub-system of the intelligent multi-player electronic gaming system which is not associated with any one specific player station.

In at least one embodiment, motion/gesture detection component(s) 451 may include one or more cameras, microphones, and/or other sensor devices of the intelligent multi-player electronic gaming system which, for example, may be used to detect physical and/or verbal movements and/or gestures of one or more players (and/or other persons) at the gaming table. Additionally, according to specific embodiments, the detected movements/gestures may include contact-based gestures/movements (e.g., where a user makes physical contact with the multi-touch surface of the intelligent multi-player electronic gaming system) and/or non-contact-based gestures/movements (e.g., where a user does not make physical contact with the multi-touch surface of the intelligent multi-player electronic gaming system).

In one embodiment, the motion/gesture detection component(s) 451 may be operable to detect gross motion or gross movement of a user (e.g., player, dealer, etc.). The motion detection component(s) 451 may also be operable to detect gross motion or gross movement of a user's appendages such as, for example, hands, fingers, arms, head, etc. Additionally, in at least one embodiment, the motion/gesture detection component(s) 451 may further be operable to perform one or more additional functions such as, for example: analyze the detected gross motion or gestures of a participant; interpret the participant's motion or gestures (e.g., in the context of a casino game being played at the intelligent multi-player electronic gaming system) in order to identify instructions or input from the participant; utilize the interpreted instructions/input to advance the game state; etc. In other embodiments, at least a portion of these additional functions may be implemented at the master gaming controller 412 and/or at a remote system or device.

In at least one embodiment, motion/gesture analysis and interpretation component(s) 484 may be operable to analyze and/or interpret information relating to detected player movements and/or gestures. For example, in at least one embodiment, motion/gesture analysis and interpretation component(s) 484 may be operable to perform one or more of the following types of operations (or combinations thereof):

- recognize one or more gestures performed by users interacting with the intelligent multi-player electronic gaming system;
- map various types of raw input data (e.g., detected by the multi-touch sensor and display system 490) to one or more gestures;
- identify groupings of two or more contact regions (e.g., detected by the multi-touch sensor and display system 490) as being associated with each other for the purpose of gesture recognition/identification/interpretation;
- determine and/or identify the number or quantity of contact regions associated with a gesture performed by a user interacting with the intelligent multi-player electronic gaming system;
- determine and/or identify the shapes and/or sizes of contact regions relating to a gesture performed by a user interacting with the intelligent multi-player electronic gaming system;
- determine and/or identify the locations of the contact regions associated with a gesture performed by a user interacting with the intelligent multi-player electronic gaming system;
- determine and/or identify the arrangement (e.g., relative arrangement) of contact regions associated with a gesture performed by a user interacting with the intelligent multi-player electronic gaming system;
- map one or more contact regions (e.g., associated with a gesture performed by a user interacting with the intelligent multi-player electronic gaming system) to one or more digits (e.g., fingers, thumbs, etc.) of the user's hand(s);
- map an identified gesture (e.g., performed by a user interacting with the intelligent multi-player electronic gaming system) to one or more function(s) (such as, for example, a specific user input instruction that is to be received and processed by the gaming controller);
- create an association between an identified gesture (e.g., performed by a user interacting with the intelligent multi-player electronic gaming system) and the user (e.g., origination entity) who performed that gesture;
- create an association between an identified function (e.g., which has been mapped to a gesture performed by a user interacting with the intelligent multi-player electronic gaming system) and the user (e.g., origination entity) who performed the gesture relating to the identified function;
- cause one or more function(s) to be initiated on behalf of a given user at the gaming system, for example, in response to an input gesture performed by the user;
- cause one or more function(s) to be initiated on behalf of a given user at the gaming system, for example, in response to an input gesture performed by the user;
- provide a specific set of input instructions (e.g., which have been identified as originating from a specific user at the gaming system) to the gaming controller 412 in response to an input gesture performed by the user;
- identify continuous contacts/touches;
- detect contacts, touches and/or near touches and provide identification and tracking of detected contacts, touches and/or near touches;
- etc.

According to various embodiments, one method of utilizing the intelligent multi-player electronic gaming system may comprise: 1) initiating in the master gaming table controller the wager-based game for at least a first active player; 2) receiving in the master gaming table controller information from the object detection system indicating a first physical object is located in a first video display area associated with the first active player where the first physical object includes a transparent portion that allows information generated in the first video display area to be viewed through the transparent portion; 3) determining in the master gaming controller one of a position, a shape, an orientation or combinations thereof of the transparent portion in the first video display area, 4) determining in the master gaming table controller one of a position, a shape, an orientation or combinations thereof of a first video display window in the first video display area to allow information generated in the first video display window to be viewable through the transparent portion of the first physical object; 5) controlling in the master gaming controller a display of first video images in the first video display window where the first video images may include information associated with the first active player; 6) controlling in the master gaming controller a display of second video images of including information related to the play the wager-based game in the first video display area; and 4) determining in the master gaming controller the results of the wager-based game for the first active player.

In particular embodiments, the first physical object may be moved during game play, such as during a single wager-based game or from a first position/orientation in a first play of the wager-based game to a second position/orientation in a second play of the wager-based game. The position/orientation of the first physical object may be altered by a game player or a game operator, such as a dealer. Thus, the method may also comprise during the play of the wager-based game, determining in the master gaming controller one of a second position and a second orientation of the transparent portion in the first video display area and determining in the master gaming table controller one of a second position and a second orientation of the first video display window in the first video display area to allow information generated in the first video display window to be viewable through the transparent portion of the first physical object.

In particular embodiments, the second video images may include one or more game objects. The one or more game objects may also be displayed in the first video window and may include but are not limited to a chip, a marker, a die, a playing card or a marked tile. In general, the game objects may comprise any game piece associated with the play of wager-based table game. The game pieces may appear to be 3-D dimensional in the rendered video images.

When placed on the first surface, a footprint of the first physical object on the first surface may be one of a rectangular shaped or a circular shaped. In general, the foot print of the first physical object may be any shape. The foot print of the first physical object may be determined using the object detection system.

The method may further comprise determining in the master table gaming controller an identity of the first active player and displaying in the first video display window player tracking information associated with the first active player. The identity of the first active player may be determined using information obtained from the first physical object. In particular embodiments, the information obtained from the first physical object may be marked or written on the first physical object and read using a suitable detection device or the information may be stored in a memory on first physical object, such as with an RFID tag and read using a suitable reading device.

In another example embodiment, the method may further comprise, 1) determining in the master table gaming controller the information displayed in the first video display window includes critical game information, 2) storing to a power-hit tolerant non-volatile memory the critical game information, the position, the shape, the orientation or the combinations thereof of the first video display window and information regarding one or more physical objects, such as but not limited to there locations and orientation on the first surface, 3) receiving in the master table gaming controller a request to display the critical game information previously displayed in the first video display window; 4) retrieving from the power-hit tolerant non-volatile memory the critical game information and the position, the shape, the orientation or the combinations thereof of the first video display window; 5) controlling in the master table gaming controller the display of the critical game information in the first video display window using the position, the shape, the orientation or the combinations thereof retrieved from the power-hit tolerant non-volatile memory and 6) providing information regarding the one or more physical objects, such that there placement and location on the first surface may be recreated when the one or more physical objects are available.

In yet other embodiments, the method may comprise 1) providing the first physical object wherein the first physical object includes a first display; 2) selecting in the master gaming controller information to display to the first active player, 3) generating in the master gaming controller video images including the information selected for the first active player in the first video display window; 4) sending from the master gaming controller to the first physical object the information selected for first active player to allow the information selected for the first active player to be displayed at the same time on the first display and the first video display window. The information selected for the first active player may be an award, promotional credits or an offer.

According to different embodiments, at least a portion of the various gaming table devices, components and/or systems illustrated in the example of FIG. 4 may be configured or designed to include at least some functionality similar to the various gaming table devices, components and/or systems illustrated and/or described in one or more of the following references:

U.S. patent application Ser. No. 12/249,771 entitled "AUTOMATED TECHNIQUES FOR TABLE GAME STATE TRACKING" by Harris et al., filed on Oct. 10, 2008, the entirety of which is incorporated herein by reference for all purposes;

U.S. patent application Ser. No. 11/938,179, by Wells et al., entitled "TRANSPARENT CARD DISPLAY," filed on Nov. 9, 2007, previously incorporated herein by reference in its entirety for all purposes;

U.S. patent application Ser. No. 11/825,481, by Mattice, et al., entitled "GESTURE CONTROLLED CASINO GAMING SYSTEM", the entirety of which is incorporated herein by reference for all purposes; and U.S. patent application Ser. No. 11/363,750 (U.S. Publication No. 20070201863), by Wilson, et al., entitled "COMPACT INTERACTIVE TABLETOP WITH PROJECTION-VISION", the entirety of which is incorporated herein by reference for all purposes.

As mentioned previously, at least some embodiments of a intelligent multi-player electronic gaming system may be operatively coupled to one or more cameras and/or other types of sensor devices described herein for use in identifying a particular user who is responsible for performing one or more of the touches, contacts and/or gestures detected at or near the intelligent multi-player electronic gaming system.

Figure 5:
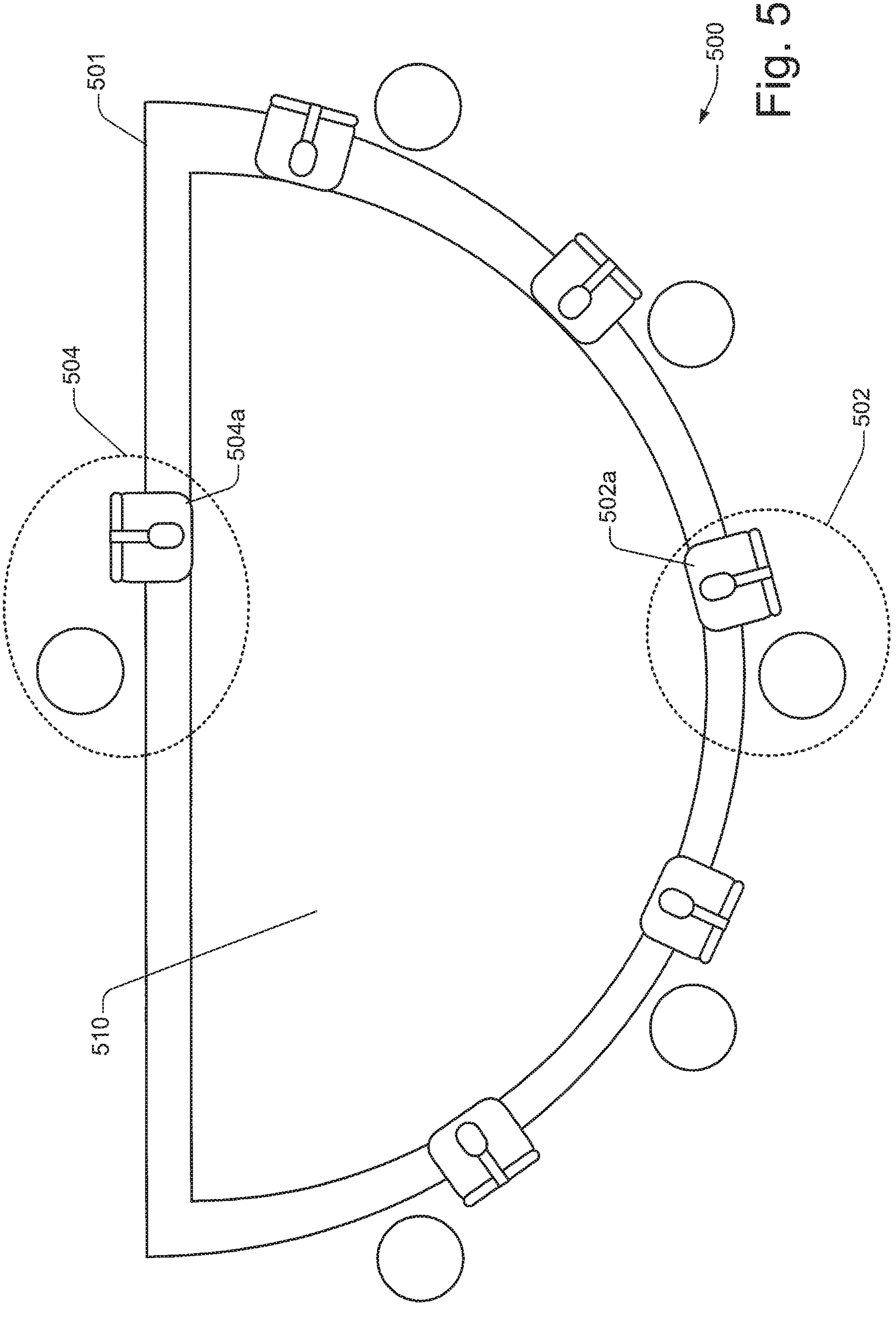
FIG. 5 illustrates an example of a gaming table system 500 which includes a D-shaped intelligent gaming table 501 in accordance with a specific embodiment.

FIG. 5 illustrates an example of a gaming table system 500 which includes a D-shaped intelligent gaming table 501 in accordance with a specific embodiment. As illustrated in the example of FIG. 5, the intelligent gaming table may include a plurality of individual player stations (e.g., 502), with each player station including its own respective funds center system (e.g., 502*a*). In the example of FIG. 5, the intelligent gaming table also includes a dealer station 504 and associated funds center 504*a*. In at least one embodiment, gaming table system 500 includes a main table display system 510 which includes features and/or functionality similar to that of main table display 102 of FIG. 1. In the example of FIG. 5, main table display 510 has a shape (e.g., semi-circular shaped, D-shaped, etc.) which is similar to the shape of the intelligent gaming table body.

Figure 6:
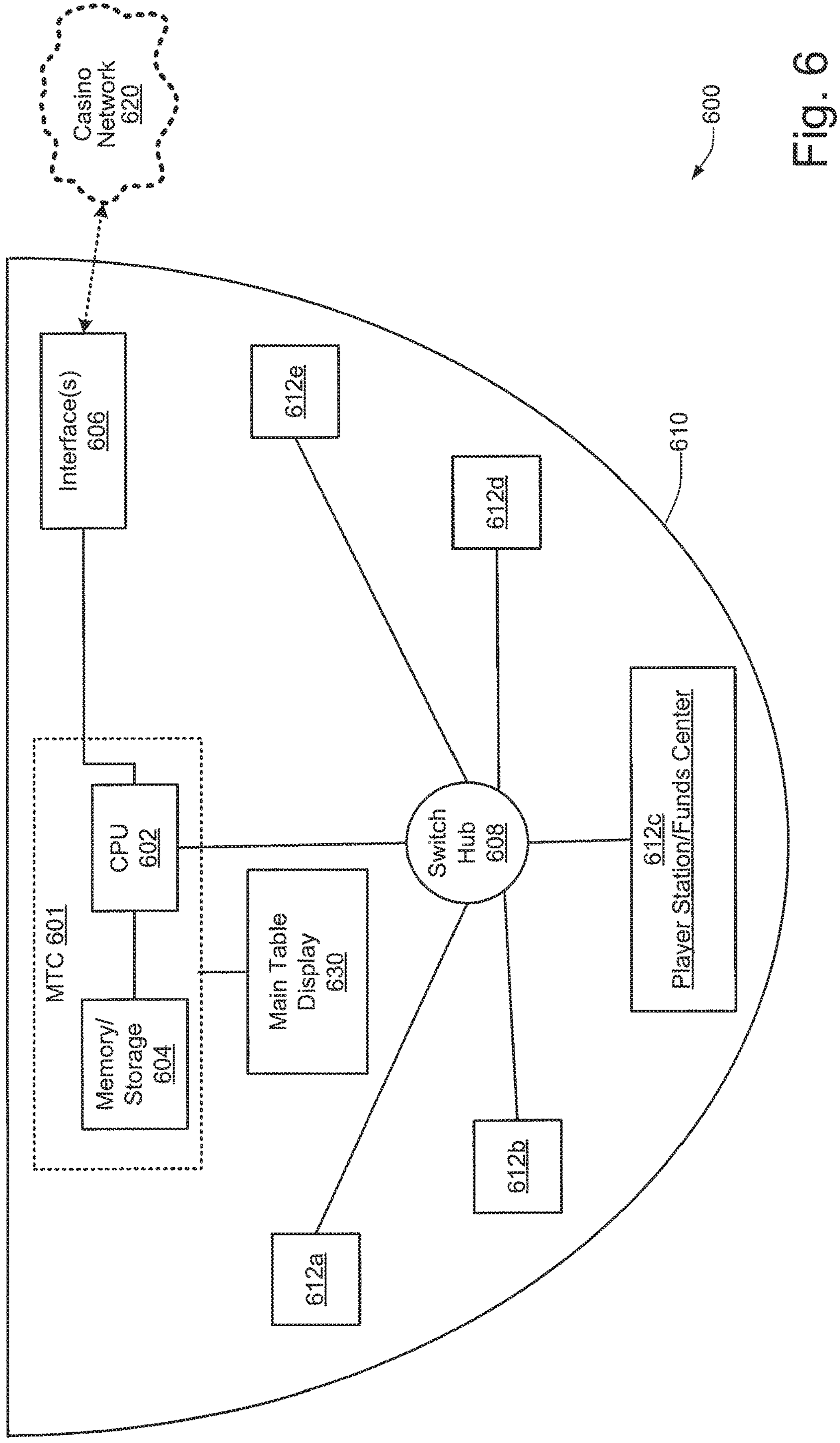
FIG. 6 is a simplified block diagram of an intelligent gaming table system 600 in accordance with a specific embodiment.

FIG. 6 is a simplified block diagram of an intelligent gaming table system 600 in accordance with a specific embodiment. As illustrated in the embodiment of FIG. 6, intelligent gaming table system 600 includes (e.g., within gaming table housing 610) a master table controller (MTC) 601, a main multi-touch table display system 630 and a plurality of player station systems/fund centers (e.g., 612*a-e*) which, for example, may be connected to the MTC 601 via at least one switch or hub 608. In at least one embodiment, master table controller 601 may include at least one processor or CPU 602, and memory 604. Additionally, as illustrated in the example of FIG. 6, intelligent gaming table system 600 may also include one or more interfaces 606 for communicating with other devices and/or systems in the casino network 620.

In at least one embodiment, a separate player station system may be provided at each player station at the gaming table. According to specific embodiments, each player station system may include a variety of different electronic components, devices, and/or systems for providing various types of functionality. For example, as shown in the embodiment of FIG. 6, player station system 612*c* may comprise a variety of different electronic components, devices, and/or systems such as, for example, one or more of the various components, devices, and/or systems illustrated and/or described with respect to FIG. 4.

Although not specifically illustrated in FIG. 6, each of the different player station systems 612*a-e* may include components, devices and/or systems similar to that of player station system 612*c*.

According to one embodiment, gaming table system 600 may be operable to read, receive signals, and/or obtain information from various types of media (e.g., player tracking cards) and/or other devices such as those issued by the casino. For example, media detector/reader may be operable to automatically detect wireless signals (e.g., 802.11 (WiFi), 802.15 (including Bluetooth™), 802.16 (WiMax), 802.22, Cellular standards such as CDMA, CDMA2000, WCDMA, Radio Frequency (e.g., RFID), Infrared, Near Field Magnetics, etc.) from one or more wireless devices (such as, for example, an RFID-enabled player tracking card) which, for example, are in the possession of players at the gaming table. The media detector/reader may also be operable to utilize the detected wireless signals to determine the identity of individual players associated with each of the different player tracking cards. The media detector/reader may also be operable to utilize the detected wireless signals to access additional information (e.g., player tracking information) from remote servers (e.g., player tracking server).

In at least one embodiment, each player station may include a respective media detector/reader.

In at least one embodiment, gaming table system 600 may be operable to detect and identify objects (e.g., electronic objects and/or non-electronic objects) which are placed on the main table display 630. For example, in at least one embodiment, one or more cameras of the gaming table system may be used to monitor and/or capture images of objects which are placed on the surface of the main table display 630, and the image data may be used to identify and/or recognize various objects detected on or near the surface of the main table display. Additional details regarding gaming table object recognition techniques are described, for example, in U.S. patent application Ser. No. 11/938,179, by Wells et al., entitled "TRANSPARENT CARD DISPLAY," filed on Nov. 9, 2007, previously incorporated herein by reference in its entirety.

In at least one embodiment, Gaming table system 600 may also be operable to determine and create ownership or possessor associations between various objects detected at the gaming table and the various players (and/or casino employees) at the gaming table. For example, in one embodiment, when a player at gaming table system 600 places an object (e.g., gaming chip, money, token, card, non-electronic object, etc.) on the main table display, the gaming table system may be operable to: (1) identify and recognize the object; (2) identify the player at the gaming table system who placed the object on the main table display; and (3) create an "ownership" association between the detected object and the identified player (which may be subsequently stored and used for various tracking and/or auditing purposes).

According to a specific embodiment, the media detector/reader may also be operable to determine the position or location of one or more players at the gaming table, and/or able to identify a specific player station which is occupied by a particular player at the gaming table.

As used herein, the terms "gaming chip" and "wagering token" may be used interchangeably, and, in at least one embodiment, may refer to a chip, coin, and/or other type of token which may be used for various types of casino wagering activities, such as, for example, gaming table wagering.

In at least one embodiment, intelligent gaming table system 600 may also include components and/or devices for implementing at least a portion of gaming table functionality described in one or more of the following patents, each of which is incorporated herein by reference in its entirety for all purposes: U.S. Pat. No. 5,735,742, entitled "GAMING TABLE TRACKING SYSTEM AND METHOD"; and U.S. Pat. No. 5,651,548, entitled "GAMING CHIPS WITH ELECTRONIC CIRCUITS SCANNED BY ANTENNAS IN GAMING CHIP PLACEMENT AREAS FOR TRACKING THE MOVEMENT OF GAMING CHIPS WITHIN A CASINO APPARATUS AND METHOD."

For example, in one embodiment, intelligent gaming table system 600 may include a system for tracking movement of gaming chips and/or for performing other valuable functions. The system may be fully automated and operable to automatically monitor and record selected gaming chip transactions at the gaming table. In one embodiment, the system may employ use of gaming chips having transponders embedded therein. Such gaming chips may be electronically identifiable and/or carry electronically ascertainable information about the gaming chip. The system may further have ongoing and/or "on-command" capabilities to provide an instantaneous or real-time inventory of all (or selected) gaming chips at the gaming table such as, for example, gaming chips in the possession of a particular player, gaming chips in the possession of the dealer, gaming chips located within a specified region (or regions) of the gaming table, etc. The system may also be capable of reporting the total value of an identified selection of gaming chips.

In at least one embodiment, information tracked by the gaming table system may then reported or communicated to various remote servers and/or systems, such as, for example, a player tracking system. According to a specific embodiment, a player tracking system may be used to store various information relating to casino patrons or players. Such information (herein referred to as player tracking information) may include player rating information, which, for example, generally refers to information used by a casino to rate a given player according to various criteria such as, for example, criteria which may be used to determine a player's theoretical or comp value to a casino.

Additionally, in at least one embodiment, a player tracking session may be used to collect various types of information relating to a player's preferences, activities, game play, location, etc. Such information may also include player rating information generated during one or more player rating sessions. Thus, in at least one embodiment, a player tracking session may include the generation and/or tracking of player rating information for a given player.

Figure 7A:
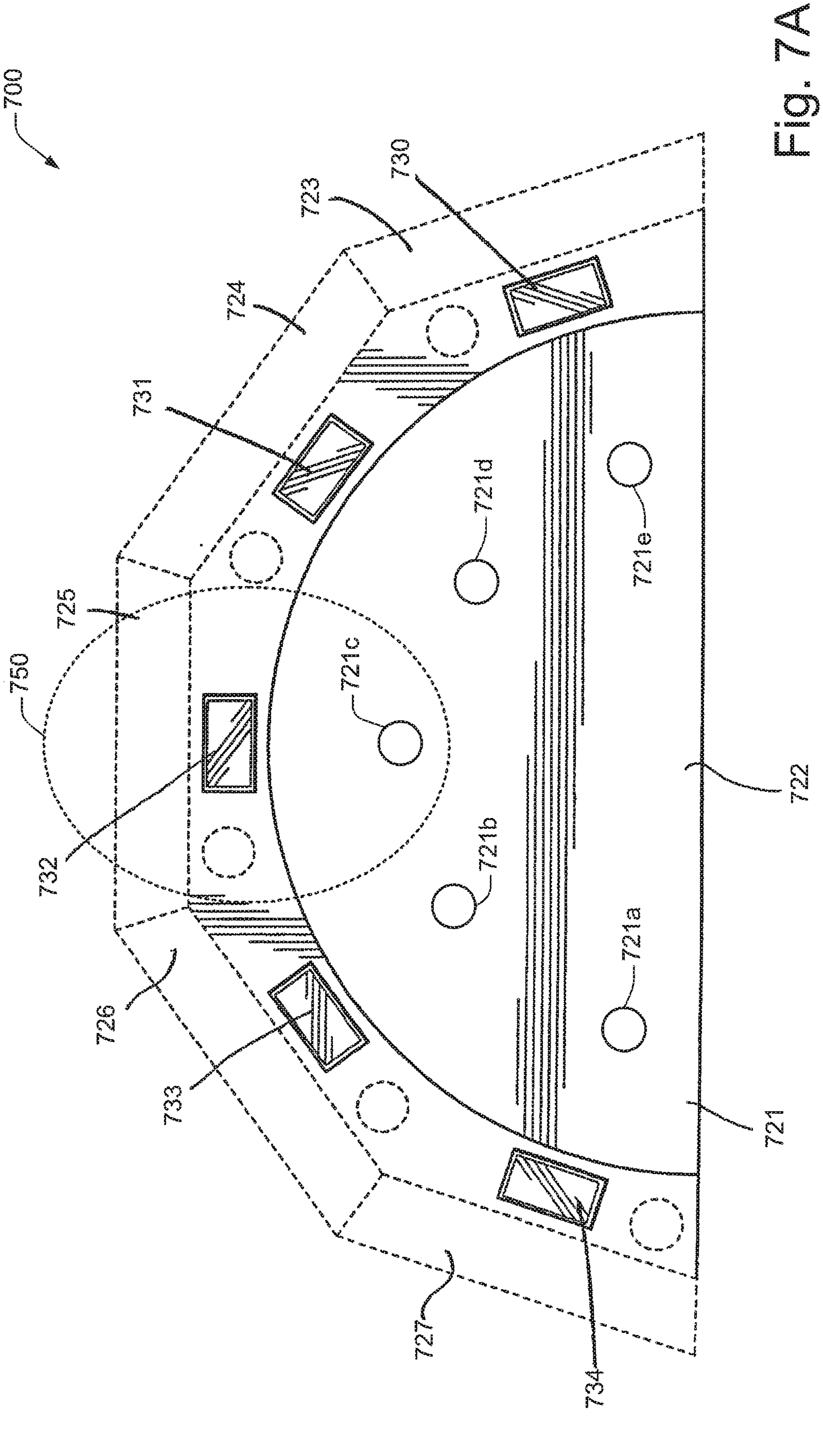
FIGS. 7A-7B show different example embodiments of gaming table systems.

FIG. 7A shows an example of a gaming table system 700 in accordance with a different embodiment. As illustrated in the embodiment of FIG. 7A, gaming table system 700 includes a conventionally shaped gaming table 21 for play of one or more type of table games which, for example, may include non-card based table games and/or card-based table games.

The gaming table 721 of this type is generally located in a casino or the like, and typically includes a dealer station 722, and a plurality of player stations 723-727, surrounding the dealer station. At the player stations, the players sit or stand during game play, while at the dealer station, the card dealer almost always stands. The dealer also deals the cards and takes the player's bets, on behalf of the casino, from the one more players who are participating in the table game.

As illustrated in the embodiment of FIG. 7A, at least one interactive display terminal 30 is included at the gaming table 721. For example, in this particular example a respective display terminal 730-734 dedicated to each player station 723-727 at gaming table 721. According to specific embodiments, each of these interactive display terminals 730-734 may be operable to display informational content relating to advertising, player tracking information, news, etc. In one embodiment, a display terminal may be operable to facilitate player access to his or her accounts via entry of personal identification numbers into a touch screen on the display.

Additionally, in at least one embodiment, each of these interactive display terminals 730-734 may be operable to allow players to perform various other activities such as for example, one or more of the following (or combinations thereof):

perform searches for available side wagering opportunities;

place one or more side wagers (e.g., on gaming activities associated with other players/gaming machines);

monitor game play activities (and/or other activities) relating to placed side wagers;

etc.

In at least one embodiment, the display terminals may be integrated with a backend side wager management system which, for example, may be operable to manage and store various types of information including, for example, side wager information.

In a specific embodiment, a media reader at gaming table system 700 may be operable to automatically detect wireless signals (e.g., 802.11 (WiFi), 802.15 (including Bluetooth™), 802.16 (WiMax), 802.22, Cellular standards such as CDMA, CDMA2000, WCDMA, Radio Frequency (e.g., RFID), Infrared, Near Field Magnetics, etc.) from one or more wireless devices (such as, for example, an RFID-enabled player tracking card) which, for example, are in the possession of players at the gaming table. Further, the media reader may be operable to utilize the detected RFID signals to determine the identity of individual players associated with each of the different player tracking cards. The media reader may also be operable to utilize the detected RFID signals to access additional information (e.g., player tracking information) from remote servers (e.g., player tracking server). In at least one embodiment, the display terminals and/or media readers may be operated in association with player tracking networks such as those shown and disclosed in U.S. Pat. Nos. 5,665,961 and 6,319,125, each of which is incorporated herein by reference in its entirety for all purposes.

According to various embodiments, the gaming table system 700 may be used to allow a player at an associated player station (e.g., rather than the dealer or pit boss) to log in and out at one of player stations 723-727. In a specific embodiment, the display terminal associated with a player's station may also be operable to function as the player's own personal player tracking kiosk right at the gaming table.

Figure 7B:
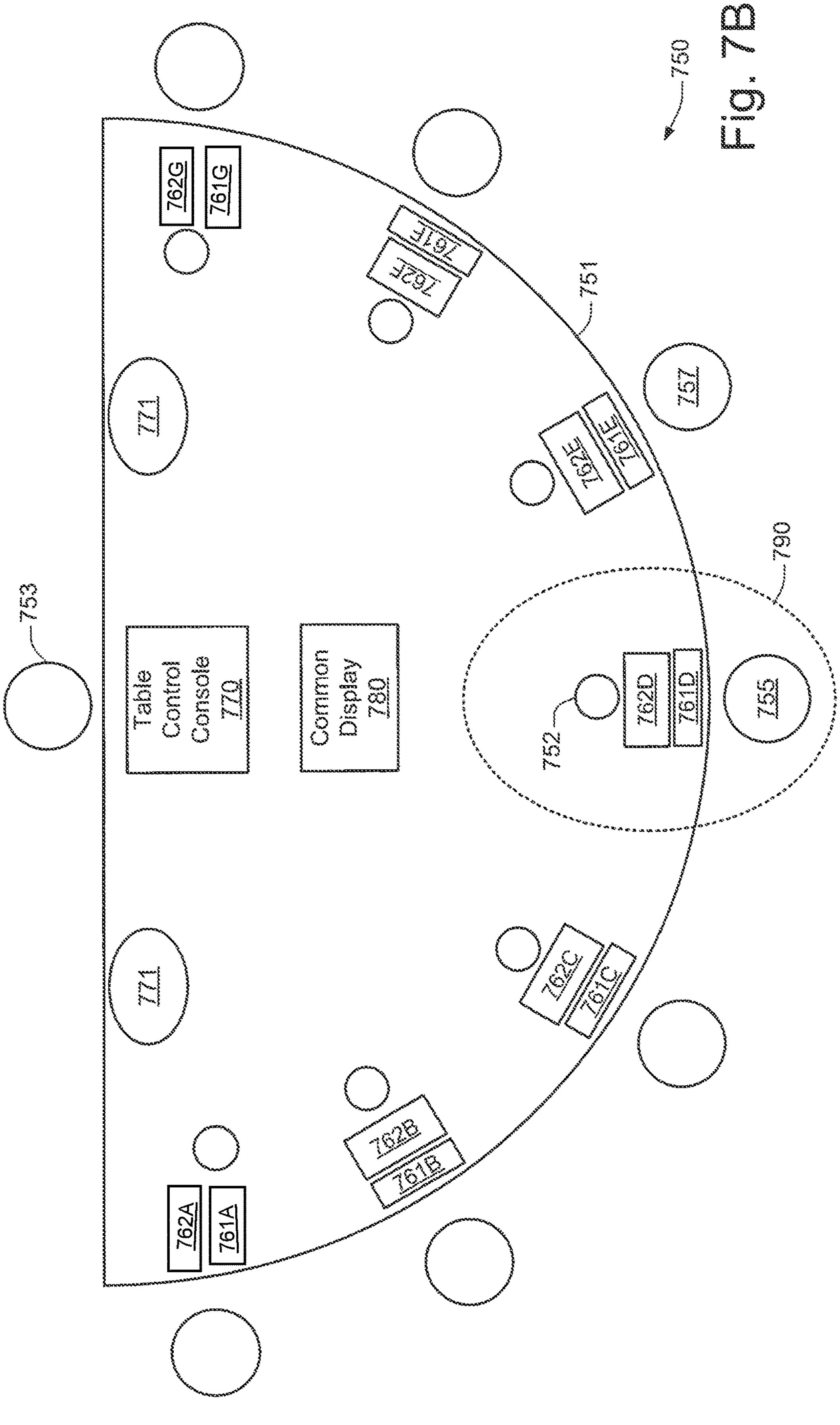

FIG. 7B shows an alternate example of a specific embodiment of an intelligent gaming table system 750. As illustrated in the example of FIG. 7B, a casino gaming table environment 750 is displayed which includes intelligent gaming table 751, dealer 753, and players (e.g., 755, 757). In this particular embodiment, the intelligent gaming table 751 includes a plurality of electronic displays (e.g., 762A-G), and may also include a plurality of player input interfaces (e.g., 761A-G). In one embodiment, the plurality of electronic displays may be implemented as separate physical displays which have been mounted into (or onto) the body of a conventional-type casino gaming table. In an alternate embodiment, the entire top surface (or selected portions thereof) of the intelligent gaming table may be implemented as a continuous display, and the electronic displays (e.g., 762A-G) implemented as specific display regions within the continuous display.

According to specific embodiments, the intelligent gaming table 751 can be of a variety of common constructions. For example, table 751 may include a table support trestle having legs which contact an underlying floor to support the intelligent gaming table thereon. The intelligent gaming table may have a table top and perimeter pad which extends fully about a semicircular portion of the table periphery. The straight, back portion of the periphery is used by the dealer 753 and can be partly or wholly padded as may vary with the particular table chosen.

A playing surface is provided upon the upwardly facing surface of table top upon which participants of the card game play. A plurality of players (e.g., 755) sit or stand along the semicircular portion and play a desired card game, such as the popular casino card game of blackjack. Other card games are alternatively possible, although the system described herein is specifically adapted for playing casino blackjack.

Although not shown in the example of FIG. 7B, the intelligent gaming table 751 may also include a gaming chip rack which allows the dealer to conveniently store gaming chips used by the dealer in playing the game. A money drop slot may be further included to allow the dealer to easily deposit paper money bills thereinto when players purchase gaming chips.

Table 751 can support a system, or form a part of a system for playing card games which is constructed according to specific embodiments of the present invention.

As illustrated in the example of FIG. 7B, the intelligent gaming table may include a table control console 770 for use by the dealer and/or other casino employees. In one implementation, the table control console may be used to facilitate and execute game play operations, table configuration operations, player tracking operations, maintenance and inspection operations, etc.

According to specific embodiments, the intelligent gaming table may include a plurality of electronic displays (e.g., 762A-G), herein termed player displays, which are capable of displaying changeable display content which, for example, may include text, images, video, etc. In one embodiment, the displayed content may include graphical representations of playing cards (e.g., virtual playing cards) and/or other information used to convey game play information, game status information, wager information, etc.

In one embodiment, the plurality of electronic displays may be implemented as separate physical displays which have been mounted into (or onto) the body of a conventional-type casino gaming table. In an alternate embodiment, the entire top surface (or selected portions thereof) of the intelligent gaming table may be implemented as a continuous display, and the electronic displays (e.g., 762A-G) implemented as specific display regions within the continuous display.

In at least one embodiment, displays 762A-G may be configured or designed as interactive display terminals which may be operable to allow players to perform various other activities such as for example, one or more of the following (or combinations thereof):

perform searches for available side wagering opportunities;

place one or more side wagers (e.g., on gaming activities associated with other players/gaming machines);

monitor game play activities (and/or other activities) relating to placed side wagers;

etc.

According to a specific embodiment, the display units may be supported upon the upper or playing surface of the intelligent gaming table. This allows the system to be easily installed upon a variety of differing intelligent gaming tables without extensive modifications being performed.

As illustrated in the example of FIG. 7B, the intelligent gaming table may optionally include one or more speakers 771 which, for example, may be used to provide various types of audio information such as, for example: game related information (e.g., instructions to players and/or dealer, sound effects, etc.), casino related announcements, gaming table status information, music, attracts, promotions, bonus information, communication information (e.g., for speakerphone or two-way radio communications), etc.

Additionally, as shown, for example, in FIG. 7B, the intelligent gaming table may include one or more common displays (e.g., Common Display 760) which may present information for the exclusive use of the dealer and/or other information to be viewed by the dealer, players, spectators, and/or other persons. Various types of information which may be displayed at the common display 760 include, for example: dealer cards, ante information, common or shared player cards, individual player cards, wager information, etc. In one embodiment, the common display 760 may be used to:

reveal cards of selected players (when appropriate);

verify cards dealt to selected players;

display the dealer's cards;

display game play instructions;

display table configuration information;

display player tracking related information;

display player tracking session status information;

display error messages;

display wagering information;

indicate which of the players is currently playing (e.g., show active player);

display active players' actions (e.g., Hit, Hold, Double Down);

display promotional information;

identify players waiting for an opening at the table (e.g., next up);

display community cards;

display bonus game;

display progressive jackpots;

display multimedia information from external sources;

display information relating to side wagers placed by players at the gaming table;

display information relating available side wager opportunities;

etc.

Player displays 762 may be arranged adjacent to each player seating position. For example, player display 762D may be adapted for use by player 755, and player display 762E may be adapted for use by player 757, etc.

In at least one embodiment, the intelligent gaming table displays may include touchscreen functionality for facilitating user interaction. For example, the player displays 762 may include a touchscreen and/or other input mechanisms for allowing the player to provide input relating to game play, preferences, wagering, player tracking activity, etc.

In at least one implementation, the intelligent gaming table may include one or more player input interfaces (e.g., 761A-G) which, in addition to facilitating player input, may also be used for a variety of other purposes such as, for example, controlling the display of a player's cards; preventing accidental exposure of player cards; providing additional security features with respect to information displayed on the player's display; etc.

As illustrated in the example of FIG. 7B, the intelligent gaming table 751 may include player wagering zones or gaming chip placement zones (e.g., 752). In one embodiment, each player wagering zone may include a gaming chip detection component which may be adapted to automatically detect the presence and/or monetary amount of gaming chips which have been placed within a player's wagering zone. In at least one implementation, a player must position a gaming chip within their respective wagering zone to be considered a participant in the game being played.

Another aspect described herein relates to various techniques for facilitating player side wagering activities to be performed via a mobile or handheld display device.

In at least one implementation, a respective personal player device (herein referred to as a PPD) may be provided to each player at the intelligent gaming table for facilitating various activities such as, for example: game play activities, player tracking activities, side wagering activities, and/or other activities conducted at the intelligent gaming table or elsewhere. Associations may be made between PPDs and players (and/or player positions at the intelligent gaming table) such that each PPD may be uniquely associated with a respective player (and/or player position) at the intelligent gaming table.

It will be appreciated that, in other embodiments, various combinations of PPDs and player displays may be used. For example, in some embodiments of the intelligent gaming tables of the present invention, all playing card related activity may be implemented using PPDs. In at least some of these embodiments, the player displays (e.g., 762A-G) may be used to display desired information to the player (e.g., other than the player's cards) such as, player tracking information, player tracking session status information; wagering information, game rules, side wagering activities/information, other game play activities/information (e.g., keno, sports book wagering, etc.), etc. In other embodiments of the intelligent gaming table, the player displays (e.g., 762A-G) may be omitted.

In at least one implementation, a dealer at a intelligent gaming table may have access to multiple PPDs which have not been yet been activated or registered to a particular player. When a new player desires to participate in the game being played at the intelligent gaming table, the dealer may select a PPD for activation, activate the PPD for game play and/or player tracking functionality, and hand the activated PPD over to the new player.

A variety of different security-related features may be implemented at the intelligent gaming table in order, for example, to address various issues such as player cheating, PPD tampering, unwanted or accidental viewing of player's cards, unauthorized use of player tracking or account data, etc.

For example, in at least one implementation, a PPD must first be activated and/or undergo a registration process before being allowed to be used for game play at the intelligent gaming table.

In one embodiment, a player may possess his or her own PPD which has been registered for that player's exclusive use. For example, the PPD may be registered and linked to the player's player tracking account. In at least one implementation, the player may carry his PPD with him and use his PPD for game play at any authorized intelligent gaming table. In one implementation, before a player-owned PPD is enabled for use at the intelligent gaming table, a security check may be performed to authenticate and/or validate the PPD before authorizing it for use at the intelligent gaming table, in order to help ensure that the PPD has not been modified or tampered.

Figure 8A:
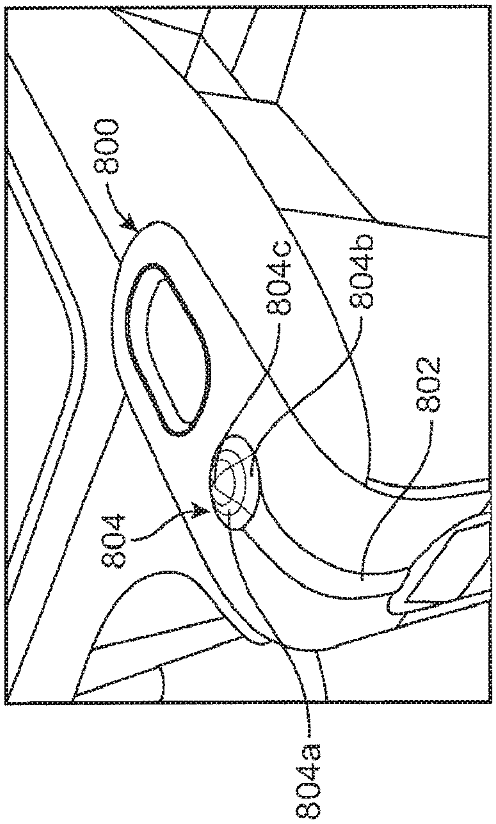
FIGS. 8A-D illustrate various examples of alternative candle embodiments.

FIGS. 8A-D illustrate various example embodiments of alternative candle/illumination components which, for example, may provide various features, benefits and/or advantages such as, for example, one or more of the following (or combinations thereof):

FIG. 8A—Organic Sprout 804 with multiple different levels of color/illumination 804*a*, 804*b*, 804*c*

Figure 8B:
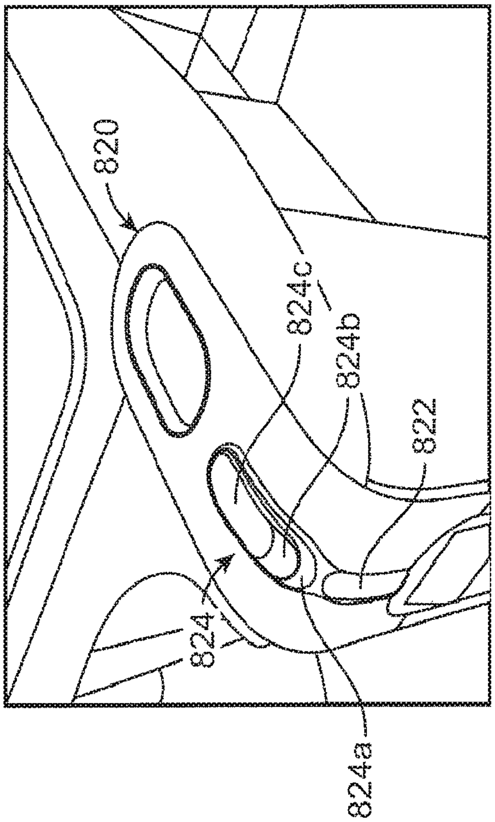

FIG. 8B—Flowing Obrounds 824 with multiple different layers of color/illumination 824*a*, 824*b*, 824*c*

Figure 8C:
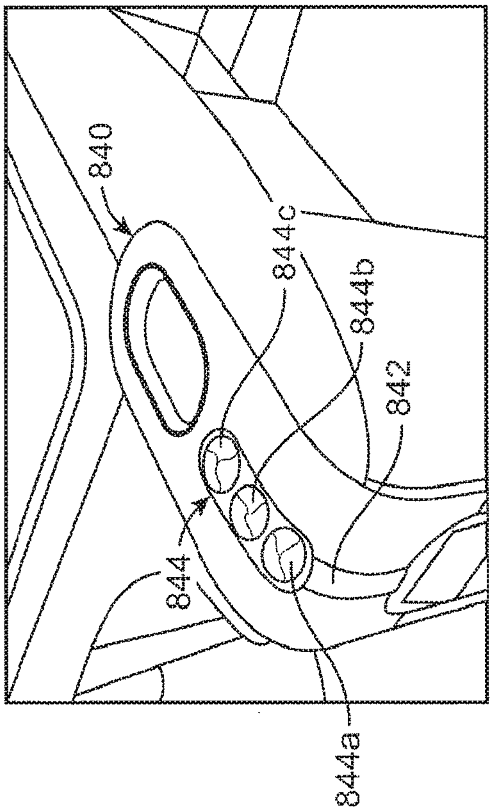

FIG. 8C—Dedicated Stages 844 with multiple different zones of color/illumination 844*a*, 844*b*, 844*c*

Figure 8D:
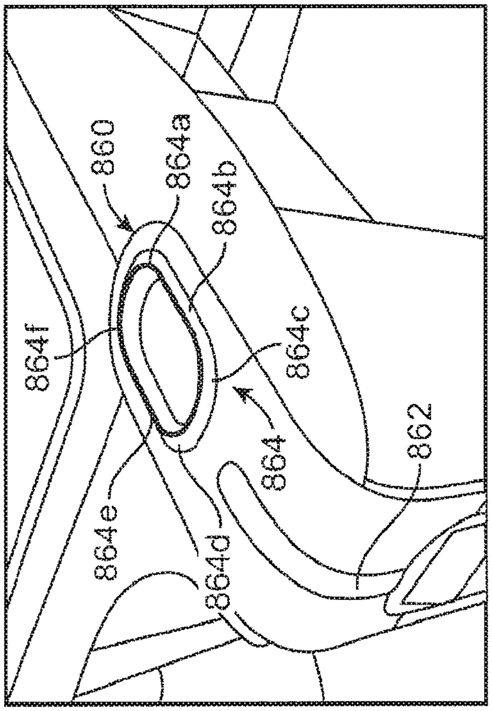
Figure 9A:
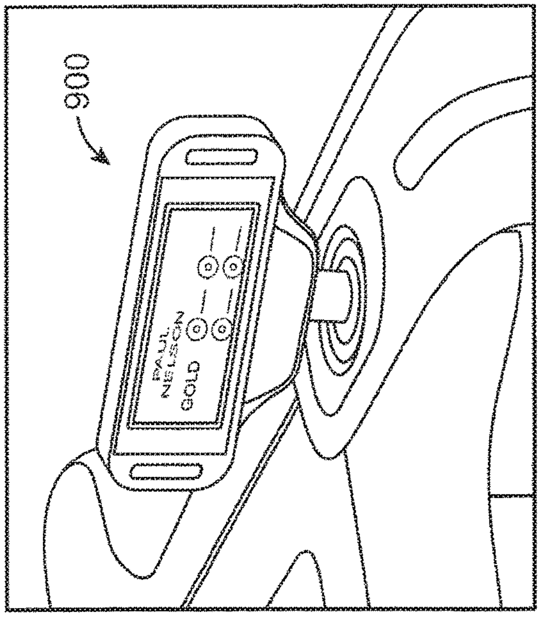
FIGS. 9A-D illustrate various example embodiments of individual player station player tracking and/or audio/visual components.
Figure 9B:
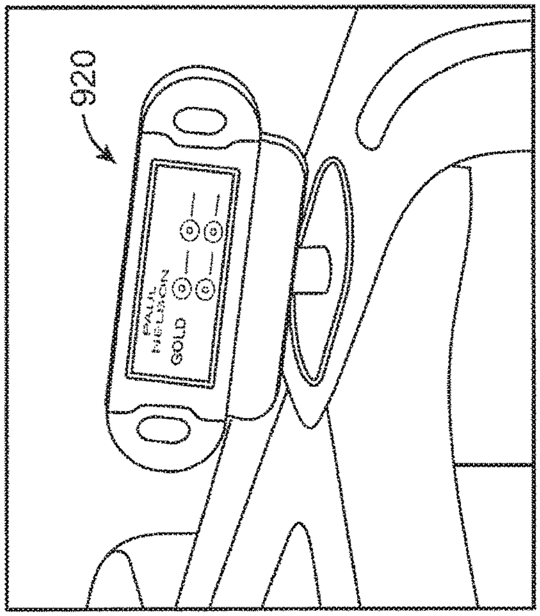
Figure 9C:
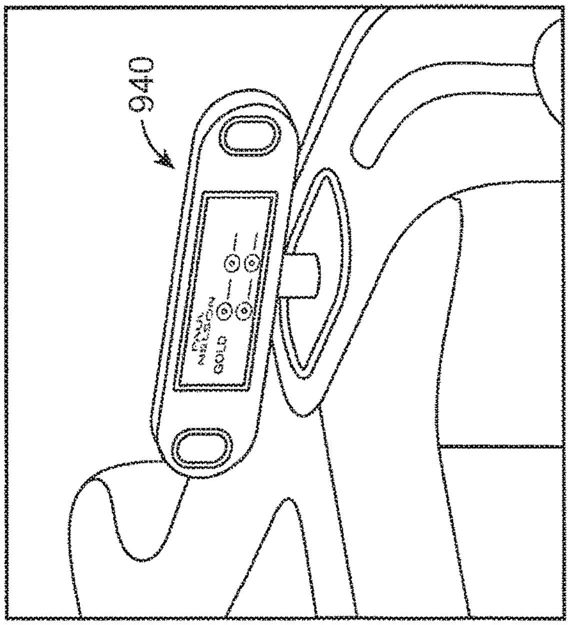
Figure 9D:
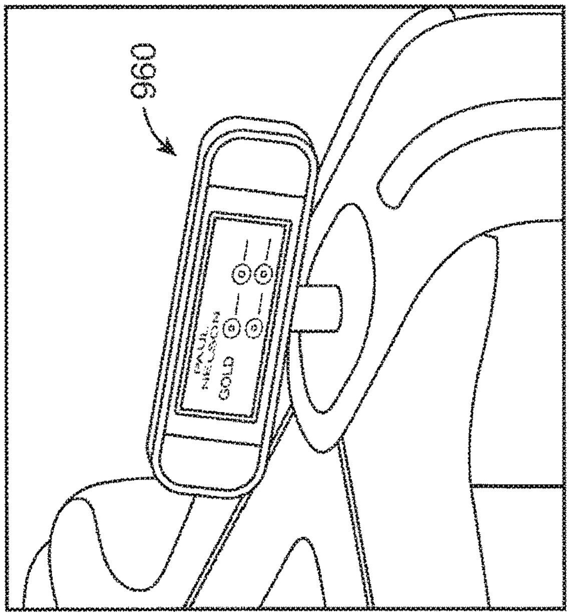

FIG. 8D—Cup Holder Surround 864 with multiple different regions of color/illumination 864*a-f*

It will be appreciated that the various embodiments of the candle/illumination components described herein provide improved techniques for achieving improved 360 degree visibility, while also maintaining an eco-techno aesthetic of the intelligent multi-player electronic gaming system.

FIGS. 9A-D illustrate various example embodiments of different player station player tracking and/or audio/visual components. As illustrated in the example embodiments of FIGS. 9A-D, one or more of the following features/advantages/benefits may be provided:

Viewing angle range (e.g., 0-15 deg) for privacy concerns

Speaker locations—below vs side. Impacts height or length.

Speaker emphasis—visual surface area & detailing.

Front lens cover over existing LCD bezel assy. More integrated to unit.

Cup holder cover.

Vendor logo placement.

Card Reader integration to "funds center" on leg.

Figure 10A:
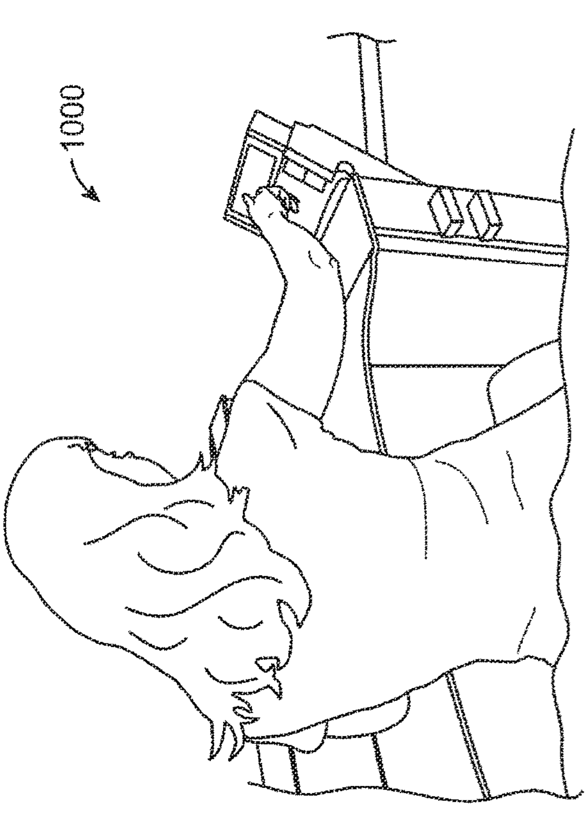
FIGS. 10A-D illustrate example embodiments relating to integrated Player Tracking and/or individual player station audio/visual components.
Figure 10B:
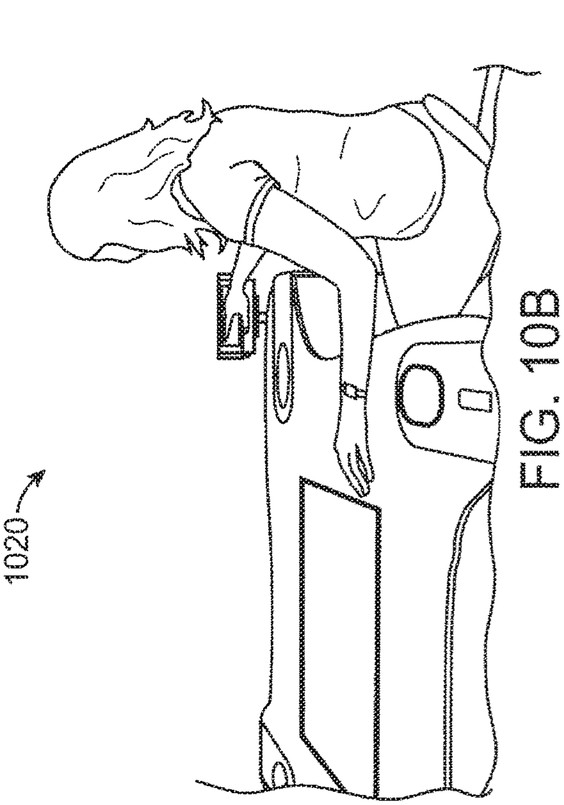
Figure 10C:
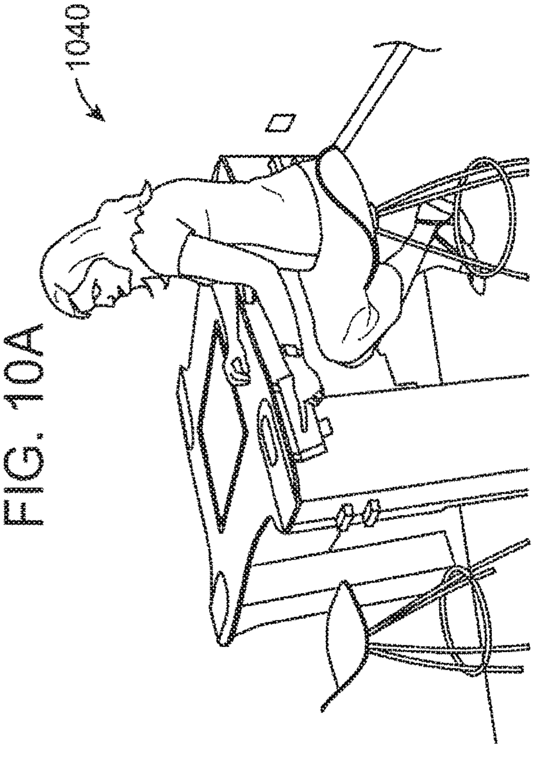
Figure 10D:
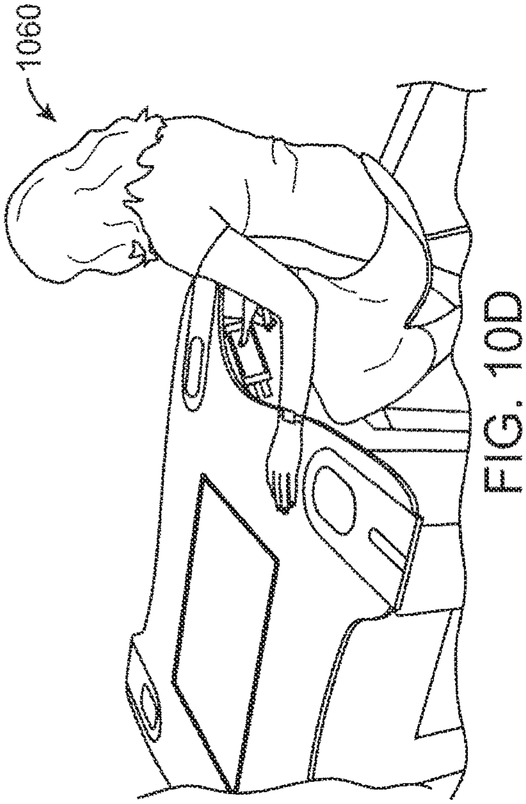

FIGS. 10A-D illustrate example embodiments relating to integrated Player Tracking and/or individual player station audio/visual components. For example, FIG. 10A shows a first example embodiment illustrating a secondary player station display via support arm/angle. FIG. 10B shows another example embodiment illustrating a secondary player station display via support arm/"T." FIG. 10C shows a first example embodiment illustrating a secondary player station display via integrated/left. FIG. 10D shows another example embodiment illustrating a secondary player station display via integrated/right.

Figure 11:
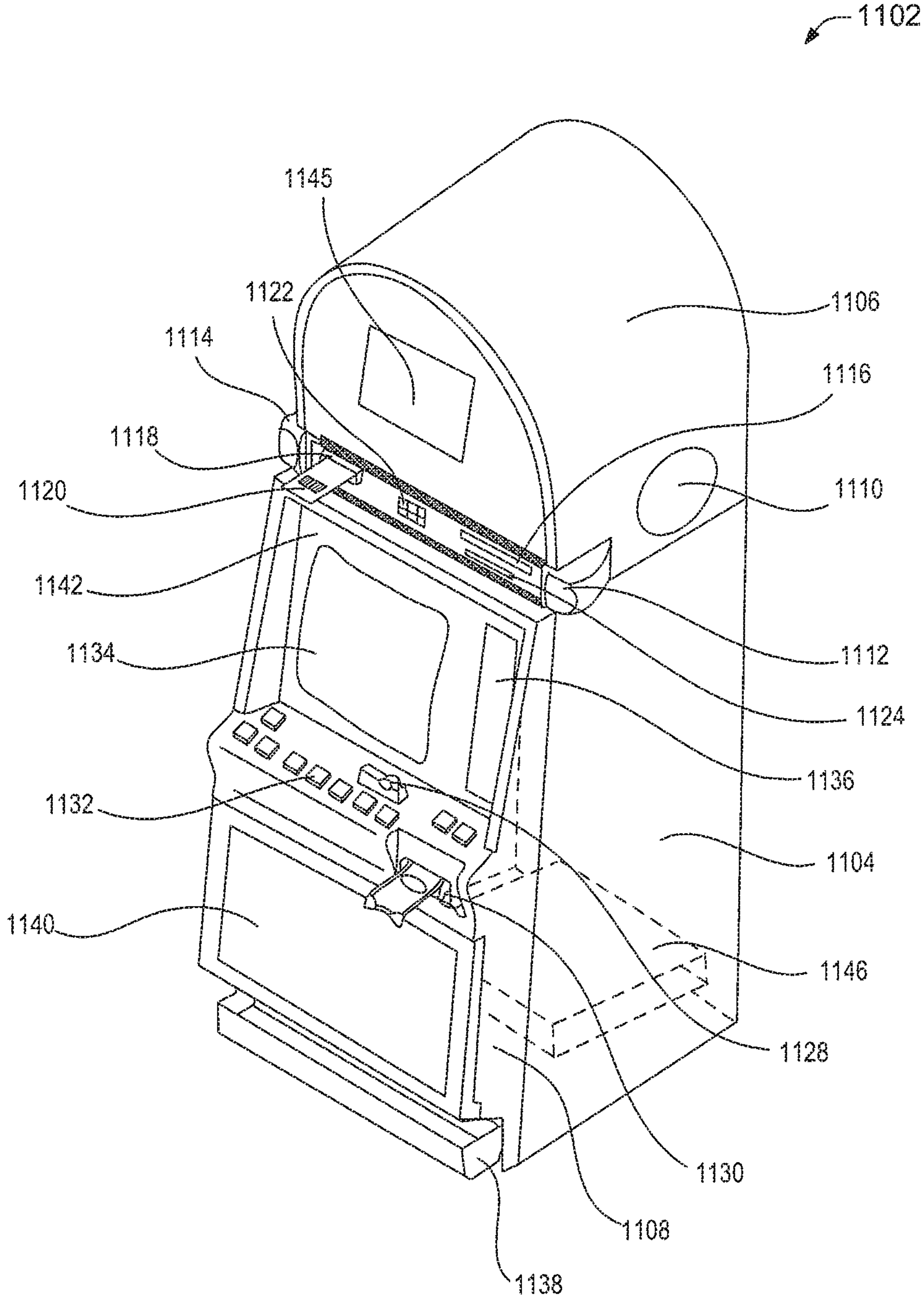
FIG. 11 shows a perspective view of an example gaming machine in accordance with a specific embodiment.

FIG. 11 shows a perspective view of an example gaming machine 1102 in accordance with a specific embodiment. As illustrated in the example of FIG. 11, device 1102 includes a main cabinet or housing 1104, which generally surrounds the device interior and is viewable by users. The main cabinet includes an access door 1108, which opens to provide access to the interior of the device.

In particular embodiments, the gaming machine may be controlled by software executed by a master gaming controller 1146 in conjunction with software executed by a remote logic device (e.g., a remote host, a central server or a central controller) in communication with the gaming machine. The master gaming controller may execute externally-controlled interface (ECI) processes which, for example, may enable content generated and managed on the remote host to be output on the gaming machine. The gaming machine may receive and send events to the remote host that may affect the content output by one or more ECI processes as well as enable an ECI process to be initiated on the gaming machine.

In one embodiment, attached to the main door is at least one payment acceptor 1128 and a bill validator 1130, and a coin tray 1138. In one embodiment, the payment acceptor may include a coin slot and a payment, note or bill acceptor, where the player inserts money, coins or tokens. The player can place coins in the coin slot or paper money, a ticket or voucher into the payment, note or bill acceptor. In other embodiments, devices such as readers or validators for credit cards, debit cards or credit slips may accept payment. In one embodiment, a player may insert an identification card into a card reader of the gaming machine. In one embodiment, the identification card is a smart card having a programmed microchip or a magnetic strip coded with a player's identification, credit totals (or related data) and other relevant information. In another embodiment, a player may carry a portable device, such as a cell phone, a radio frequency identification tag or any other suitable wireless device, which communicates a player's identification, credit totals (or related data) and other relevant information to the gaming machine. In one embodiment, money may be transferred to a gaming machine through electronic funds transfer. When a player funds the gaming machine, the master gaming controller 1146 or another logic device coupled to the gaming machine determines the amount of funds entered and displays the corresponding amount on the credit or other suitable display as described above.

In one embodiment attached to the main door are a plurality of player-input switches or buttons 1132. The input switches can include any suitable devices which enables the player to produce an input signal which is received by the processor. In one embodiment, after appropriate funding of the gaming machine, the input switch is a game activation device, such as a pull arm or a play button which is used by the player to start any primary game or sequence of events in the gaming machine. The play button can be any suitable play activator such as a bet one button, a max bet button or a repeat the bet button. In one embodiment, upon appropriate funding, the gaming machine may begin the game play automatically. In another embodiment, upon the player engaging one of the play buttons, the gaming machine may automatically activate game play.

In one embodiment, one input switch is a bet one button. The player places a bet by pushing the bet one button. The player can increase the bet by one credit each time the player pushes the bet one button. When the player pushes the bet one button, the number of credits shown in the credit display preferably decreases by one, and the number of credits shown in the bet display preferably increases by one. In another embodiment, one input switch is a bet max button (not shown), which enables the player to bet the maximum wager permitted for a game of the gaming machine.

In one embodiment, one input switch is a cash-out button. The player may push the cash-out button and cash out to receive a cash payment or other suitable form of payment corresponding to the number of remaining credits. In one embodiment, when the player cashes out, the player may receive the coins or tokens in a coin payout tray. In one embodiment, when the player cashes out, the player may receive other payout mechanisms such as tickets or credit slips redeemable by a cashier (or other suitable redemption system) or funding to the player's electronically recordable identification card. Details of ticketing or voucher system that may be utilized with at least one embodiment described herein are described in co-pending U.S. patent application Ser. No. 10/406,911, filed Apr. 2, 2003, by Rowe, et al., and entitled, "Cashless Transaction Clearinghouse," which is incorporated herein by reference and for all purposes.

In one embodiment, one input switch is a touch-screen coupled with a touch-screen controller, or some other touch-sensitive display overlay to enable for player interaction with the images on the display. The touch-screen and the touch-screen controller may be connected to a video controller. A player may make decisions and input signals into the gaming machine by touching the touch-screen at the appropriate places. One such input switch is a touch-screen button panel.

In one embodiment, the gaming machine may further include a plurality of communication ports for enabling communication of the gaming machine processor with external peripherals, such as external video sources, expansion buses, game or other displays, an SCSI port or a key pad.

As seen in FIG. 11, viewable through the main door is a video display monitor 1134 and an information panel 1136. The display monitor 1134 will typically be a cathode ray tube, high resolution flat-panel LCD, SED based-display, plasma display, a television display, a display based on light emitting diodes (LED), a display based on a plurality of organic light-emitting diodes (OLEDs), a display based on polymer light-emitting diodes (PLEDs), a display including a projected and/or reflected image or any other suitable electronic device or display. The information panel 1136 or belly-glass 1140 may be a static back-lit, silk screened glass panel with lettering to indicate general game information including, for example, a game denomination (e.g. $0.25 or $1) or a dynamic display, such as an LCD, an OLED or E-INK display. In another embodiment, at least one display device may be a mobile display device, such as a PDA or tablet PC, that enables play of at least a portion of the primary or secondary game at a location remote from the gaming machine. The display devices may be of any suitable size and configuration, such as a square, a rectangle or an elongated rectangle.

The display devices of the gaming machine are configured to display at least one and preferably a plurality of game or other suitable images, symbols and indicia such as any visual representation or exhibition of the movement of objects such as mechanical, virtual or video reels and wheels, dynamic lighting, video images, images of people, characters, places, things and faces of cards, and the like. In one alternative embodiment, the symbols, images and indicia displayed on or of the display device may be in mechanical form. That is, the display device may include any electromechanical device, such as one or more mechanical objects, such as one or more rotatable wheels, reels or dice, configured to display at least one or a plurality of game or other suitable images, symbols or indicia. In another embodiment, the display device may include an electromechanical device adjacent to a video display, such as a video display positioned in front of a mechanical reel. In another embodiment, the display device may include dual layered video displays which co-act to generate one or more images.

The bill validator 1130, player-input switches 1132, video display monitor 1134, and information panel are gaming machines that may be used to play a game on the game device 1102. Also, these devices may be utilized as part of an ECI provided on the gaming machine. According to a specific embodiment, the devices may be controlled by code executed by a master gaming controller 1146 housed inside the main cabinet 1104 of the device 1102. The master gaming controller may include one or more processors including general purpose and specialized processors, such as graphics cards, and one or more memory devices including volatile and non-volatile memory. The master gaming controller 1146 may periodically configure and/or authenticate the code executed on the gaming machine.

In one embodiment, the gaming machine may include a sound generating device coupled to one or more sounds cards. In one embodiment, the sound generating device includes at least one and preferably a plurality of speakers or other sound generating hardware and/or software for generating sounds, such as playing music for the primary and/or secondary game or for other modes of the gaming machine, such as an attract mode. In one embodiment, the gaming machine provides dynamic sounds coupled with attractive multimedia images displayed on one or more of the display devices to provide an audio-visual representation or to otherwise display full-motion video with sound to attract players to the gaming machine. During idle periods, the gaming machine may display a sequence of audio and/or visual attraction messages to attract potential players to the gaming machine. The videos may also be customized for or to provide any appropriate information.

In one embodiment, the gaming machine may include a sensor, such as a camera that is selectively positioned to acquire an image of a player actively using the gaming machine and/or the surrounding area of the gaming machine. In one embodiment, the camera may be configured to selectively acquire still or moving (e.g., video) images and may be configured to acquire the images in either an analog, digital or other suitable format. The display devices may be configured to display the image acquired by the camera as well as display the visible manifestation of the game in split screen or picture-in-picture fashion. For example, the camera may acquire an image of the player and the processor may incorporate that image into the primary and/or secondary game as a game image, symbol or indicia.

In another embodiment, the gaming machines on the gaming machine may be controlled by code executed by the master gaming controller 1146 (or another logic device coupled to or in communication with the gaming machine, such as a player tracking controller) in conjunction with code executed by a remote logic device in communication with the master gaming controller 1146. In at least one embodiment, the master gaming controller 1146 may execute ECI processes that enable content generated and managed on a remote host to be output on the gaming machine. The gaming machine may receive and send events to a remote host that may affect the content output on an instantiation of a particular ECI. The master gaming controller 1146 may be configured to limit the resources that can be utilized by the ECI processes executing on the gaming machine at any given time and may constantly monitor resources utilized by the ECI processes to ensure that gaming experience on the gaming machine is optimal.

Games Played

Many different types of games, including mechanical slot games, video slot games, video poker, video black jack, video pachinko and lottery, may be provided with gaming machines of this present invention. In particular, the gaming machine 1102 may be operable to provide a play of many different games of chance. The games may be differentiated according to themes, sounds, graphics, type of game (e.g., slot game vs. card game), denomination, number of paylines, maximum jackpot, progressive or non-progressive, bonus games, etc.

In one embodiment, the gaming machine 1102 may be operable to enable a player to select a game of chance to play from a plurality of different games available on the gaming machine. For example, the gaming machine may provide a menu with a list of the different games that are available for play on the gaming machine and a player may be able to select from the list a first game of chance that they wish to play. In one such embodiment, a memory device of the remote host stores different game programs and instructions, executable by a gaming machine processor, to control the gaming machine. Each executable game program represents a different game or type of game, which may be played on one or more of the gaming machines in the gaming system. Such different games may include the same or substantially the same game play with different pay tables. In different embodiments, the executable game program is for a primary game, a secondary game or both. In another embodiment, the game program may be executable as a secondary game to be played simultaneous with the play of a primary game (which may be downloaded to or fixed on the gaming machine) or vice versa.

In one such embodiment, each gaming machine includes at least one or more display devices and/or one or more input switches for interaction with a player. A local processor, such as the above-described gaming machine processor or a processor of a local server, is operable with the display device(s) and/or the input switch(s) of one or more of the gaming machines. In operation, the remote host is operable to communicate one or more of the stored game programs to at least one local gaming machine processor. In different embodiments, the stored game programs are communicated or delivered by embedding the communicated game program in a device or a component (e.g., a microchip to be inserted in a gaming machine), writing the game program on a disc or other media, downloading or streaming the game program over a dedicated data network, internet or a telephone line. In different embodiments, the stored game programs are downloaded in response to a player inserting a player tracking card, a player selecting a specific game program, a player inserting a designated wager amount, the remote host communicating data to the gaming machine regarding an upcoming tournament or promotion or any other suitable trigger. After the stored game programs are communicated from the remote host, the local gaming machine processor executes the communicated program to facilitate play of the communicated program by a player through the display device(s) and/or input switch(s) of the gaming machine. That is, when a game program is communicated to a local gaming machine processor, the local gaming machine processor changes the game or type of game played at the gaming machine.

In particular embodiments, the master gaming controller 1146 may provide information to a remote host providing content to an ECI on the gaming machine 1102 that enables the remote host to select graphical and audio themes for the ECI content that matches the theme of the game graphics and game sounds currently played on the gaming machine 1102.

In one embodiment, the various games available for play on the gaming machine 1102 may be stored as game software on a mass storage device in the gaming machine. In one such embodiment, the memory device of the gaming machine stores program codes and instructions, executable by the gaming machine processor, to control the games available for play on the gaming machine. The memory device also stores other data such as image data, event data, player input data, random or pseudo-random number generators, pay-table data or information and applicable game rules that relate to the play of the gaming machine. In another embodiment, the games available for play on the gaming machine may be generated on a remote gaming machine but then displayed on the gaming machine.

In one embodiment, the gaming machine 1102 may execute game software, such as but not limited to video streaming software that enables the game to be displayed on the gaming machine. When a game is stored on the gaming machine 1102, it may be loaded from the mass storage device into a RAM for execution. In some cases, after a selection of a game, the game software that enables the selected game to be generated may be downloaded from a remote gaming machine, such as another gaming machine.

As illustrated in the example of FIG. 11, the gaming machine 1102 includes a top box 1106, which sits on top of the main cabinet 1104. The top box 1106 houses a number of devices, which may be used to add features to a game being played on the gaming machine 1102, including speakers 1110, 1112, 1114, a ticket printer 1118 which prints bar-coded tickets 1120, a key pad 1122 for entering player tracking information, a display 1116 (e.g., a video LCD display) for displaying player tracking information, a card reader 1124 for entering a magnetic striped card containing player tracking information, and a video display screen 115. The ticket printer 1118 may be used to print tickets for a cashless ticketing system. Further, the top box 1106 may house different or additional devices not illustrated in FIG. 11. For example, the top box may include a bonus wheel or a back-lit silk screened panel which may be used to add bonus features to the game being played on the gaming machine. As another example, the top box may include a display for a progressive jackpot offered on the gaming machine. During a game, these devices are controlled and powered, in part, by circuitry (e.g. a master gaming controller 1146) housed within the main cabinet 1104 of the device 1102.

It will be appreciated that gaming machine 1102 is but one example from a wide range of gaming machine designs on which at least one embodiment described herein may be implemented. For example, not all suitable gaming machines have top boxes or player tracking features. Further, some gaming machines have only a single game display—mechanical or video, while others may have multiple displays.

Networks

In various embodiments, the remote gaming machine may be connected to the host computer via a network of some type such as a local area network, a wide area network, an intranet or the Internet. In one such embodiment, a plurality of the gaming machines may be capable of being connected together through a data network. In one embodiment, the data network is a local area network (LAN), in which one or more of the gaming machines are substantially proximate to each other and an on-site remote host as in, for example, a gaming establishment or a portion of a gaming establishment. In another embodiment, the data network is a wide area network (WAN) in which one or more of the gaming machines are in communication with at least one off-site remote host. In this embodiment, the plurality of gaming machines may be located in a different part of the gaming establishment or within a different gaming establishment than the off-site remote host. Thus, the WAN may include an off-site remote host and an off-site gaming machine located within gaming establishments in the same geographic area, such as a city or state. The WAN gaming system may be substantially identical to the LAN gaming system described above, although the number of gaming machines in each system may vary relative to each other.

In another embodiment, the data network is an internet or intranet. In this embodiment, the operation of the gaming machine can be viewed at the gaming machine with at least one internet browser. In this embodiment, operation of the gaming machine and accumulation of credits may be accomplished with only a connection to the central server or controller (the internet/intranet server) through a conventional phone or other data transmission line, digital subscriber line (DSL), T-1 line, coaxial cable, fiber optic cable, or other suitable connection. In this embodiment, players may access an internet game page from any location where an internet connection and computer, or other internet facilitator is available. The expansion in the number of computers and number and speed of internet connections in recent years increases opportunities for players to play from an ever-increasing number of remote sites. It should be appreciated that enhanced bandwidth of digital wireless communications may render such technology suitable for some or all communications, particularly if such communications are encrypted. Higher data transmission speeds may be useful for enhancing the sophistication and response of the display and interaction with the player.

In another embodiment, the remote gaming machine may be a portable gaming machine such as but not limited to a cell phone, a personal digital assistant, and a wireless game player. Images rendered from 3-D gaming environments may be displayed on portable gaming machines that are used to play a game of chance. Further a gaming machine or server may include gaming logic for commanding a remote gaming machine to render an image from a virtual camera in a 3-D gaming environments stored on the remote gaming machine and to display the rendered image on a display located on the remote gaming machine. In addition, various combinations of gaming machines are possible on the gaming machine. For example, some gaming machine only accept cash, cashless vouchers or electronic fund transfers and do not include coin acceptors or coin hoppers. Thus, those of skill in the art will understand that at least one embodiment described herein, as described below, can be deployed on most any gaming machine now available or hereafter developed.

In another embodiment, the gaming machine disclosed herein is operable over a wireless network, such as part of a wireless gaming system. In this embodiment, the gaming machine may be a hand held device, a mobile device or any other suitable wireless device that enables a player to play any suitable game at a variety of different locations. It should be appreciated that a gaming machine as disclosed herein may be a device that has obtained approval from a regulatory gaming commission or a device that has not obtained approval from a regulatory gaming commission.

In at least one embodiment, some wager-based gaming systems may enable functionality relating to other game play concepts/features such as, for example: tournament play with multiple tables; head to head play on and/or between tables; etc. This is in addition to the simple social factor of allowing people to play together on a table, versus playing against each other or against a dealer. Also, it opens the door for traditional types of player input and/or real-time object recognition. For example, players can simply gesture to make something happen, versus pressing a button. For example, in one embodiment, a game of blackjack may be played on an intelligent multi-player electronic gaming system, and a player may be able to split their hand (e.g., of paired 8's) by simply placing their fingers over the virtual cards and spreading their cards out to cause the computer to recognize the split action.

According to different embodiments, a wager-based gaming system may be operable as a stand alone device, and/or it can be operable as a server-based device. It can also plug into multi-player platforms.

In at least one embodiment, some wager-based gaming systems support industry standard software development with WPF (Windows Presentation Foundation), Expressions Blend (for the artists), and Microsoft's XNA, which is used to make PC and XBox games.

It will be appreciated that the various wager-based gaming systems described herein are but some examples from a wide range of wager-based gaming systems designs on which various aspects and/or techniques described herein may be implemented.

For example, not all wager-based gaming systems have electronic displays or player tracking features. Further, some wager-based gaming systems may include a single display, while others may include multiple displays. Other wager-based gaming systems may not include any displays. As another example, a game may be generated on a host computer and may be displayed on a remote terminal or a remote gaming device. The remote gaming device may be connected to the host computer via a network of some type such as a local area network, a wide area network, an intranet or the Internet. The remote gaming device may be a portable gaming device such as but not limited to a cell phone, a personal digital assistant, and a wireless game player. Images rendered from gaming environments may be displayed on portable gaming devices that are used to facilitate game play activities at the wager-based gaming system. Further a wager-based gaming system or server may include gaming logic for commanding a remote gaming device to render an image from a virtual camera in 2-D or 3-D gaming environments stored on the remote gaming device and to display the rendered image on a display located on the remote gaming device. Thus, those of skill in the art will understand that the present invention, as described below, can be deployed on most any wager-based gaming system now available or hereafter developed.

Gaming Device vs. General-Purpose Computer

Some preferred wager-based gaming devices of the present assignee are implemented with special features and/or additional circuitry that differentiates them from general-purpose computers (e.g., desktop PC's and laptops). In at least one embodiment, a wager-based gaming device may be defined to include any type of device, machine, apparatus, and/or system which has been configured or designed for use in conducting wager-based game play activities at the wager-based gaming device. Example of such wager-based gaming device may include, but are not limited to, one or more of the following (or combinations thereof): mechanical gaming machines, electronic gaming machines, slot-type gaming machines, gaming tables, mobile or portable wager-based gaming devices, etc.

Wager-based gaming devices are highly regulated to ensure fairness and, in some cases, wager-based gaming devices are operable to dispense monetary awards of multiple millions of dollars. Therefore, to satisfy security and regulatory requirements in a gaming environment, hardware and software architectures may be implemented in wager-based gaming devices that differ significantly from those of general-purpose computers. A description of wager-based gaming devices relative to general-purpose computing devices and some examples of the additional (or different) components and features found in wager-based gaming devices are described below.

At first glance, one might think that adapting PC technologies to the gaming industry would be a simple proposition because both PCs and wager-based gaming devices employ microprocessors that control a variety of devices. However, because of such reasons as 1) the regulatory requirements that are placed upon wager-based gaming devices, 2) the harsh environment in which wager-based gaming devices operate, 3) security requirements and 4) fault tolerance requirements, adapting PC technologies to a wager-based gaming device can be quite difficult. Further, techniques and methods for solving a problem in the PC industry, such as device compatibility and connectivity issues, might not be adequate in the gaming environment. For instance, a fault or a weakness tolerated in a PC, such as security holes in software or frequent crashes, may not be tolerated in a wager-based gaming device because in a wager-based gaming device these faults can lead to a direct loss of funds from the wager-based gaming device, such as stolen cash or loss of revenue when the wager-based gaming device is not operating properly.

For the purposes of illustration, a few differences between PC systems and wager-based gaming devices/systems will be described. A first difference between wager-based gaming devices and common PC based computers systems is that wager-based gaming devices are designed to be state-based systems. In a state-based system, the system stores and maintains its current state in a non-volatile memory, such that, in the event of a power failure or other malfunction the wager-based gaming device will return to its current state when the power is restored. For instance, if a player was shown an award for a wager-based game (e.g., of chance, skill and/or some combination thereof) and, before the award could be provided to the player the power failed, the wager-based gaming device, upon the restoration of power, would return to the state where the award is indicated. As anyone who has used a PC, knows, PCs are not state devices and a majority of data is usually lost when a malfunction occurs. This requirement affects the software and hardware design on a wager-based gaming device.

A second important difference between wager-based gaming devices and common PC based computer systems is that for regulation purposes, the software on the wager-based gaming device used to generate the wager-based game and operate the wager-based gaming device has been designed to be static and monolithic to prevent cheating by the operator of wager-based gaming device. For instance, one solution that has been employed in the gaming industry to prevent cheating and satisfy regulatory requirements has been to manufacture a wager-based gaming device that can use a proprietary processor running instructions to generate the wager-based game play activities from an EPROM or other form of non-volatile memory. The coding instructions on the EPROM are static (non-changeable) and must be approved by a gaming regulators in a particular jurisdiction and installed in the presence of a person representing the gaming jurisdiction. Any changes to any part of the software required to generate the wager-based game play activities, such as adding a new device driver used by the master gaming controller to operate a device during generation of the wager-based game can require a new EPROM to be burnt, approved by the gaming jurisdiction and reinstalled on the wager-based gaming device in the presence of a gaming regulator. Regardless of whether the EPROM solution is used, to gain approval in most gaming jurisdictions, a wager-based gaming device must demonstrate sufficient safeguards that prevent an operator or player of a wager-based gaming device from manipulating hardware and software in a manner that gives them an unfair and some cases an illegal advantage. The wager-based gaming device should have a means to determine if the code it will execute is valid. If the code is not valid, the wager-based gaming device must have a means to prevent the code from being executed. The code validation requirements in the gaming industry affect both hardware and software designs on wager-based gaming devices.

A third important difference between wager-based gaming devices and common PC based computer systems is the number and kinds of peripheral devices used on a wager-based gaming device are not as great as on PC based computer systems. Traditionally, in the gaming industry, wager-based gaming devices have been relatively simple in the sense that the number of peripheral devices and the number of functions the wager-based gaming device has been limited. Further, in operation, the functionality of wager-based gaming devices were relatively constant once the wager-based gaming device was deployed, i.e., new peripherals devices and new gaming software were infrequently added to the wager-based gaming device. This differs from a PC where users will go out and buy different combinations of devices and software from different manufacturers and connect them to a PC to suit their needs depending on a desired application. Therefore, the types of devices connected to a PC may vary greatly from user to user depending in their individual requirements and may vary significantly over time.

Although the variety of devices available for a PC may be greater than on a wager-based gaming device, wager-based gaming devices still have unique device requirements that differ from a PC, such as device security requirements not usually addressed by PCs. For instance, monetary devices, such as coin dispensers, bill validators and ticket printers and computing devices that are used to govern the input and output of cash to a wager-based gaming device have security requirements that are not typically addressed in PCs. Therefore, many PC techniques and methods developed to facilitate device connectivity and device compatibility do not address the emphasis placed on security in the gaming industry.

To address some of the issues described above, a number of hardware/software components and architectures are utilized in wager-based gaming devices that are not typically found in general purpose computing devices, such as PCs. These hardware/software components and architectures, as described below in more detail, include but are not limited to watchdog timers, voltage monitoring systems, state-based software architecture and supporting hardware, specialized communication interfaces, security monitoring and trusted memory.

For example, a watchdog timer may be used in International Game Technology (IGT) wager-based gaming devices to provide a software failure detection mechanism. In a normally operating system, the operating software periodically accesses control registers in the watchdog timer subsystem to “re-trigger” the watchdog. Should the operating software fail to access the control registers within a preset timeframe, the watchdog timer will timeout and generate a system reset. Typical watchdog timer circuits include a loadable timeout counter register to enable the operating software to set the timeout interval within a certain range of time. A differentiating feature of the some preferred circuits is that the operating software cannot completely disable the function of the watchdog timer. In other words, the watchdog timer always functions from the time power is applied to the board.

IGT gaming computer platforms preferably use several power supply voltages to operate portions of the computer circuitry. These can be generated in a central power supply or locally on the computer board. If any of these voltages falls out of the tolerance limits of the circuitry they power, unpredictable operation of the computer may result. Though most modern general-purpose computers include voltage monitoring circuitry, these types of circuits only report voltage status to the operating software. Out of tolerance voltages can cause software malfunction, creating a potential uncontrolled condition in the gaming computer. Wager-based gaming devices of the present assignee typically have power supplies with tighter voltage margins than that required by the operating circuitry. In addition, the voltage monitoring circuitry implemented in IGT gaming computers typically has two thresholds of control. The first threshold generates a software event that can be detected by the operating software and an error condition generated. This threshold is triggered when a power supply voltage falls out of the tolerance range of the power supply, but is still within the operating range of the circuitry. The second threshold is set when a power supply voltage falls out of the operating tolerance of the circuitry. In this case, the circuitry generates a reset, halting operation of the computer.

One standard method of operation for IGT slot device game software is to use a state device. Different functions of the game (bet, play, result, points in the graphical presentation, etc.) may be defined as a state. When a game moves from one state to another, critical data regarding the game software is stored in a custom non-volatile memory subsystem. This is critical to ensure the player's wager and credits are preserved and to minimize potential disputes in the event of a malfunction on the wager-based gaming device.

In general, the wager-based gaming device does not advance from a first state to a second state until critical information that allows the first state to be reconstructed has been stored. This feature allows the game to recover operation to the current state of play in the event of a malfunction, loss of power, etc that occurred just prior to the malfunction. In at least one embodiment, the wager-based gaming device is configured or designed to store such critical information using atomic transactions.

Generally, an atomic operation in computer science refers to a set of operations that can be combined so that they appear to the rest of the system to be a single operation with only two possible outcomes: success or failure. As related to data storage, an atomic transaction may be characterized as series of database operations which either all occur, or all do not occur. A guarantee of atomicity prevents updates to the database occurring only partially, which can result in data corruption.

In order to ensure the success of atomic transactions relating to critical information to be stored in the wager-based gaming device memory before a failure event (e.g., malfunction, loss of power, etc.), it is preferable that memory be used which includes one or more of the following criteria: direct memory access capability; data read/write capability which meets or exceeds minimum read/write access characteristics (such as, for example, at least 5.08 Mbytes/sec (Read) and/or at least 38.0 Mbytes/sec (Write)). Devices which meet or exceed the above criteria may be referred to as "fault-tolerant" memory devices, whereas it is which the above criteria may be referred to as "fault non-tolerant" memory devices.

Typically, battery backed RAM devices may be configured or designed to function as fault-tolerant devices according to the above criteria, whereas flash RAM and/or disk drive memory are typically not configurable to function as fault-tolerant devices according to the above criteria. Accordingly, battery backed RAM devices are typically used to preserve wager-based gaming device critical data, although other types of non-volatile memory devices may be employed. These memory devices are typically not used in typical general-purpose computers.

Thus, in at least one embodiment, the wager-based gaming device is configured or designed to store critical information in fault-tolerant memory (e.g., battery backed RAM devices) using atomic transactions. Further, in at least one embodiment, the fault-tolerant memory is able to successfully complete all desired atomic transactions (e.g., relating to the storage of wager-based gaming device critical information) within a time period of 200 milliseconds (ms) or less. In at least one embodiment, the time period of 200 mSec represents a maximum amount of time for which sufficient power may be available to the various wager-based gaming device components after a power outage event has occurred at the wager-based gaming device.

As described previously, the wager-based gaming device may not advance from a first state to a second state until critical information that allows the first state to be reconstructed has been atomically stored. This feature allows the game to recover operation to the current state of play in the event of a malfunction, loss of power, etc that occurred just prior to the malfunction. After the state of the wager-based gaming device is restored during the play of a wager-based game, game play may resume and the game may be completed in a manner that is no different than if the malfunction had not occurred. Thus, for example, when a malfunction occurs during a wager-based game, the wager-based gaming device may be restored to a state in the wager-based game just prior to when the malfunction occurred. The restored state may include metering information and graphical information that was displayed on the wager-based gaming device in the state prior to the malfunction. For example, when the malfunction occurs during the play of a card game after the cards have been dealt, the wager-based gaming device may be restored with the cards that were previously displayed as part of the card game. As another example, a bonus game may be triggered during the play of a wager-based game where a player is required to make a number of selections on a video display screen. When a malfunction has occurred after the player has made one or more selections, the wager-based gaming device may be restored to a state that shows the graphical presentation at the just prior to the malfunction including an indication of selections that have already been made by the player. In general, the wager-based gaming device may be restored to any state in a plurality of states that occur in the wager-based game that occurs while the wager-based game is played or to states that occur between the play of a wager-based game.

Game history information regarding previous games played such as an amount wagered, the outcome of the game and so forth may also be stored in a non-volatile memory device. The information stored in the non-volatile memory may be detailed enough to reconstruct a portion of the graphical presentation that was previously presented on the wager-based gaming device and the state of the wager-based gaming device (e.g., credits) at the time the wager-based game was played. The game history information may be utilized in the event of a dispute. For example, a player may decide that in a previous wager-based game that they did not receive credit for an award that they believed they won. The game history information may be used to reconstruct the state of the wager-based gaming device prior, during and/or after the disputed game to demonstrate whether the player was correct or not in their assertion. Further details of a state based gaming system, recovery from malfunctions and game history are described in U.S. Pat. No. 6,804,763, titled "High Performance Battery Backed RAM Interface", U.S. Pat. No. 6,863,608, titled "Frame Capture of Actual Game Play," U.S. application Ser. No. 10/243,104, titled, "Dynamic NV-RAM," and U.S. application Ser. No. 10/758,828, titled, "Frame Capture of Actual Game Play," each of which is incorporated by reference and for all purposes.

Another feature of wager-based gaming devices, such as IGT gaming computers, is that they often include unique interfaces, including serial interfaces, to connect to specific subsystems internal and external to the wager-based gaming device. The serial devices may have electrical interface requirements that differ from the "standard" EIA 232 serial interfaces provided by general-purpose computers. These interfaces may include EIA 485, EIA 422, Fiber Optic Serial, optically coupled serial interfaces, current loop style serial interfaces, etc. In addition, to conserve serial interfaces internally in the wager-based gaming device, serial devices may be connected in a shared, daisy-chain fashion where multiple peripheral devices are connected to a single serial channel.

The serial interfaces may be used to transmit information using communication protocols that are unique to the gaming industry. For example, IGT's Netplex is a proprietary communication protocol used for serial communication between wager-based gaming devices. As another example, SAS is a communication protocol used to transmit information, such as metering information, from a wager-based gaming device to a remote device. Often SAS is used in conjunction with a player tracking system.

IGT wager-based gaming devices may alternatively be treated as peripheral devices to a casino communication controller and connected in a shared daisy chain fashion to a single serial interface. In both cases, the peripheral devices are preferably assigned device addresses. If so, the serial controller circuitry must implement a method to generate or detect unique device addresses. General-purpose computer serial ports are not able to do this.

Security monitoring circuits detect intrusion into an IGT wager-based gaming device by monitoring security switches attached to access doors in the wager-based gaming device cabinet. Preferably, access violations result in suspension of game play and can trigger additional security operations to preserve the current state of game play. These circuits also function when power is off by use of a battery backup. In power-off operation, these circuits continue to monitor the access doors of the wager-based gaming device. When power is restored, the wager-based gaming device can determine whether any security violations occurred while power was off, e.g., via software for reading status registers. This can trigger event log entries and further data authentication operations by the wager-based gaming device software.

Trusted memory devices and/or trusted memory sources are preferably included in an IGT wager-based gaming device computer to ensure the authenticity of the software that may be stored on less secure memory subsystems, such as mass storage devices. Trusted memory devices and controlling circuitry are typically designed to not enable modification of the code and data stored in the memory device while the memory device is installed in the wager-based gaming device. The code and data stored in these devices may include authentication algorithms, random number generators, authentication keys, operating system kernels, etc. The purpose of these trusted memory devices is to provide gaming regulatory authorities a root trusted authority within the computing environment of the wager-based gaming device that can be tracked and verified as original. This may be accomplished via removal of the trusted memory device from the wager-based gaming device computer and verification of the secure memory device contents is a separate third party verification device. Once the trusted memory device is verified as authentic, and based on the approval of the verification algorithms included in the trusted device, the wager-based gaming device is enabled to verify the authenticity of additional code and data that may be located in the gaming computer assembly, such as code and data stored on hard disk drives. A few details related to trusted memory devices that may be used in at least one embodiment described herein are described in U.S. Pat. No. 6,685,567 (U.S. patent application Ser. No. 09/925,098), filed Aug. 8, 2001 and titled "Process Verification," and U.S. patent application Ser. No. 11/221,314, filed Sep. 6, 2005, each of which is incorporated herein by reference in its entirety and for all purposes.

In at least one embodiment, at least a portion of the trusted memory devices/sources may correspond to memory which cannot easily be altered (e.g., "unalterable memory") such as, for example, EPROMS, PROMS, Bios, Extended Bios, and/or other memory sources which are able to be configured, verified, and/or authenticated (e.g., for authenticity) in a secure and controlled manner.

According to a specific implementation, when a trusted information source is in communication with a remote device via a network, the remote device may employ a verification scheme to verify the identity of the trusted information source. For example, the trusted information source and the remote device may exchange information using public and private encryption keys to verify each other's identities. In another embodiment of at least one embodiment described herein, the remote device and the trusted information source may engage in methods using zero knowledge proofs to authenticate each of their respective identities. Details of zero knowledge proofs that may be used with the present invention are described in US publication no. 2003/0203756, by Jackson, filed on Apr. 25, 2002 and entitled, "Authentication in a Secure Computerized Gaming System", which is incorporated herein in its entirety and for all purposes.

Wager-based gaming devices storing trusted information may utilize apparatus or methods to detect and prevent tampering. For instance, trusted information stored in a trusted memory device may be encrypted to prevent its misuse. In addition, the trusted memory device may be secured behind a locked door. Further, one or more sensors may be coupled to the memory device to detect tampering with the memory device and provide some record of the tampering. In yet another example, the memory device storing trusted information might be designed to detect tampering attempts and clear or erase itself when an attempt at tampering has been detected.

Additional details relating to trusted memory devices/sources are described in U.S. patent application Ser. No. 11/078,966, entitled "Secured Virtual Network in a Gaming Environment", naming Nguyen et al. as inventors, filed on Mar. 10, 2005, herein incorporated in its entirety and for all purposes.

Mass storage devices used in a general purpose computer typically enable code and data to be read from and written to the mass storage device. In a wager-based gaming system environment, modification of the gaming code stored on amass storage device is strictly controlled and would only be enabled under specific maintenance type events with electronic and physical enablers required. Though this level of security could be provided by software, IGT gaming computers that include mass storage devices preferably include hardware level mass storage data protection circuitry that operates at the circuit level to monitor attempts to modify data on the mass storage device and will generate both software and hardware error triggers should a data modification be attempted without the proper electronic and physical enablers being present. Details using a mass storage device that may be used with at least one embodiment described herein are described, for example, in U.S. Pat. No. 6,149,522, herein incorporated by reference in its entirety for all purposes.

Distributed Side Wagering

In at least one embodiment, an intelligent gaming table and/or other gaming devices (such as, for example, wireless or handheld gaming devices) may provide capability to allow a player to make side wagers (e.g., back bets) on games (and/or gaming activities) played by other players.

For example, in one embodiment, a first player (e.g., side wagering player or "SWP") at the intelligent gaming table (and/or other gaming device) may be allowed to search for other active players, and may be allowed to browse and/or select various types of side wager targets (herein "targets", such as, for example, EGMs, players, dealers/house, game play/bonus events, etc.), and to monitory (e.g., via a virtual real-time feed) the game play activities relating to the target.

In at least one embodiment, the SWP may place one or more wagers (e.g., one or more even money wagers) on a selected target player's game. For example, in one embodiment, the SWP may place an even money side wager on the outcome of a selected target player's game. If the target player wins, the SWP wins the amount that the SWP wagered on that game outcome. If the target player loses, the SWP loses the amount that the SWP wagered on that game outcome. In at least one embodiment, side wagers may be queued up in advance. For example, in one embodiment, the SWP may identify and/or select (e.g., in advance) a plurality of games (e.g., yet to be played) for placing side wagers. The SWP may then specify individual side wager amounts for each of the identified games.

One embodiment may utilize a distributed messaging service to provide game details to players (e.g., SWPs) who are side wagering on other players (or other targets). In one embodiment, messaging service may include a message bus where selected (or all) game related messages are posted. For example, when a player plays blackjack, all more selected portions of gaming activity relating to the blackjack may be provided to the message bus, and/or distributed to the target and/or SWP. For example, in one embodiment, if a game server determines that the target player is to be dealt a jack and a three, for example, the message which includes this game state information may be sent to the target player and may also be posted to the message bus. In one embodiment, messages posted to the message bus may include details that link the messages to a particular player, table, game and/or session, such that messages may be identified and filtered for use by a side wager management system server.

In one embodiment, a side wager management system and/or event notification system may be operable provide the message bus functionality and/or event notification/subscription functionality for SWPs. In one embodiment, an SWP who places a side wager on a particular name associated with a particular target may subscribe to receive messages from the message bus which relate to game play activities associated with the target. In one embodiment, the subscription service may be operable to filter messages from the bus based on the side wager session parameters. In this way messages may be filtered such that an SWP is able to monitor and/or receive event notification messages which relate to the side wager(s) placed by the SWP. In addition, the side wager management system may be operable to provide encryption and/or authentication to ensure that only authorized clients are allowed to have access to appropriate side wager related information.

In at least one embodiment, the side wager management system and/or event notification system may be configured or designed in a manner which allows side wagering to be decoupled from regular game play and/or in a manner which is transparent to game developers. For example, in at least one embodiment, game developer's don't need any foreknowledge of how side wagering is implemented. In one embodiment, the games may be designed to simply post game moves and results to the message bus, and the side wager management system and/or event notification system server(s) take care of the rest.

It will be appreciated that the various side wagering techniques described herein allow for new types of wagering opportunities (e.g., side wagering opportunities) to be available to active players at gaming tables and/or EGMs. For example, in one embodiment, proposition bets may be placed, for example, where the SWP places wagers on how many people out of a group of players will win their next hand, or whether or not a given player or how many of a group of players will hit blackjack, or bust.

Figure 12A:
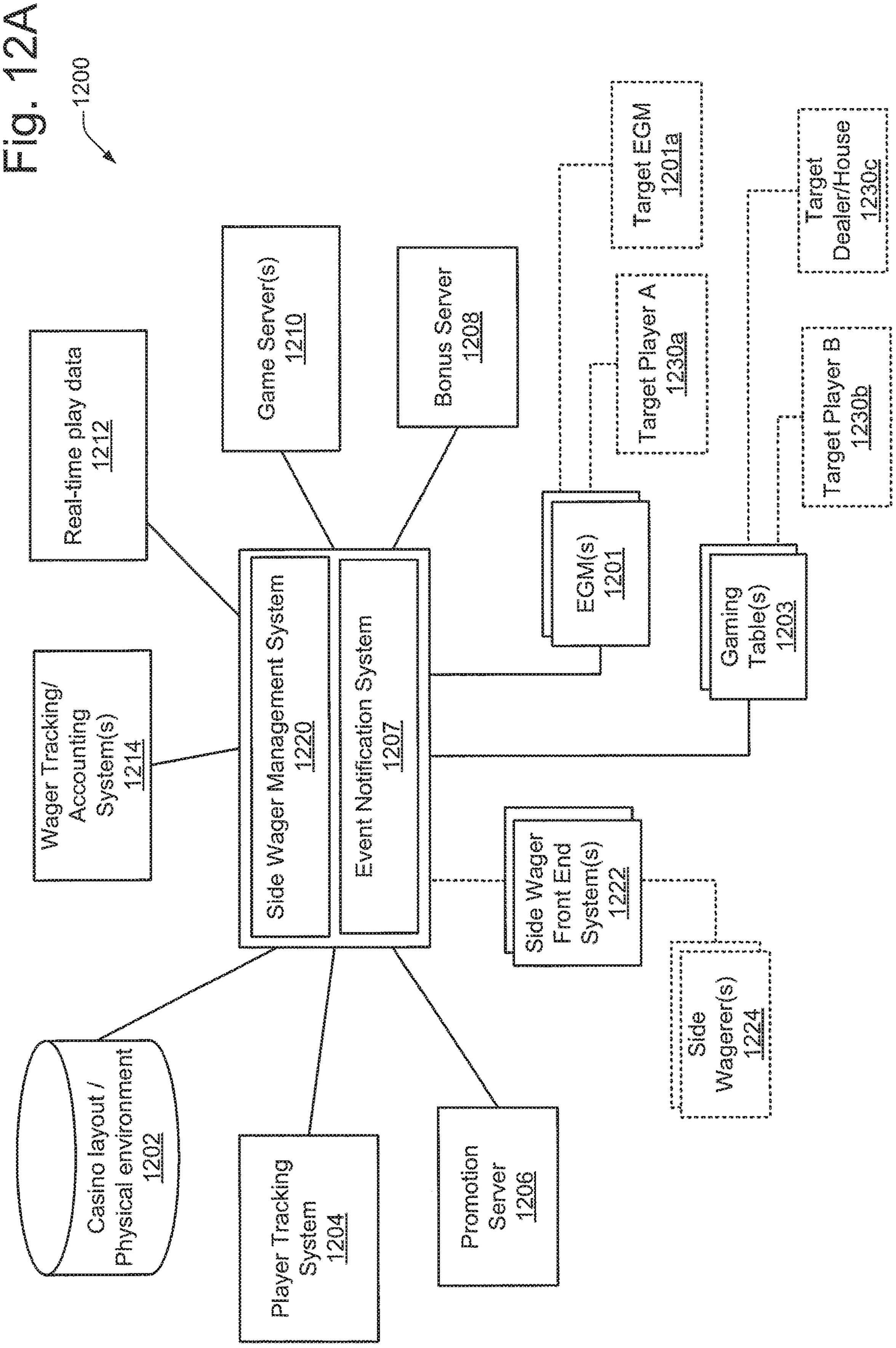
FIGS. 12A and 12B shows specific examples embodiments of gaming network systems/devices which may be used for implementing various features.

FIG. 12A shows a specific example of an embodiment of a gaming network 1200 which may be used for implementing various features. Descriptions of at least a portion of the various components and/or systems shown in FIG. 12A are also provided in other sections of this application.

As illustrated in the example of FIG. 12A, gaming network 1200 may include one or more electronic gaming machines (EGMs) 1201 and/or one or more gaming tables (1203) for which side wagering functionality has been enabled. Depending upon particular circumstances, a player may or may not be actively involved in game play at one of the EGMs/Gaming Table(s).

One or more side wagerers (SWPs) 1224 (which, for example, may include players and/or other patrons of the casino) may desire to engage in side wagering activity. In at least one embodiment, the SWP may be an active player at a live casino gaming table and/or an active player at an electronic gaming machine.

In one embodiment, an SWP 1224 may communicate with one or more Side Wager Front End System(s) 1222 for conducting side wager related activity. According to different embodiments, different Side Wager Front End Systems 1222 may be implemented via, for example, one or more of the following (or combinations thereof): an EGM, a kiosk, a PDA (or other mobile or handheld device), an interactive gaming table display/interface, a casino attendant or employee, etc.

For example, in one embodiment, an SWP may place a side wager relating to a selected target (e.g., target EGM 1201*a*, Target EGM Player A 1230*a*, Target Gaming Table Player B 1230*b*, Target Dealer/House 1230*c*, etc.). According to different implementations, a gaming casino may include a number of different Side Wager Front End System devices. In at least one embodiment, the Side Wager Front End System device may be operable to facilitate side wager activities conducted by one or more SWPs, and may further be operable to facilitate communication between the SWP(s) 1224, the Side Wager Management System 1220 and/or the Event Notification System 1207.

As illustrated in the embodiment of FIG. 12A, gaming network 1200 includes a Side Wager Management System 1220 which is operable to facilitate and/or manage a variety of side wagering activities and/or related information which is conducted in gaming network 1200. According to some embodiments, such as that illustrated in FIG. 12A, the Side Wager Management System 1220 may be operable to communicate with various other components and/or systems of gaming network 1200 in order, for example, to carry out operations relating to its various functionalities. As illustrated in the embodiment of FIG. 12A, such other components and/or systems may include, but are not necessarily limited to, one or more of the following: promotion server(s) 1206, player tracking system(s) 1204, casino layout/physical environment system(s) 1202, wager tracking/accounting system(s) 1214, real-time data tracking system(s) 1212, game server(s) 1210, bonus server(s) 1208, event notification system 1207, EGMs 1201, Gaming Table Systems 1203, etc.

In at least one embodiment, event notification system 1207 may include one or more event notification servers for providing event notification functionality to various entities (e.g., devices, systems, persons, etc.) of the gaming network. For example, in at least one embodiment, various devices/systems of the gaming network may provide periodic event notification updates to the event notification system 1207. For example, in one embodiment, selected EGMs 1201 and/or selected gaming table systems 1203 may provide periodic updates to the event notification system relating to their respective current status/states of game play activity, wagering activity, player activity, etc. Additionally, various other devices/systems of the gaming network, such as, for example, one or more Side Wager Front End System devices may subscribe to receive periodic alerts and/or notifications from the event notification system regarding updated event information relating to changes in status/states of game play activity, wagering activity, player activity, etc. for selected EGMs 1201 and/or selected gaming table systems 1203.

In at least one embodiment, event notification system 1207 may be operable to perform one or more of the following functions (or combinations thereof):

- track changes in game play states/status relating to one or more EGMs;
- track changes in game play states/status relating to one or more gaming tables;
- track changes in wagering activities occurring at one or more EGMs;
- track changes in wagering activities occurring at one or more gaming tables;
- track changes in wagering activities occurring at one or more EGMs;
- track changes in player activities occurring at one or more gaming tables;
- track changes in game play states/status for games relating to one or more players;
- provide subscription-based event notification service to various systems/devices of the gaming network;
- manage event notification subscriptions;
- generate event notification messages relating to different types of events which are tracked by the event notification system;
- forward selected event notification messages to appropriate subscribing entities of the gaming network;
- etc.

Figure 12B:
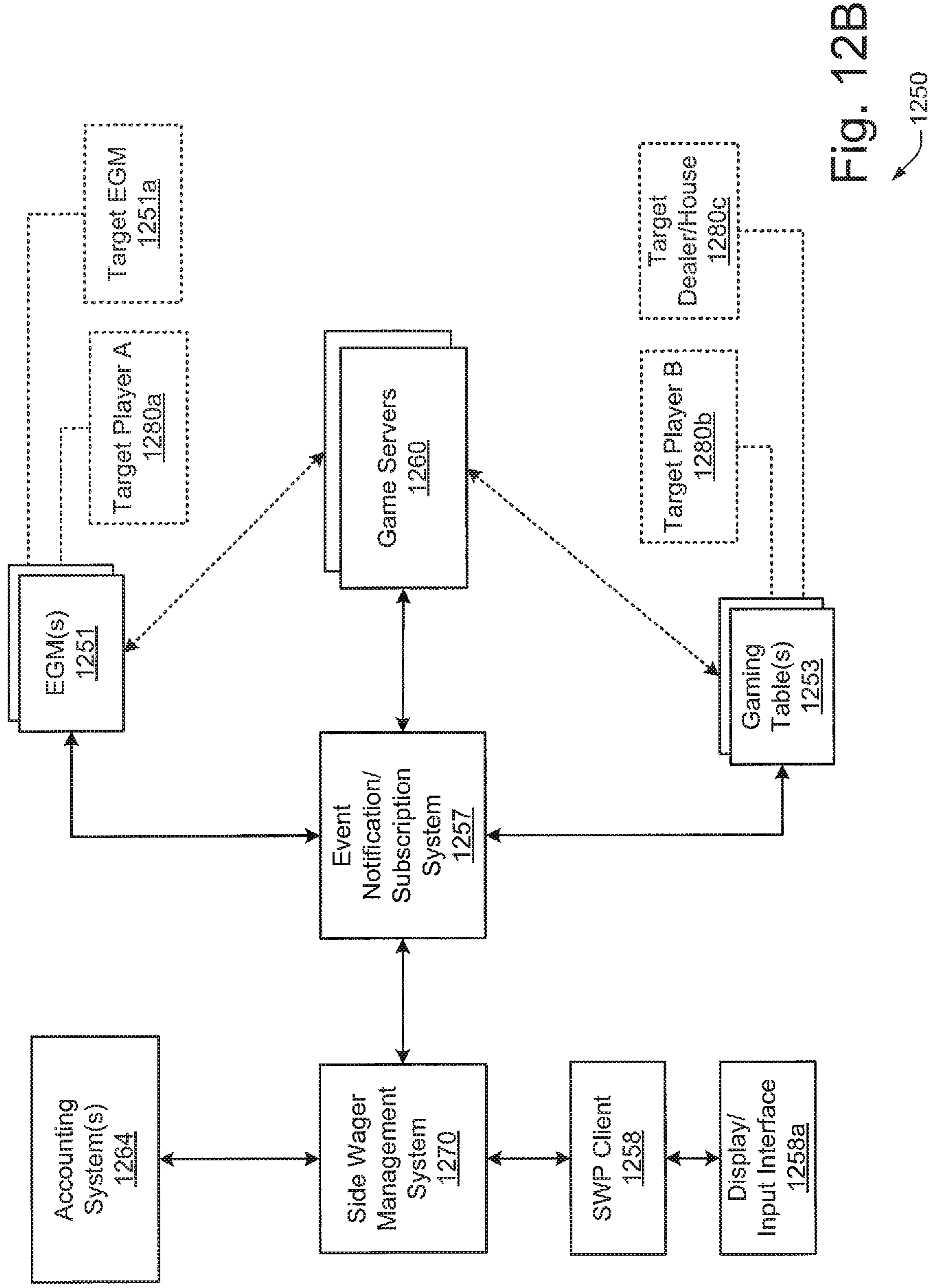

FIG. 12B shows a specific example of an alternate embodiment of a gaming network 1250 which may be used for implementing various features.

As illustrated in the example of FIG. 12B, gaming network 1250 may include one or more electronic gaming machines (EGMs) 1251 and/or one or more gaming tables (1253) for which side wagering functionality has been enabled. Depending upon particular circumstances, a player may or may not be actively involved in game play at one of the EGMs/Gaming Table(s).

One or more side wagering player (SWP) may desire to engage in side wagering activity, for example, via a an SWP client 1258 which includes a display/input interface 1258*a*. In at least one embodiment, the SWP may be an active player at a live casino gaming table and/or an active player at an electronic gaming machine. In at least one embodiment, an SWP client 1258 may be configured or designed to function as a side wager front end system 1222 of FIG. 12A (and/or vice-versa).

In one embodiment, an SWP may communicate with the side wager management system 1270 (e.g., via display/input interface 1258*a* and/or SWP client 1258) for conducting side wager related activity. According to different embodiments, different SWP client functionality may be incorporated into, or implemented by, for example, one or more of the following (or combinations thereof): an EGM, a kiosk, a PDA (or other mobile or handheld device), an interactive gaming table display/interface, a casino attendant or employee, etc.

For example, in one embodiment, using SWP client 1258, an SWP may place a side wager relating to a selected target (e.g., target EGM 1251*a*, Target EGM Player A 1280*a*, Target Gaming Table Player B 1280*b*, Target Dealer/House 1280*c*, etc.). In one embodiment where the SWP is a player at a gaming table, the target may be another player at the same gaming table. In other embodiments, the target may correspond to one or more of the following (or combinations thereof): a player at another gaming table, a dealer/house at another gaming table, an EGM, a player at an EGM, a game theme, a game type, etc.

In at least one embodiment, gaming network 1250 includes a Side Wager Management System 1270 which is operable to facilitate and/or manage a variety of side wagering activities and/or related information which is conducted in gaming network 1250. According to some embodiments, such as that illustrated in FIG. 12B, the Side Wager Management System 1270 may be operable to communicate with various other components and/or systems of gaming network 1250 in order, for example, to carry out operations relating to its various functionalities. As illustrated in the embodiment of FIG. 12B, such other components and/or systems may include, but are not necessarily limited to, one or more of the following: accounting system(s) 1264, event notification system 1257, SWP clients 1258, game server(s) 1260, bonus server(s), EGMs 1251, Gaming Table Systems 1253, etc.

In at least one embodiment, the side wager management system may be operable to implement or perform one or more of the following functions (and/or combinations thereof):

- perform authentication/verification of various entities (such as, for example, SWPs, SWP clients, etc.);
- manage side wagers placed by SWPs;
- instantiate/manage side wager sessions for one or more SWPs;
- handle various accounting transactions relating to placed side wagers (such as, for example: verifying funds, deducting wagered amounts, issuing credits for wins, etc.);
- subscribe to selected event notifications at the event notification system;
- interpret game specific messages relating to game server play (e.g., via the use of plug-in type filters for specific game types/game themes);
- determine and/or interpret win/loss outcomes for placed side wagers, for example, by processing event notification information;
- etc.

In at least one embodiment, event notification system 1257 may include one or more event notification servers for providing event notification functionality to various entities (e.g., devices, systems, persons, etc.) of the gaming network. For example, in at least one embodiment, various devices/systems of the gaming network may provide periodic event notification updates to the event notification system 1257. For example, in one embodiment, selected EGMs 1251 and/or selected gaming table systems 1253 may provide periodic updates to the event notification system relating to their respective current status/states of game play activity, wagering activity, player activity, etc.

In at least one embodiment, an EGM and/or gaming table system may be configured or designed to include functionality (e.g., via hardware and/or software) for monitoring changes in game states which occur at the EGM/gaming table, and for generating suitable game state update information to be provided to the event notification system. According to different embodiments, the updated information may be dynamically generated and automatically provided to the event notification system on a periodic basis such as, for example, at regular intervals, upon the occurrence of specified triggering events/conditions, upon request (e.g., from the event notification system), etc.

In some embodiments, at least a portion of the updated game state/status information (which is posted/reported to the event notification system) may be provided directly (and/or indirectly) from one or more game servers 1260. Accordingly, in at least one embodiment, at least a portion of the updated information may be dynamically generated and automatically provided by one or more game servers 1260 to the event notification system.

In at least one embodiment, various other devices/systems of the gaming network, such as, for example, the side wager management system and/or various SWP clients may subscribe to receive periodic alerts and/or notifications from the event notification system regarding updated event information relating to changes in status/states of game play activity, wagering activity, player activity, etc. for selected EGMs 1251 and/or selected gaming table systems 1253.

In one embodiment, the event notification system may be implemented using a distributed messaging service to provide game details to players who are placing side wagers on other players. In one embodiment, the messaging service may include a message bus where all (or selected) game-related messages may be posted. For example, when a player plays blackjack, changes in the game state of the blackjack game may be sent to the message bus and/or to other entities of the gaming network. If the player is dealt a jack and a three, for example, an updated game state message may be posted to the message bus. In one embodiment, messages posted which are posted to the message bus may include specific event-related information/details for allowing such messages to be linked a given player, EGM/table, game type, game theme, game session, etc. In at least one embodiment, and at least a portion of the posted messages may be identified, filtered and/or selected for forwarding to appropriate network entities such as, for example, wager tracking/accounting system(s), side wager management system, SWPs, etc.

For example, in one embodiment, an SWP (e.g., a player who wishes to place a side wager on another player's game) may subscribe to messages from the message bus. The subscription service filters messages from the bus based on the SWP's session parameters. In this way messages may be filtered such that SWPs are only notified of updated events with relate to their respective side wagers. In addition, the event notification system and/or side wager management system may each provide encryption and/or authentication functionality, for example, to ensure that only authorized clients have access to the appropriate side wager session and/or event information.

In at least one embodiment, the side wager management system and/or event notification system may be configured or designed in a manner which allows side wagering to be decoupled from regular game play and/or in a manner which is transparent to game developers. For example, in at least one embodiment, game developer's don't need any foreknowledge of how side wagering is implemented. In one embodiment, the games may be designed to simply post game moves and results to the message bus, and the side wager management system and/or event notification system server(s) take care of the rest.

It will be appreciated that the various side wagering techniques described herein allow for new types of wagering opportunities (e.g., side wagering opportunities) to be available to active players at gaming tables and/or EGMs. For example, in one embodiment, proposition bets may be placed, for example, where the SWP places wagers on how many people out of a group of players will win their next hand, or whether or not a given player or how many of a group of players will hit blackjack, or bust.

Figure 13:
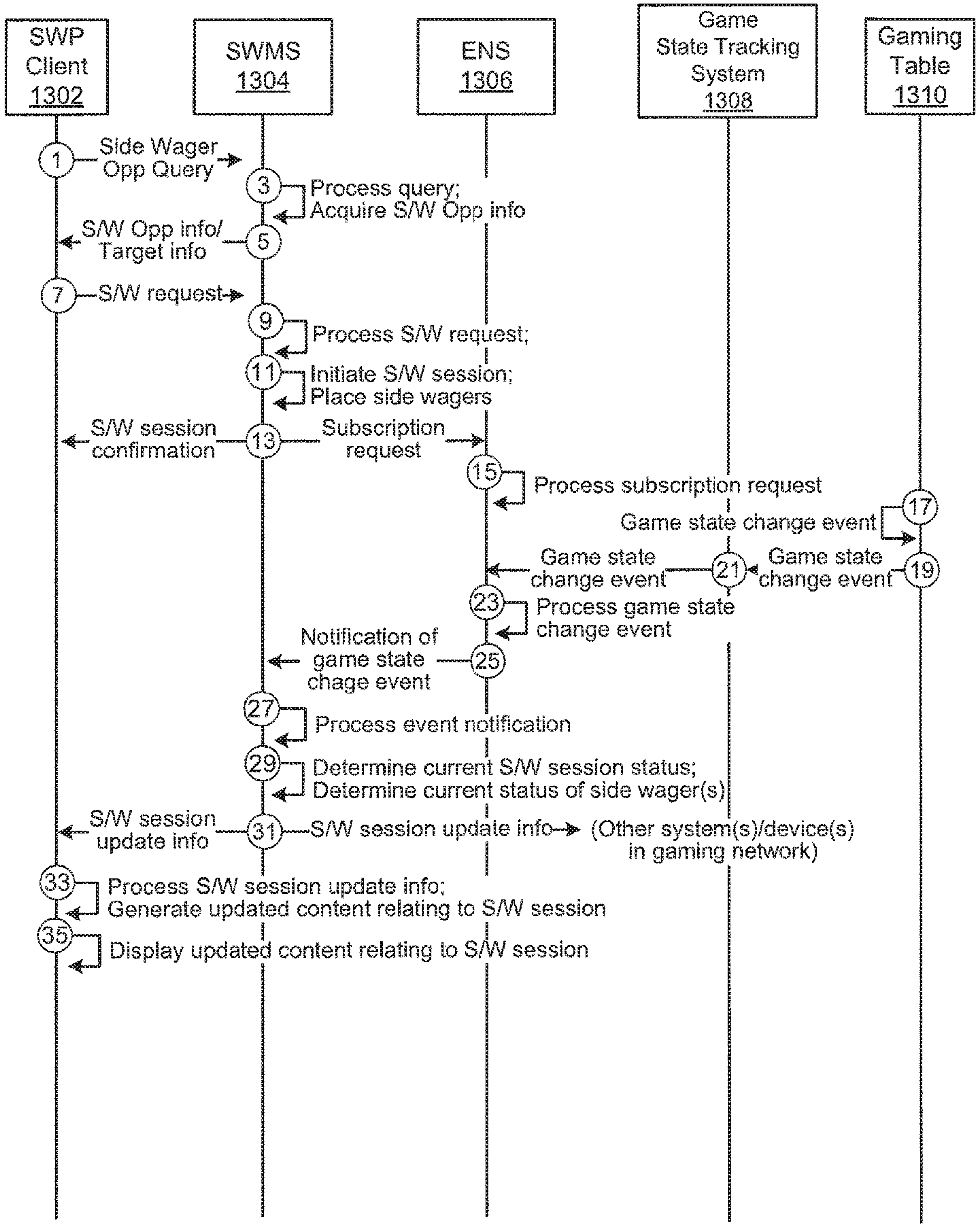
FIG. 13 shows a specific embodiment of an example data flow diagram illustrating various action between various devices/systems of a gaming network.

FIG. 13 shows a specific embodiment of an example data flow diagram illustrating various action between various devices/systems of a gaming network. According to different embodiments, at least a portion of the various actions/operations illustrated in FIG. 13 may be implemented in real-time or substantially real-time.

According to various embodiments, various portions of the activities described with respect to FIG. 13 may be implemented via one or more gaming network components and/or systems described herein such as, for example, one or more of the following (or combinations thereof): SWP client 1302, Side Wager Management System (SWMS) 1304, Event Notification System (ENS) 1036, Game State Tracking System 1308, Gaming Table system 1310, EGM, Accounting system, Player Tracking system, Game Server(s), etc. For purposes of illustration, and in order to avoid confusion, the flow diagram of FIG. 13 will now be described by way of example with respect to the gaming network portion 1250 of FIG. 12B of the drawings. In this particular example, it is assumed that a first player (e.g., the SWP) occupies a player station (and/or is engaged in active game play) at a first gaming table, and wishes to place one or more side wagers on the outcomes of game play being played by a different player at a different gaming table in the casino. Accordingly, for reference purposes in this particular example, the first player (i.e., the player wishing to place the side wager) will be referred to as the "side wagering" player (SWP), and the other player (i.e., the player playing the game that the SWP is side wagering on) will be referred to as the "target" player (TP).

In the present example, it is assumed that the SWP accesses an SWP client in order to initiate a search for side wagering opportunities which are currently (or potentially) available to the SWP. In one embodiment where the SWP's gaming table includes an interactive player station display, the SWP Client may be implemented via a combination of software and/or hardware, and may be presented to the SWP in the form of a window displayed on a portion of the SWP's player station display which includes a graphical user interface for allowing the SWP to perform a variety of side wager related activities.

Accordingly, at (1), it is assumed that the SWP has used the SWP client 1302 to initiate a search for side wagering opportunities which are currently (or potentially) available to the SWP. As shown at (1) in the example of FIG. 13, the SWP client may transmit a side wager (S/W) opportunity request to the side wager management system 1304.

In at least one embodiment, the side wager opportunity request may include various types of information such as, for example, one or more of the following (or combinations thereof):

- Authentication information.
- Information relating to the identity of the SWP.
- Player tracking information relating to the SWP.
- Player rating information relating to the SWP.
- Player profile information relating to the SWP.
- Information relating to the SWP's location.
- Information relating to the gaming table.
- Information relating to an identity of the SWP client.
- Information relating to various preferences and/or other criteria specified by the SWP which may be used for identifying, selecting, and/or filtering various side wager opportunities which may be presented to the SWP. For example, in one embodiment the SWP may request to see only currently available side wagering opportunities associated with "hot" players in the casino. In another example, the SWP may request to see only currently available side wagering opportunities associated only with "hot" players at baccarat gaming tables in the casino. In another example, the SWP may request a list of only currently available side wagering opportunities associated with "hot" EGMs in the casino.
- Etc.

According to various embodiments, examples of filtering/selection preferences and/or other criteria specified by the SWP (which, for example, may be used for identifying, selecting, and/or filtering various side wager opportunities which may be presented to the SWP) may include, but are not limited to, one or more of the following (or combinations thereof):

- time criteria;
- date criteria;
- machine/gaming table ID criteria;
- machine/gaming table activity criteria;
- player ID criteria;
- participation criteria (e.g. whether the target is currently participating in a progressive jackpot system, for example);
- game theme constraints
- game type constraints;
- player location constraints;
- player profile constraints;
- target profile constraints;
- wagering constraints;
- target location constraints;
- denomination constraints;
- paytable constraints;
- game history constraints;
- constraints relating to target's "hot" index rating;
- constraints relating to proximity of target;
- constraints relating to wins/losses associated with target;
- constraints relating to duration of currently active gaming session;
- player tracking constraints;
- theoretical and/or actual payback criteria;
- target popularity;
- size of jackpot available;
- etc.;

According to specific embodiments, each side wager opportunity or event may be characterized a single, or a combination of, discrete states or outcomes that may result with some likelihood of occurrence during the play of the wager-based game.

According to different embodiments, a "hot" player, machine, game, or other entity may be defined according to predetermined criteria and/or may be defined according to various criteria specified by the SWP. For example, in at least one embodiment, one or more of the following criteria (or combinations thereof) may be used to determine whether or not a given target (e.g., player, game theme/type, gaming table, EGM, dealer/house, etc.) is currently "hot":

- percentage of wins/losses over one or more specified time intervals;
- winning/losing streaks;
- duration of currently active gaming session;
- number of consecutive wins/losses over one or more specified time intervals;
- amounts wagered;
- amounts won/lost;
- statistical analysis of target's wins/losses as compared to theoretical wins/losses over one or more specified time intervals;
- statistical analysis of target's wins/losses as compared to other players' wins/losses (e.g., at the same gaming table) over one or more specified time intervals;
- target's game play speed (e.g., number of games/hands/rounds played by target during one or more specified time intervals);
- etc.

In at least one embodiment, an SWP may create one or more customized definitions of what the SWP considers to be "hot" by assigning weighted values to one or more of the above criteria. Accordingly, in at least some embodiments, the term "hot" may represent a rating or index based on a function of weighted criteria, as defined by the SWP. For example, in one embodiment, an SWP may create a first "hot" index rating system wherein a target's "hot" index value is dynamically calculated based upon the following weighted criteria: (50%)–target's current number of consecutive wins; and (50%)–target's total number of wins for current gaming session. In another embodiment, an SWP may create a different "hot" index rating system wherein a target's "hot" index value is dynamically calculated based upon the following weighted criteria: (25%)–target's current number of consecutive wins; (25%)–statistical analysis of target's wins/losses as compared to theoretical wins/losses over current gaming session; and (20%)–amounts won during current gaming session; and (30%)–amounts lost during current gaming session.

At (3) it is assumed that the side wager management system processes the side wager opportunity request. In at least one embodiment, the side wager management system may use at least a portion of the information from the side wager opportunity request to acquire information relating to various types of available side wagering opportunities, and/or to select one or more identified available side wagering opportunities for presentation to the SWP.

In at least one embodiment, the processing of the side wager opportunity request may include, for example: performing authentication operations (e.g., authenticating the identity of the SWP); polling other devices/systems in the gaming network for various types of information which may be used for identifying one or more side wager opportunities that may be available to the SWP.

In at least one embodiment, the side wager management system may use at least a portion of the selection criteria specified by the SWP to filter and select one or more side wager opportunities to be presented to the SWP in response to the side wager opportunity request. Further, in at least one embodiment, the SWP may modify and/or provide updated selection criteria/filtering parameters to the side wager management system via multiple side wager opportunity requests.

In at least one embodiment, the side wager management system may use at least a portion of the information from the side wager opportunity request(s) to automatically and dynamically identify and/or select a first plurality of available side wager opportunities (SWOs) to be presented to the SWP.

In at least one embodiment, and various types of information accessed by the side wager management system may be formatted, filtered, sorted and/or otherwise manipulated according to various criteria and/or constraints. For example, the output data may be sorted and/or filtered to promote side wager opportunities associated with selected game themes, and/or to promote side wager opportunities associated with selected targets. In a particular embodiment, one or more of the available side wager opportunities may each have a respective set of constraints associated therewith which, for example, may relate to various rules governing side wager activities associated with that particular side wager opportunity. For example, side wagering may be allowed for a particular target only if the amount of the side wager meets or exceeds a specified wager amount.

At (5) it is assumed that the side wager management system provides SWO information to the SWP client in response to one or more side wager opportunity requests. In at least one embodiment, the SWO information may include information relating to different targets (e.g., targets matching the SWP's selection/filtering criteria) for which side wagering opportunities are available to the SWP.

At (7) it is assumed that the SWP client presents the first plurality of SWOs to the SWP. According to specific embodiments, the SWP client may display a menu or graphical interface to the SWP for allowing the SWP to browse and/or select various side wager opportunities and/or activities.

According to various embodiments, the SWP may be presented with different side wager opportunities relating to different side wager types. Examples of various side wager types may include, but are not limited to one or more of the following (or combinations thereof):

- a one time wager on a single play of a target;
- a one time wager on multiple plays of a target (e.g., fixed number of plays, multiple plays during a specified time period, etc.);
- a repeating wager (e.g., $5 per play);
- an incremental wager (e.g., where the wager amount increases according to a predefined schedule, such as, for example, an increase of $1/hand);
- a random wager within a specified range (e.g., a wager amount between $1 and $5);
- etc.

According to specific embodiments, side wagers may be placed on a variety of events such as, for example, one or more of the following (or combinations thereof):

- game outcome wins;
- game outcome losses;
- game play events;
- bonusing events;
- combinations of multiple events/outcomes;
- etc.

In at least one embodiment, the first plurality of SWOs may include, but are not limited to, one or more of the following (or combinations thereof):

- a SWO relating to an activity at a gaming table;
- a SWO relating to an activity at a gaming machine;
- a SWO relating to an activity at a gaming system where the SWP is an active player at the gaming system;
- a SWO relating to an activity at a gaming system where the SWP is not an active or non-primary player at the gaming system;

In at least some embodiments, placement of a side wager by an SWP may be performed via one or more of the following (or combinations thereof):

- via use of a PPD;
- via use of a kiosk;
- via a manual activity performed between the SWP and a casino employee;
- via a remote system which is communicatively coupled (e.g., via the Internet) to the gaming network;
- etc.

In the present example of FIG. 13, it is assumed that the SWP elects to place one or more side wagers on one or more targets associated with the various SWOs presented to the SWP. Accordingly, as shown at (7), the SWP client may transmit one or more side wager requests (corresponding to the SWP's elected side wagers) to the side wager management system.

In at least one embodiment, each side wager (S/W) request may include information relating to one or more side wagers to be placed on behalf of the SWP. Examples of such information may include, but are not limited to, one or more of the following (or combinations thereof):

- target information;
- wager information;
- SWP identifier information;
- SWP client identifier information;
- account information associated with the SWP;
- other restrictions/criteria (e.g., specified by the SWP) relating to one or more side wagers;
- etc.

For example, in one embodiment, the SWP may provide instructions to the SWP client to place a $1 side wager on each game currently being played by any "hot" players at blackjack gaming tables for the next 5 minutes. In one embodiment, the SWP may further specify that side wagers continue to be placed according to the above-specified parameters, with an additional criteria that the total loss amount for any given target (upon which a side wager has been placed) not to exceed more than $5 during the side wagering session.

In one embodiment, each side or wager placed by the SWP may represent a different side wager activity associated with that particular side wager session. For example, the SWP may elect to place or stake a side wager of $100 (cumulative total amount) to mirror the EGM wagering activities of Player A for the next 2 hours. In this example, each time Player A makes a wager on an EGM within the specified 2 hour time period, an identical wager (e.g., for the same game theme, denomination, paytable, etc.) may be automatically placed (e.g., by the Side Wager Management System) on behalf of the SWP.

At (9) it is assumed that the side wager management system processes the side wager request(s). In at least one embodiment, the processing of a S/W request may include one or more of the following (or combinations thereof):

- performing authentication/verification of various entities (such as, for example, SWPs, SWP clients, etc.);
- placing and managing side wagers associated with different SWPs;
- communicating with other devices/systems of the gaming network;
- handling various accounting transactions relating to the placement of a side wager (such as, for example: verifying funds, deducting wagered amounts, etc.);
- approving/denying a request for placement of a given side wager for a given SWP/target;
- etc.

In the present example, it is assumed that the side wager management system approves one or more S/W request(s) from the SWP/SWP client. Accordingly, as shown at (11), the side wager management system may start or initiate a side wager session for the SWP, and may also take appropriate actions to officially place one or more of the SWP's side wagers.

As shown at (13), in at least one embodiment, once the side wager management system has initiated a side wager session and/or placed one or more side wagers on behalf of the SWP, the side wager management system may provide a confirmation message to the SWP client, acknowledging or confirming initiation of the side wager session and/or placement of the requested side wager(s). Additionally, in at least one embodiment, the side wager management system may generate and send a subscription request to the event notification system 1306.

For purposes of illustration, it is assumed in the present example that the side wager management system has placed a side wager (on behalf of the SWP) on a game outcome associated with a table game being played by a target player at gaming table 1310.

Accordingly, in at least one embodiment, the subscription request sent by the side wager management system to the event notification system may include a request to receive updated and games state information (and/or other desired information) relating to gaming activity associated with the target player at gaming table 1310. In some embodiments, the side wager management system may also send additional requests to the event notification system for subscribing other entities of the gaming network (e.g., SWP client 1302) to event notifications relating to one or more placed side wagers.

At (15) it is assumed that the event notification system processes the subscription request sent by the side wager management system. In at least one embodiment, the processing of the subscription request may include, for example, one or more of the following actions (or combinations thereof):

- establishing a first subscription service for providing event notification messages relating to gaming activity (and/or other activity) associated with the target player at gaming table 1310;
- registering the side wager management system (and/or other entities of the gaming network) as subscribing members of the first subscription service;
- requesting selected entities in the gaming network (e.g., game state tracking system 1308) to provide the event notification system with updated game state information relating to gaming activities associated with gaming table 1310;
- etc.

At (17) it is assumed that a changing game state occurs at gaming table 1310. For example, the target player and/or dealer at gaming table 1310 may have been dealt a new card.

In at least one embodiment, the game state change event which has occurred at the gaming table 1310 may be automatically detected (19) and/or tracked by game state tracking system 1308.

In at least one embodiment, the game state tracking system 1308 may be operable to track game state information (and/or other gaming related information) associated with one or more specified gaming tables and/or EGMs. In some embodiments, selected intelligent gaming tables may each include their own respective game state tracking system which tracks game state information (and/or other gaming related information) associated with that intelligent gaming table. In some embodiments, selected EGMs may each include own respective game state tracking system which tracks game state information (and/or other gaming related information) associated with that EGM. In some embodiments, one or more gaming servers may each include a respective state tracking system which tracks game state information (and/or other gaming related information) associated with selected EGMs and/or gaming tables.

In the example of FIG. 13, it is assumed, at (21), that the game state tracking system detects the occurrence of the game state change event at gaming table 1310, and reports the game state change event to event notification system 1306.

At (23) it is assumed that the event notification system processes the game state change event. In at least one embodiment, the processing of the game state change event by the event notification system may include one or more of the following actions (or combinations thereof):

- analyzing various information relating to the game state change event;
- identifying one or more active event notification subscription services which relate to the game state change event;
- generating one or more event notification messages relating to the game state change event;
- identifying one or more entities of the gaming network which have subscribed to receive event notification messages relating to the identified event notification subscription services and/or game state change event;
- etc.

At (25) it is assumed that the event notification system provides to the side wager management system an event notification message which includes information relating to the game state change event which occurred at gaming table 1310. In at least one embodiment, the event notification message may include a variety of different types of information such as, for example, one or more of the following (or combinations thereof):

- wagering information;
- current game state information (e.g., relating to game play at gaming table 1310);
- bonus game state information;
- player hand information (e.g., cards/hands which are currently held by the target player and/or which are currently held by other players at the gaming table);
- dealer/house hand information (e.g., cards which are currently part of the dealer's hand);
- game outcome information (e.g., relating to the target player, house/dealer and/or other players at the gaming table);
- player game play instructions (e.g., game play instructions provided by the target player);
- timestamp information;
- game type information
- game theme information;
- player location information;
- gaming session information (e.g., length of target player's current gaming session at the gaming table);
- game history information;
- player tracking information;
- winnings information (e.g., amounts won by a target);
- accounting meter data
- the amount of a jackpot hit (if any) during specific game cycles;
- information relating to special game play/bonus events (e.g., jackpots, blackjacks, etc.);
- etc.

In at least one embodiment, any updates to game states and/or other activities relating to active side wager sessions may be transmitted or reported to the side wager management system, for example, in real-time or at periodic intervals.

At (27) it is assumed that the side wager management system processes the event notification message. In at least one embodiment, the processing of the event notification message may include, for example, one or more of the following actions (or combinations thereof):

- update information relating to active side wager sessions managed by the side wager management system;
- handle various accounting transactions relating to placed side wagers (such as, for example: issuing credits for wins, refunding credits for push events and/or cancelled side wagers, etc.);
- interpret game specific messages relating to game server play;
- determine and/or interpret win/loss outcomes for placed side wagers;
- identify selected side wager target(s) which are (and/or have been) associated with side wager activity;
- notify one or more of the identified side wager target(s) that a side wager session has been initiated with respect to that particular target;
- etc.

Additionally, in at least one embodiment, as shown at (29), the side wager management system may also use at least a portion of the event notification information to determine a current status of the side wager session associated with the SWP, and/or to determine a current status of one or more side wagers which were placed by the SWP. In one embodiment, the side wager management system may be operable to store the updated side wager session information (and/or related side wager information), for example, at a local storage device and/or at a remote storage location.

At (31) it is assumed that the side wager management system forwards updated side wager session status information to one or more entities of the gaming network such as, for example, SWP client 1302. In at least one embodiment, the updated side wager session status information may include information relating to the current status of one or more side wagers which were placed by the SWP.

At (33) it is assumed that the SWP client receives and processes the updated side wager session status information. For example, in at least one embodiment, the SWP client may use at least a portion of the updated side wager session status information to generate (35) updated content relating to one or more side wagers to be displayed to the SWP. For example, if the updated side wager session status information relates to new cards which were dealt to the target player, the SWP may render a real-time graphical display of current cards being held by the target player and/or the visible current cards being held by the house/dealer.

In one embodiment, a "hot" player may receive a percentage (e.g., 5%) of profits made by SWPs (e.g., SWPs who bet on that player). This may act to encourage "hot" players to participate in player tracking/monitoring of their activities which may be used to provide side wager services.

According to various embodiments, different types of "currency" may be used to conduct side wager activities including, for example, but not limited to one or more of the following (or combination thereof): cash, credits, tickets, vouchers, coupons, cashless currency, betting chips, tokens, and/or other forms of wagering instruments permitted by a casino or gaming jurisdiction.

In one embodiment, the side wager management system may be operable identify selected side wager target(s) which are (and/or have been) associated with side wager activity, and/or notify one or more of the identified side wager target(s) that a side wager session has been initiated with respect to that particular target. In at least one embodiment, the notified target(s) may, in turn, take appropriate action such as, for example, notifying other entities (e.g., players, casino employees, network devices/systems) of selected side wager session status information. One example of this is illustrated in FIG. 23 of the drawings.

Figure 23:
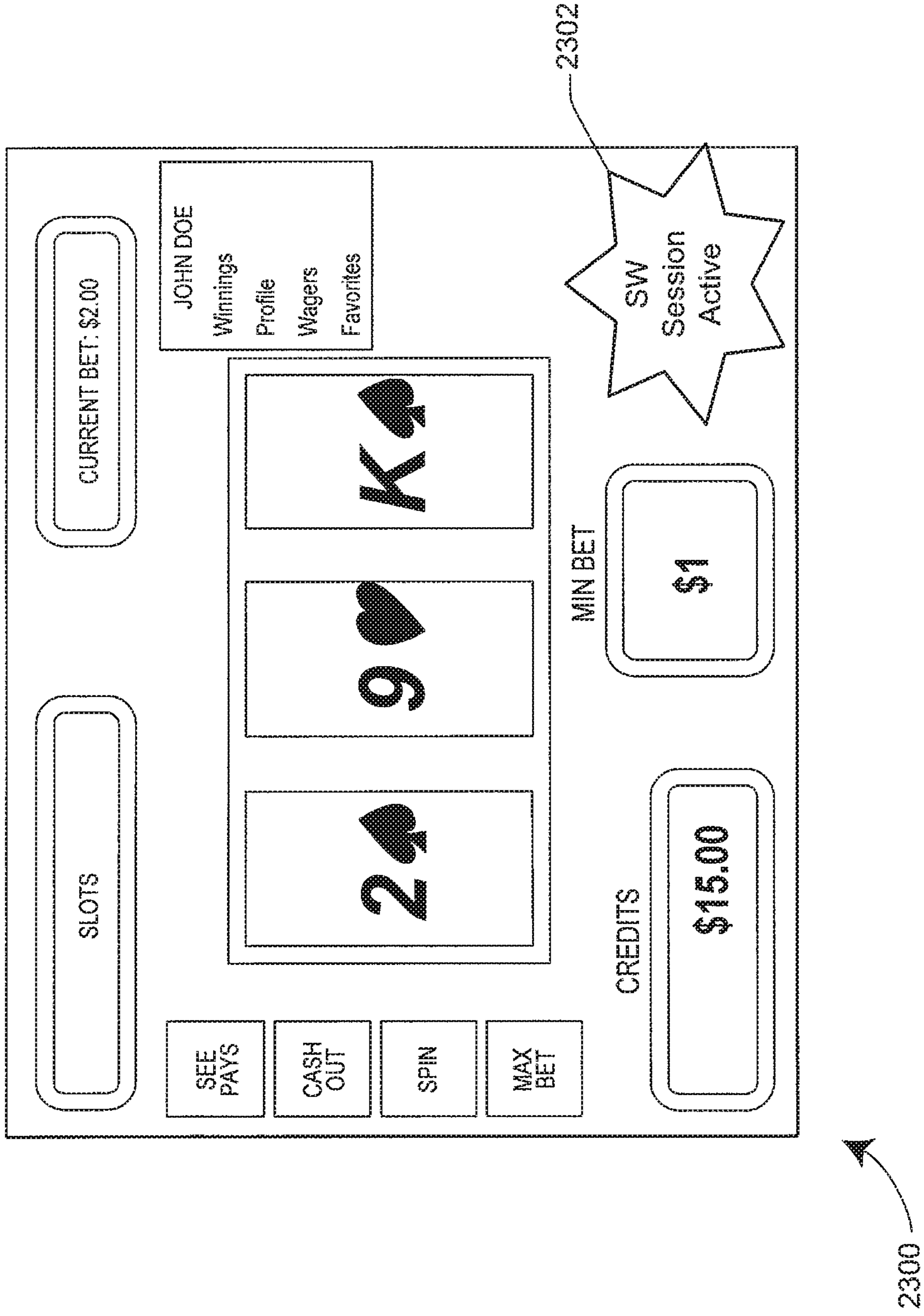
FIG. 23 shows one example of an EGM display 2300 in accordance with a specific embodiment.

FIG. 23 shows one example of an EGM display 2300 in accordance with a specific embodiment. In the example of FIG. 23, it is assumed that a side wager session has been initiated based on EGM game play being performed by a target player at the EGM. In the example of FIG. 23, the EGM includes an EGM display 2300. In one embodiment, the side wager management system (and/or event notification system) may provide the EGM with updated side wager session status information relating to a side wager session which has been initiated by the SWP for that particular target.

According to at least one embodiment, the EGM may display information relating to the side wager session on EGM display 2300. For example, as illustrated in FIG. 23, EGM display 2300 may display a side wager status icon 2302 which conveys to the target player (e.g., the target player who is playing at the EGM) that a side wager session is currently active at that particular EGM. In one embodiment, the portion of the display which displays icon 2302 may be controlled by one or more remote systems such as, for example, the side wager management system. In one embodiment, a player may select the side wager status icon 2302 in order to retrieve additional information relating to current (and/or previous) side wager session(s) associated with that particular target. According to alternate embodiments, it may be desirable to keep at least some aspects of side wager sessions anonymous, for example, so that a target player does not know there is a side wagering session in play. Additionally, in other embodiments it may be desirable to provide players with the option to elect to allow or prevent side wagering during their game play.

In at least one embodiment, various devices/systems may be operable to transmit or report (e.g., in real time or periodic intervals) target activity status information (e.g., information relating to activities or state changes associated with one or more side wager targets) to appropriate entities such as, for example, the event notification system, the side wager management system, etc. In one embodiment, the side wager management system may be operable to monitor (e.g., in real-time) the target activity status information it receives relating to various side wager targets. Additionally, in at least one embodiment, the side wager management system may be operable to utilize the reported target activity status information to determine side wager outcomes relating to one or more side wagers.

For example, in one embodiment where a side wager is placed on a specified target EGM, the target EGM may be notified that it is involved in an active side wager session. In response, the target EGM may monitor it's current game play activity and/or other activity at the target EGM (such as, for example, real-time game play data, real-time wager data, coins in, coins out, bonus data, player tracking data, card in, card out, games played, max bet wagers played, other standard accounting meters, etc.). Collectively, such monitored information may herein be referred to as target activity status information.

In an alternate embodiment where the specified side wager target is a specific player on the casino floor, for example, the side wager management system may be operable to communicate with a player tracking system and/or other systems/devices in the gaming network in order to track the location and/or activities of the target player during the active side wager session(s). Each time the target player engages in game play activities at one or more gaming devices, the activities of the target player may be reported to the event notification system, and/or side wager management system for monitoring, recording, and/or side wager outcome determination.

In at least one embodiment, various information relating to the side wagering sessions and/or activities may be tracked and stored (for example, at the side wager management system). Such information may be made available on the gaming network for viewing and/or analysis to various entities, including, for example, but not limited to: players with side wagers placed on them, other players, other SWPs, casino employees, security, components/systems of the casino gaming network, etc.

According to various embodiments, different network devices/systems may be operable to determine side wager outcomes. For example, in one embodiment, the side wager management system may be operable to determine and/or calculate side wager outcomes (e.g., wins, losses, credits, bonuses, points, rewards, etc.) based, for example, on information relating to the monitored side wager activities.

In one embodiment, the determined/calculated side wager outcomes and/or other related information (e.g., wins, losses, credits, bonuses, points, rewards, promotions, player rating data, etc.) may be distributed to appropriate entities. For example. in one embodiment, the Side Wager Management System may report side wager outcome information (e.g., player ID, side wager information, side wager outcome(s)) to various accounting systems in order to credit or debit a given SWP's account based on specified side wager outcome data. In one embodiment, a portion of the side wagers made and/or offered may be withheld for collection by the gaming establishment (i.e. as a rake).

According to specific embodiments, an SWP may be able to select (e.g., via the side wager management system) one or more desired notification type(s) for receiving updated information relating to side wager events. For example, in instances where the SWP is betting on the outcome of another's play, the SWP may not be aware when play ends and the win/loss determined. In a specific embodiment, the SWP may select a first notification type which will enable the gaming network to automatically contact the SWP following termination of a side wager session and/or specified side wager related activity. For example, in one embodiment, the notification may be through a message (e.g., "Congratulations, you've won") generated by the side wager management system. Different notification types may include, for example, one or more of the following (or combinations thereof): overhead signs, messages on the gaming device, sounds, telephone calls, emails, agent notification, flashing lights, pages, displayed images (captured and/or rendered), displayed video content (e.g., captured and/or rendered), and/or other types of communication.

According to specific embodiments, the SWP can monitor play by watching or monitoring content relating to activities associated with the side wager target. In one embodiment, the SWP can monitor a specified side wager target's activities via a display on a mobile or handheld device (e.g., 300). In some embodiments, the SWP may view an overhead image, and/or may monitor by any other visual means available in the casino. In some embodiments, the SWP may monitor a target's activities/game play status via a display window located at the SWP's gaming table. The SWP may also receive messages via a hand-held device that permit him or her to monitor play in longer lasting games.

When play ends, the SWP may be notified of the outcome of play based on a selected notification type. According to one embodiment, the SWP may then be given the option to elect to place another side wager, or to "cash out." In one embodiment, if the SWP decides to make another side wager, the SWP may be presented with new side wager opportunities which have been determined based, at least in part, upon data obtained from the SWP's previous side wager activities and/or other criteria such as specified preferences. According to specific embodiments, when an SWP elects to "cash out," appropriate payouts, winnings, credits, vouchers, etc. may be provided to the SWP via one or more entities such as, for example: a gaming machine, a redemption center, a service desk, a side wager front-end (SWFE) device (e.g., automated kiosk and/or other automated, electronic system), and/or any other cashier service provided by the casino. In one embodiment the SWP may transfer any accrued credits to a new or existing player account using any suitable device(s) which provide authorized access to the desired account(s).

Additionally, in at least one embodiment, the side wager management system (and/or other devices/systems) may report other types of side wager-related information to other systems/devices in the gaming network. For example, the side wager management system may generate a side wager target rating value based on the performance of a selected side wager target during a given side wager session, and may transmit the side wager target rating value to the casino player tracking system. In one embodiment, the player tracking system may use the received side wager target rating value to update a side wager performance rating (and/or other player rating type) associated with the specified target.

According to specific embodiments, selected players may each be assigned a rating, which may be tracked by the gaming network. Player ratings may be computed (e.g., based on historical data, player tracking data, etc.) which may be associated with past play of the wager-based game by each respective player. As games may be played, the player ratings may also be updated in real-time to reflect recent performance that results in a change in the ratings of one or more players.

According to specific embodiments, player ratings may be employed to inform participants of the wager-based game (e.g. SWPs) of the relative successfulness of one or more players. Making the player ratings available to observers may facilitate the determination of side wagering decisions. For example, a lower player rating for a specified time period might indicate to an observer that a particular player is not considered a "hot" player. In specific embodiments, this may warrant better odds for a wager on the event that the player will actually win a particular tournament, game, hand, etc. Information from player ratings may also be combined with an observer's own knowledge in determining whether a side wager should be made.

Player ratings, when applied to multi-player wager-based games, may also offer several advantages. For example, players may benefit in that an additional feature may be available for tracking individual comparative performance. Player ratings may provide a mechanism that allows observers to make more informed side wagers in wager-based games. The provision of side wagering in wager-based games may benefit both the gaming establishment hosting the wager-based game and observers making successful side wagers with an opportunity for increased revenues.

According to specific embodiments, player ratings may be computed in accordance to a variety of pre-defined algorithms or standards. In one embodiment, a first type of player rating may reflect the relative or absolute ranking of game players. Player ratings may also facilitate the division of players into a number of groups, which, for example, may be used, for example, to organize leagues/tournaments, to create distinctive levels of side wager opportunities, etc.

In one embodiment, each player may be provided with the option of whether his rating will be displayed to other participants. For example, in one embodiment, where player ratings are displayed at the option of the players, the players may be provided with a financial incentive (e.g., by the casino) for enabling the display of their respective player ratings. For example, a portion of profits made by the casino from side wagers may be distributed to players who allow their player ratings to be exposed.

The following examples may help to illustrate various features which may be provided according to different embodiments.

According to a first example, a patron may wish to place a side wager on a particular game that is currently in play by another patron. In one embodiment, the patron approaches a slot attendant and requests to be placed as an SWP on the selected machine. The attendant takes the patron's initial buy-in and gives back a receipt. In other embodiments, the side wager may be placed using an automated process, for example, via a SWFE device. In one embodiment, the patron's information and initial buy-in may be stored and adjusted based on the coin in, coin out and jackpot meter movement from the gaming machine. The patron may wish to discontinue the side wagering session at a desired time. Accordingly, the patron may then take the receipt to a redemption station and receive the remaining balance of their stake.

In another example, Patron A chooses to start a side wager session on a 5× Pay $1 slot currently being played by Patron B. Patron A selects his playing criteria (e.g., as described previously), makes a $100 wager for a two hour side wager session, and receives a receipt (e.g., from a SWFE device or agent through which he established the side wager). According to at least one embodiment, during the active side wager session, one or more side wagers may be automatically placed (e.g., by the Side Wager Management System) on behalf of Patron A. For example, in one embodiment, the side wagers which are automatically placed on behalf of Patron A may mirrors the wager(s) which are placed by Patron B at the EGM being played by Patron B.

At the end of the two hours, it may be assumed that Patron B has won $150 over one or more games. Patron A may now redeem his receipt or transfer his winnings to his player account (if available). Depending on parameters established by the casino, Patron A may be allocated a win of $150 (based on the outcome of the side wager session), which matches the winnings of Patron B. Alternatively, depending on parameters established by the casino, Patron A may be allocated a win for a lesser percentage (e.g., in embodiments where the casino takes a percentage or rake), or a greater percentage (e.g., in embodiments where a winnings multiplier is offered as a promotion to the SWP). The ratios for the win or loss experienced by the side wagering patron (e.g., Patron A) relative to the win or experienced by the target patron (e.g., Patron B) may be any desired percentage or multiple established by the casino.

According to specific embodiments, multiple concurrent side wager sessions (for multiple SWPs) may be active for one or more common targets. For example, multiple side wagers may place their own side wagers on Patron B concurrently while the side wager session for Player A is still active. In one embodiment, outcomes for each individual side wager session may be calculated independently of other side wager session outcomes. Thus, in one embodiment, Player A's side wagering stake will increase or decrease based solely on coin in, coin out and the jackpot meter of the EGM played by Patron B.

Also, in at least one implementation, Patron B may not be affected in any way by Patron A having an open side wagering session on either Patron B and/or the EGM which Patron B is playing. In at least one embodiment, Patron B may be unaware that side wagering sessions are active on the games or machines that Patron B is playing. Further, in at least some embodiments, Patron A's session may be unaffected by canceled credits or hopper fills, and may continue throughout such events. In addition, any jackpots that are won on the target EGM may also awarded in some proportional amount to each of the affected SWPs.

In a different example, Patron A could establish a side wager session that includes the play of Patrons B-F, and his win, if any, would be the result of the combined play of each patron. In a like manner, Patrons A, C, D, and E could each side wager against the play of Patron B. In one embodiment, there may be no limit, other than limitations imposed on the performance of the network, to the number of patrons that a given SWP may choose to place a side wager on and/or against during a given side wager session. Certain casinos, however, may prefer to limit the number of side wagers placed against a particular player or machine, and/or to place an upper limit on the amount at stake during a given side wager session to prevent multiple winners of mega jackpots or other high dollar payouts.

According to a specific embodiment, a carded SWP with an established player account may be allowed make expedited side wagers based on pre-set criteria customized by the SWP. In one example, the SWP may log into the system by entering a player tracking number, swiping his card, and/or using any other mechanism available for identifying the SWP to the SWFE device (e.g., a biometric, agent assistance, radio signal, etc.) When the SWP logs into the player tracking system, the side wager's pre-configured criteria and/or preferences are displayed, and the SWP is able to initiate one or more side wager sessions. At the end of a side wager session, the SWP may be notified of the outcome of the game, and may be provided with the option to initiate additional side wager sessions, to cash-out, or some combination thereof. If the SWP elects to initiate another side wager session, the SWP may also have the option to continue using his current pre-configured side wager criteria and/or preferences or to modify them, as desired.

According to specific embodiments, there may be many potential options available to patrons who wish to engage in the side wager activities. For example, an upper cap may be set to automatically end a an active side wager session if it is determined that specified criteria has been satisfied such as, for example, but not limited to, one or more of the following (and/or any combination thereof):

- the total win rises to a specified level;
- the total win rises to a percentage of initial stake;
- the total loss reaches a percentage of initial stake;
- session time expired;
- idle time on an EGM reaches a pre-determined length of time;
- player has discontinued play on the selected EGM;
- player not meeting pre-desired conditions begins play on the selected EGM;
- pre-determined time period (e.g., time of day) is reached;
- etc.

In this way, a side wagering patron may not be required manually track his or her active side wager sessions in order, for example, to determine whether appropriate circumstances have occurred for ending a particular active side wager session.

According to specific embodiments, one or more display screens and/or other visual promotions may be provided, for example, to provide side wager related information to casino patrons. For example, in some embodiments, visual promotions may be provided to entice potential SWPs to participate in side wager sessions.

According to specific embodiments, side wagering may be performed by players on the casino floor and/or other locations of the casino using a variety of electronic devices, including, for example, EGMs available for play. Announcements, notifications, and messages can occur via the EGMs, overhead displays, via hand-held computing devices, gaming table displays, via casino personnel, etc., According to specific embodiments, it may be desirable to provide side wagering parlors, salons, or stand-alone or sound-proof rooms where numerous people can congregate to wager on their favorite casino game or players. In this environment, the casino can establish a competitive environment where one or more teams compete against other teams to secure the largest winnings based on side wager play, whether on the casino floor or within the salon, while the teams of SWPs view the action from monitors and displays located within the salon.

According to at least one embodiment, multiple types of wins may be awarded and rewarded by the casino for side wager related activities. Table 1 below provides one example which summarizes different types of events which may represent "wins" in the side wager system. Individual casinos may configure their games to operate as they see fit and/or as are necessary to comply with jurisdictional gaming regulations.

TABLE 1

| Machine Outcome | SWP Behavior | Other Criteria |
|---|---|---|
| Specific Game Outcomes | Points Earned | Lucky Coin |
| Series of Game Outcomes | Win/Loss Per Unit of Time | Lucky Time |
| Sets of Game Outcomes | Handle Per Unit of Time | Lucky Game |
| Consecutive Game Outcomes | Continuous Play | Random Event |
| X outcomes in N tries | | Other Event |
| Outcome sets/unit time | | |
| Outcomes relative to others | | |

In at least some embodiments, the following definitions may be applied to side wager related activities. In a specific embodiment, one or more of the various types of "wins" defined herein may be associated with (or awarded to) one or more SWPs who have placed one or more side wagers on specific target player(s) and/or target device(s). Thus, for example, in one embodiment, a side wager win may be awarded to a particular SWP upon determining that an appropriate side wager win event has occurred for a target player, device and/or event that is associated with a side wager placed by the SWP.

- A "Specific Game Outcomes" win event may occur when a target player or device obtains a predefined result in a game. Examples include, for instance, a "four-of-a-kind" (or a particular four, such as four aces) in a poker game, "seven-seven-seven" in a slot game, or obtaining a particular bonus symbol on one of the reels. An award may be generated when any particular predefined outcome of the game is met, for instance during a specified time period.
- A "Series of Game Outcomes" win event may occur when a target player or device obtains certain results during multiple plays on the gaming machine or series of gaming machines in a predetermined order. One example may be where a target player (or target EGM) obtains, on a video poker machine, a pair, two pairs, three-of-a kind, straight, and flush, in that order but not necessarily consecutively. An award may be generated when any predefined series of results is met, for instance during a specified time period.
- A "Sets of Game Outcomes" win event may occur when a target player or device obtains certain results during multiple plays one or more gaming machines regardless of order. Examples include a target player (or target EGM) receiving a fourth four-of-a-kind on a video poker machine, a target player (or target EGM) obtaining jackpot payouts on each of the possible paylines in a slot-based game, etc. An award may be generated when the last in the predefined set of results is met, for instance during a specified time period.
- A "Consecutive Game Outcomes" win event may occur when a target player or device obtains certain consecutive results during multiple plays on one or more gaming machines. Examples include a target player (or target EGM) obtaining a win on five consecutive hands, a target player (or target EGM) obtaining a win on two consecutive hands containing a minimum level of win (such as, for example, three-of-a-kind) on a video poker machine, a target player (or target EGM) obtaining a particular bonus symbol on the payline of a slot machine three consecutive times, etc. An award may be generated when the last of the predefined consecutive game outcomes is met, such as, for example, when the target player (or target EGM) obtains particular outcomes during a specified time period.

An "X Outcomes in N Tries" win event may occur when a target player or device obtains certain results during multiple plays on one or more gaming machines within a certain number of tries. Examples include a target player (or target EGM) obtaining both a straight and a flush within five games of one another, but not necessarily consecutively or in that order. Another example may be where a target player (or target EGM) obtains seven-seven-seven during the first 50 plays of a particular slot machine. An award may be generated when the "xth" outcome may be reached by the target player (or target EGM), for instance during a specified time period.

An "Outcome Sets/Unit Time" win event may occur when a target player or device obtains certain results during multiple plays on one or more gaming machines primary game within a set period of time. Examples include a target player (or target EGM) obtaining 10 jackpot awards on a slot machine within a ten minute period, a target player (or target EGM) obtaining three flushes within a one-hour period on a video poker machine, a target player having the most awards as of a specified time, etc.

An "Outcomes Relative to Others" win event may occur when a target player or device obtains a certain result or results on one or more gaming devices before (or after) other players at a specified group of games, for example during the period of a bonus cycle or tournament play. Examples include the target player (or target EGM) with the highest or lowest rank or rating of a selected group of players and/or EGMs as of a specified time.

A "Points Earned" win event may occur when a target player or device earns a certain number of points on one or more gaming devices, such as, for example: bonus points, extra credit points, machine credits, promotional credits, etc. An award may be generated for example to the SWP with the most points as of a specified time.

A "Win/Loss Per Unit of Time" win event may occur when a target player or device obtains a certain number of wins or loses on one or more gaming devices over a predetermined time period. Examples include a target player (or target EGM) losing 100 times over a 20 minute time period, winning 7 times over a one-minute period, having the most wins or losses during a specified time period, etc.

A "Handle Per Unit of Time" win event may occur when a target player or devices bets a certain amount over a certain time period on one or more machines. Examples include a target player betting at least a total of $500 at a slot machine over a one-hour period, a target player betting his/her $1000^{th}$ coin at a nickel poker machine, 500 spins occurring at a target EGM over a specified time period, a target EGM with the largest handle during a specified time period, etc.

A "Continuous Play" win event may occur when a target player or device has continuously played on a machine, or series of machines, for a specified amount of time. For example, the award might be given to a target player (or target EGM) with the most continuous play during a specified time period.

A "Lucky Coin" win event may occur when a target player inserts (or a target EGM has inserted therein) an $x^{th}$ coin-in on a certain pre-designated portion of the games coupled to the gaming network. An award may be generated when the coin is inserted or credit otherwise transferred. For instance, the target player inserting the $x^{th}$ coin during a specified time period.

A "Lucky Time" win event may occur for a target player or device playing at a designated time or randomly selected time of day.

A "Lucky Game" win event may occur for a target player or device that may be engaged in a preselected or randomly selected game theme at one or more gaming devices coupled to the gaming network.

A "Random Event" win event may occur based on randomly selected criteria.

A "Other Event" win event may occur based on one or more events occurring which meet predetermined or selected criteria.

It will be appreciated that the above-described terms represent only a small sample of potential types of wins that may be contemplated, and that other embodiments may differ from those disclosed and described herein. Additionally, in at least one embodiment, a side wager may also be based on and/or related to game play activity conducted by the SWP. Other embodiments could conceivably use any data accessible anywhere within the casino and/or gaming network.

According to specific embodiments, winning outcomes need not be applied uniformly to all of the different types of possible side wager targets of the gaming network. For example, there may be different side wager winning events for different groups of gaming devices. For example, a first set of winning events could apply to one group of EGMs, but not to a second group of EGMs. As an illustrative example, there could be a winning event implemented, such as generating a drawing ticket after "x" minutes of play, where "x" may be 40 minutes for EGMs of Group A, 50 minutes for EGMs of Group B, and 60 minutes for EGMs of Group C. In at least some embodiments, one or more of the EGMs within the gaming network could have associated therewith one or more side wager related wining events that are different from other side wager related winning events associated with other EGMs in the gaming network.

In at least some embodiments, there may be different side wager winning events available to persons or groups of people (such as, for example, individual SWPs and/or SWP groupings). For instance, certain side wager related winning events could be set up for specific SWPs who have signed up for player tracking, while another set of winning events may be applied to other SWPs and/or patrons.

Using one or more of the various techniques described herein, casinos may increase player wagering activities during desired time periods. Additionally, using one or more of the various techniques described herein, casinos may provide incentives and mechanisms for increasing player gaming activities on less frequently played EGMs, and/or for increasing access to other types of wagers available in the casino. For example, according to one embodiment, by allowing SWPs to use otherwise stagnant machines to initiate and perform side wager activities relating to more popular EGMs, gaming tables, and/or game themes, casinos may increase gaming opportunities for players (e.g., SWPs), even during peak hours or when the popular EGMs/gaming tables are already in play, and realize greater revenues.

Further, in at least one embodiment, casinos may advertise side wagering opportunities in advance, and may also promote to players and/or potential SWPs that sufficient gaming resources exist for players to wager on their target(s) of choice, even during peak hours. This, in turn, may help to create a more interactive and entertaining environment for players, including, for example, players who may prefer salon wagering environments. As a result, casinos may be able to appeal to a wider variety of players, including those who would like to socialize while simultaneously participating in wagering opportunities on the casino floor. Further, by being able to accommodate more players using fewer machines, casinos can maximize their profits while minimizing the concomitant overhead.

In some embodiments, it may be preferable to permit side wagering only on selected target(s) which match predefined criteria such as, for example, various criteria described herein.

Various techniques described herein may be used to enable a casino to substantially increase handle on games without necessarily increasing the actual number of games themselves. Further, different embodiments may be used in conjunction with player tracking devices or other devices in order, for example, to allow patrons who are side wagering to be awarded points, bonuses, comps, and/or other promotions based on their side wagering activities and/or game play activities. In one embodiment, side wagering sessions may be tracked, monitored, and/or audited using automated mechanisms, manual mechanisms, and/or some combination thereof.

According to a specific embodiment, if at any point the SWP's stake reaches zero, the SWP's side wager session record may be updated as "inactive," and may also be updated with a timestamp marking the completed time, number of games played, etc., if desired.

In some embodiments, if the SWP's stake reflects a positive monetary value, the received updates from the event notification system may be used to update the SWP's side wager session (e.g., by increasing or decreasing the SWP's stake, as appropriate). This may continue until some event (or combination of events/conditions) occurs for ending the side wager session (such as, for example, SWP's account value reaches zero, SWP's account value reaches a predetermined value, player elects to end session, end session time reached, etc.).

It will be appreciated that various side wager related embodiments described herein may provide a number of features, benefits and/or advantages. At least a portion of such features, benefits and/or advantages are describe below.

For example, one feature relates to the ability for patrons to participate in wagering activities for any desired gaming machine, even if the desired gaming machine is currently being used by another player. Another feature relates to the ability for patrons to participate in wagering activities for any desired table game, even if the maximum capacity of players at the desired table game has been reached.

Another feature relates to the ability for side wagering activity to be conducted by patrons from different physical locations. For example, in one embodiment, a patron who wishes to place a side wager on a particular target may not need to be physically present at or near the target in order for the side wager to be placed, and the side wager session to be activated/started. Similarly, the side wagering patron need not be physically present collect his or her winnings.

Another feature relates to the ability for side wagering enrollment, placement and/or redemption activities to be implemented using wireless technology. Such wireless technology may also allow floor persons to identify, approach, and/or offer selected patrons (e.g., patrons waiting to play a particular game or machine) an opportunity to currently or timely place one or more side wagers on the current game.

Another feature relates to the ability for allowing a patron to concurrently place multiple separate side wagers on the same target and/or on multiple different targets.

Another feature relates to the ability for allowing casinos to offer targeted bonuses to potential side wagering patrons in order, for example, to increase handle on EGMs and/or other potential side wager targets that are underperforming.

Another feature relates to the ability for allowing casinos to cap jackpot and/or other payout amounts for side wager sessions, which may further increase casino revenue.

Another feature relates to the ability for allowing unclaimed money within the system (e.g., money relating to side wager wins) to expire after a predetermined time period. In one embodiment, after the expiration of an unclaimed side wager win, the casino may claim the unclaimed money.

Another feature relates to the ability for allowing casinos to offer different point accrual rates for side wagering patrons. Such a feature may be used, for example, to lower the cost per player. For example, in one embodiment, a primary player may accrue points based on a first criteria set (e.g., one point per dollar of wager), while side wagering patrons may accrue points based on a second criteria set (e.g., 2 points per 3 dollars wagered). In this particular example, the overall liability to those patrons who are side wagering patrons may be less the overall liability to primary players.

Another feature relates to the ability for allowing casinos to provide selected patron access to dedicated rooms which may be used to engage in side wager related activities.

Another advantage of the various side wager related techniques described herein relates to the ability for new ways for a casino to generate additional revenue.

Another advantage relates to the ability for casinos to increase income without adding new EGMs and/or new gaming tables, since, for example, according to at least some embodiments, it may be possible for casinos to at full utilization (e.g., all EGMs/gaming tables are in play) while concurrently allowing side wagers to be placed.

Another advantage relates to the ability for casinos to achieve increased income without necessarily increasing other related expenses such as, for example, maintenance expenses (which, for example, may be increased if additional physical EGMs and/or gaming tables were added to the casino floor).

Another advantage relates to increased marketing opportunities which are available to casinos. For example, according to specific embodiments, a casino may offer free meals, bonus cash, points and/or promotional items to entice patrons to engage in side wager activities.

Another advantage relates to the ability to enable players to, place side wagers in addition to their primary game, thereby increasing number of wager/minute.

Another advantage relates to the ability to enable players to watch remote gameplay relating to one or more side wagers, thereby increasing excitement and communal aspects of gaming Another advantage relates to the ability to enable new game types to be created that can leverage existing server based and system architectures to drive up casino revenue.

Another advantage relates to the ability to enable casino participants and/or non-primary players of a casino game to place wagers on the outcome of a game played by another person or entity.

By way of illustration, the following examples are intended to help illustrate various aspects and/were features relating to the distributed side wager techniques described herein.

EXAMPLE

Blackjack Side Wager Example

Floyd Davis and James Cullen are friends, and are playing together in a gaming table lounge. Both are sitting at separate tables. Floyd decides he wants to play a second game while he's playing blackjack on Table #1 with three other players at his table. In this example, it is assumed that each player at the gaming tables is provided with an interactive display. After Floyd's play turn is over, he uses his interactive display to access an electronic game menu, scrolling past Keno and other games. He sees one called "SIDE WAGER" and selects it. After the selection, Floyd's interactive display shows an interactive virtual map which depicts the gaming table lounge where both he and James are playing. The interactive map shows Floyd's table as well as other gaming tables in the gaming table lounge. Floyd directs the interactive display to zoom in on a selected gaming table in order to view player positions (and associated player) at that table. The screen instructions explained to Floyd how to place an even money "side wager" on another (target) player's hand before the target player's next hand is dealt. The minimum bet is $5. Floyd places the bet on James's position on Table #2, and selects that he will play this bet four times, for a total of $20, spread over four hands. The side wager is a simple "win/lose." In other words, if James wins the hand, Floyd gets paid even money on his $5 wager. If James loses the hand, Floyd loses the $5 side wager which he placed on that hand. Using his interactive display, Floyd places the side wagers, and the $20 is automatically deducted from his credits (and/or credit account). Floyd then dismisses the window and goes back to playing his regular (primary) game at his current gaming table. A few minutes later, Floyd gets an alert that his four side wagers all won, and that $40 has been posted to Floyd's credit meter.

James hears Floyd chuckle, and Floyd explains how the whole side wagering works. James accesses the Game menu between turns of blackjack play, and realizes that not only can he bet on other tables, he can bet on players on his own table. To impress one of the women playing at his table, James explains he's going to bet on her to win. He makes a series of ten bets (which, in this example is the maximum allowed for any turn). After the woman has played (and lost) 2 hands, the woman's husband arrives from the nearby poker room and the woman cashes out and leaves. James receives an alert which tells him that he has lost 2 of the 10 side wagers, and that the other wagers could not get the place because the target (woman player) is currently unavailable. James is offered the choice to: (1) refund the remaining wagers that were never placed; (2) keep the wagers pending, and place the wagers on the same target if the target becomes available within a predetermined time period; (3) modify one or more wagers; or (4) selecting a new target. James elects to have the remaining wagers refunded, whereupon the remaining 8 side wagers relating to hands that were never played are automatically refunded to James's credit meter. James then decides to select Floyd as a target player for a series of two side wagers. After, James wins the first side wager, he decides to leave his table. James is offered the choice to: (1) refund the remaining wager(s) that were never placed; (2) allow the remaining side wagers to be placed even after James cashes out from the current gaming table. James elects to allow the remaining side wager to be placed even after James cashes out from his current gaming table. A few minutes later, James receives a text message alert on his cell phone indicating that he has won the second side wager, and that the win payout has been credited to James's credit account.

Meanwhile, Floyd has gone crazy with the side wagering, showing players his "screen in screen" monitor of side wagering play he's engaged in. He loses a series of hands, but wins every side wager. James walks over and wants to leave. Floyd hands him a parlay card and tells him to go make the sports bet for him, as he's on a roll.

Automated Table Game State Tracking

As described previously, in at least one embodiment, the game state tracking system 1308 may be operable to track game state information (and/or other gaming related information) associated with one or more specified gaming tables and/or EGMs. In some embodiments, selected intelligent gaming tables may each include their own respective game state tracking system which tracks game state information (and/or other gaming related information) associated with that intelligent gaming table. In some embodiments, selected EGMs may each include own respective game state tracking system which tracks game state information (and/or other gaming related information) associated with that EGM. In some embodiments, one or more gaming servers may each include a respective state tracking system which tracks game state information (and/or other gaming related information) associated with selected EGMs and/or gaming tables.

In at least one embodiment, one or more game state tracking systems may be operable to facilitate table game state tracking.

Conventional techniques for tracking table game play states are typically implemented using manual (e.g., human implemented) mechanisms. For example, in many cases, game states are part of the processes observed by a floor supervisor and manually tracked. Accordingly, one aspect is directed to various techniques for implementing and/or facilitating automated table game state tracking at live casino table games.

According to specific embodiments, a variety of different game states may be used to characterize the state of current and/or past events which are occurring (or have occurred) at a selected gaming table. For example, in one embodiment, at any given time in a game, at least one valid current game state may be used to characterize the state of game play (and/or other related events/conditions, such as, for example, mode of operation of the gaming table, and/or other events disclosed herein) at particular instance in time at a given gaming table.

In at least one embodiment, multiple different states may be used to characterize different states or events which occur at the gaming table at any given time. In one embodiment, when faced with ambiguity of game state, a single state embodiment may be used to force a decision such that one valid current game state may be selected or preferred. In a multiple state embodiments, multiple possible game states may exist concurrently or simultaneously at any given time in a table game, and at the end of the game (and/or at any point in the middle of the game), the gaming table may be operable to automatically analyze the different game states and select one of them, based on specific criteria, to represent the current or dominant game state at that time. Thus, for example, when faced with ambiguity of game state, the multiple state embodiment(s) may allow all potential game states to exist and move forward, thus deferring the decision of choosing one game state to a later point in the game. The multiple game state embodiment(s) may also be more effective in handling ambiguous data and/or ambiguous game state scenarios.

According to specific embodiments, a variety of different components, systems, and/or other electronic entities may be used (e.g., either singly or in combination) to track the progress of game states may which occur at a given gaming table. Examples of such entities may include, but are not limited to, one or more of the following (or combination thereof): master table controller, local game tracking component(s) (e.g., residing locally at the gaming table), remote game tracking component(s), etc. According to a specific embodiment, local game tracking components at the gaming table may be operable to automatically monitor game play, wagering, and/or other activities at the gaming table, and/or may be operable to automatically identify key conditions and/or events which may trigger a transition of game state at the gaming table from one state to another as a game progresses. Depending upon the type of game being played at the gaming table, examples of possible key events/conditions may include, but are not limited to, one or more of the following (or combinations thereof):

- start of a new hand/round;
- end of a current hand/round;
- start of a roulette wheel spin;
- game start event;
- game end event;
- initial wager period start;
- initial wager period end;
- initial deal period start;
- initial deal period end;
- player card draw/decision period start;
- player card draw/decision period end;
- subsequent wager period start;
- subsequent wager period end;
- rake period start;
- rake period end;
- payout period start;
- payout period end;
- buy-in event;
- win event (e.g., game win, bonus win, side wager win, etc.);
- push event;
- new hand start event;
- hand end event;
- new round start event;
- round end event;
- etc.

According to different embodiments, the various automated table game state tracking techniques described herein may be utilized to automatically detect and/or track game states (and/or other associated states of operation) at a variety of different types of "live" casino table games. In at least one embodiment, a live table game may be characterized as a wager-based game which is conducted at a physical gaming table (e.g., typically located on the casino floor). Further in at least one embodiment, the live table game may be conducted on a non-electronic gaming surface, and/or may include participation of physically present players who engage in wagering activities at the gaming table using physical wagering tokens (e.g., gaming chips). Various examples of live table games may include, but are not limited to, one or more of the following (or combinations thereof): blackjack, craps, poker (including different variations of poker), baccarat, roulette, pai gow, sic bo, fantan, and/or other types of wager-based table games conducted at gaming establishments (e.g., casinos).

Table Game State Examples

As noted previously, different types of live table games may have associated therewith different types of events/conditions which may trigger the change of one or more game states. For purposes of illustration, examples of different types of live table games are described below, along with examples of their associated events/conditions.

Blackjack

In at least one embodiment, a table game state tracking system may be operable to automatically monitor game play, wagering, and/or other activities at a blackjack gaming table, and/or may be operable to automatically identify key conditions and/or events which may trigger a transition of one or more states (e.g., table state(s), game state(s), wagering state(s), etc.) at the gaming table from one state to another.

For example, in the case of a blackjack table game, such key events or conditions may include one or more of the conditions/events criteria stated above, and/or may include, but are not limited to, one or more of the following (or combinations thereof):

- side bet event (e.g., double down, insurance, surrender, split, etc.);
- dealer change;
- reshuffle;
- beginning of deck/shoe;
- dead game state;
- start of hand;
- start of round;
- start of game;
- start of player's hand;
- start of player's round;
- player bust event;
- dealer bust event;
- push event;
- player blackjack;
- dealer blackjack;
- player "hit me" event;
- player "stand" event;
- misdeal;
- buy-in event;
- marker-in event;
- credit-in event;
- house tray fill event (e.g., dealer's chip tray re-stocked with additional gaming chips);
- promotion event;
- bonus win event;
- new card being added to a player's hand;
- new card dealt from a shoe/deck;
- removal or disappearance of a card by occlusion,
- tip event (e.g., player tips dealer);
- toke event (e.g., dealer receives tip from player and allows tip to be placed as wager, based on outcome of player's hand);
- tournament play event;
- re-buy event;
- etc.

According to different embodiments, selected game state(s) which occur at a blackjack table game may be tracked at various levels such as, for example, one or more of the following (or combinations thereof): table level, individual the player level, dealer level; etc. In at least one embodiment, multiple states of activity at the blackjack gaming table may be tracked simultaneously or concurrently. For example, in one embodiment, separate instances of the Table Game State Tracking Procedure may be concurrently initiated for tracking table game state information relating to each respective, active player at the gaming table. In some embodiments, a single instance of the Table Game State Tracking Procedure may be operable to track table game state information relating to all (or selected) states which may occur at (and/or may be associated with) the gaming table. In one embodiment, this may include, for example, tracking table game state information relating to multiple players at the gaming table.

Craps

In at least one embodiment, a table game state tracking system may be operable to automatically monitor game play, wagering, and/or other activities at a craps gaming table, and/or may be operable to automatically identify key conditions and/or events which may trigger a transition of one or more states (e.g., table state(s), game state(s), wagering state(s), etc.) at the gaming table from one state to another.

For example, in the case of a craps table game, such key events or conditions may include one or more of the conditions/events criteria stated above, and/or may include, but are not limited to, one or more of the following (or combinations thereof):

- dice roll event;
- change of shooter;
- wagering not permitted;
- wagering permitted;
- wagers locked;
- change of dice;
- early termination of shooter;
- dice off table;
- dice rolling;
- dice stopped;
- dice hit back wall;
- dice roll exceeds minimum threshold criteria;
- bet lock event;
- game start event (e.g., new shooter=new game start);
- game end event (such as, for example: dice roll=7, shooter hits number, etc.)
- etc.

According to different embodiments, selected game state(s) which occur at a craps table game may be tracked at various levels such as, for example, one or more of the following (or combinations thereof): table level, individual the player level, dealer level; etc. In at least one embodiment, multiple states of activity at the craps gaming table may be tracked simultaneously or concurrently. For example, in some embodiments, a single instance of the Table Game State Tracking Procedure may be operable to track table game state information relating to all (or selected) states which may occur at (and/or may be associated with) the gaming table. In one embodiment, this may include, for example, tracking table game state information relating to multiple players at the gaming table.

Poker

In at least one embodiment, a table game state tracking system may be operable to automatically monitor game play, wagering, and/or other activities at a poker gaming table, and/or may be operable to automatically identify key conditions and/or events which may trigger a transition of one or more states (e.g., table state(s), game state(s), wagering state(s), etc.) at the gaming table from one state to another.

For example, in the case of a poker table game (which, for example, may correspond to one of a variety of different poker game types such as, for example, Hold'em Poker Games, Draw Poker Games, Guts Poker Games, Stud Poker Games, and/or other carnival type card-based casino table games), such key events or conditions may include one or more of the conditions/events criteria stated above, and/or may include, but are not limited to, one or more of the following (or combinations thereof):

- player fold;
- player call;
- player ante-in;
- push event;
- etc.

According to different embodiments, selected game state(s) which occur at a poker table game may be tracked at various levels such as, for example, one or more of the following (or combinations thereof): table level, individual the player level, dealer level; etc. In at least one embodiment, multiple states of activity at the poker gaming table may be tracked simultaneously or concurrently. For example, in one embodiment, separate instances of the Table Game State Tracking Procedure may be concurrently initiated for tracking table game state information relating to each respective, active player at the gaming table. In some embodiments, a single instance of the Table Game State Tracking Procedure may be operable to track table game state information relating to all (or selected) states which may occur at (and/or may be associated with) the gaming table. In one embodiment, this may include, for example, tracking table game state information relating to multiple players at the gaming table.

Baccarat

In at least one embodiment, a table game state tracking system may be operable to automatically monitor game play, wagering, and/or other activities at a baccarat gaming table, and/or may be operable to automatically identify key conditions and/or events which may trigger a transition of one or more states (e.g., table state(s), game state(s), wagering state(s), etc.) at the gaming table from one state to another.

For example, in the case of a baccarat table game, such key events or conditions may include one or more of the conditions/events criteria stated above, and/or may include, but are not limited to, one or more of the following (or combinations thereof):

- side bet event;
- shoe count;
- shoe change;
- card dealt;
- shoe shuffle;
- free hand condition (e.g., actual game with no wagers);
- tie/push event;
- bonus event;
- promotion event;
- etc.

According to different embodiments, selected game state(s) which occur at a baccarat table game may be tracked at various levels such as, for example, one or more of the following (or combinations thereof): table level, individual the player level, dealer level; etc. In at least one embodiment, multiple states of activity at the baccarat gaming table may be tracked simultaneously or concurrently. For example, in one embodiment, separate instances of the Table Game State Tracking Procedure may be concurrently initiated for tracking table game state information relating to each respective, active player at the gaming table. In some embodiments, a single instance of the Table Game State Tracking Procedure may be operable to track table game state information relating to all (or selected) states which may occur at (and/or may be associated with) the gaming table. In one embodiment, this may include, for example, tracking table game state information relating to multiple players at the gaming table.

Roulette

In at least one embodiment, a table game state tracking system may be operable to automatically monitor game play, wagering, and/or other activities at a roulette gaming table, and/or may be operable to automatically identify key conditions and/or events which may trigger a transition of one or more states (e.g., table state(s), game state(s), wagering state(s), etc.) at the gaming table from one state to another.

For example, in the case of a roulette table game, such key events or conditions may include one or more of the condition/event criteria stated above, and/or may include, but are not limited to, one or more of the following (or combinations thereof):

wager lock event;

wheel spin event;

ball drop event;

game outcome event;

etc.

According to different embodiments, selected game state(s) which occur at a roulette table game may be tracked at various levels such as, for example, one or more of the following (or combinations thereof): table level, individual the player level, dealer level; etc. In at least one embodiment, multiple states of activity at the roulette gaming table may be tracked simultaneously or concurrently. In some embodiments, a single instance of the Table Game State Tracking Procedure may be operable to track table game state information relating to all (or selected) states which may occur at (and/or may be associated with) the gaming table. In one embodiment, this may include, for example, tracking table game state information relating to multiple players at the gaming table.

Pai Gow

In at least one embodiment, a table game state tracking system may be operable to automatically monitor game play, wagering, and/or other activities at a Pai Gow gaming table, and/or may be operable to automatically identify key conditions and/or events which may trigger a transition of one or more states (e.g., table state(s), game state(s), wagering state(s), etc.) at the gaming table from one state to another.

For example, in the case of a Pai Gow table game, such key events or conditions may include one or more of the condition/event criteria stated above, and/or may include, but are not limited to, one or more of the following (or combinations thereof):

hand setting decision event (e.g., player makes high/low hand decision);

etc.

According to different embodiments, selected game state(s) which occur at a Pai Gow table game may be tracked at various levels such as, for example, one or more of the following (or combinations thereof): table level, individual the player level, dealer level; etc. In at least one embodiment, multiple states of activity at the Pai Gow gaming table may be tracked simultaneously or concurrently. For example, in one embodiment, separate instances of the Table Game State Tracking Procedure may be concurrently initiated for tracking table game state information relating to each respective, active player at the gaming table. In some embodiments, a single instance of the Table Game State Tracking Procedure may be operable to track table game state information relating to all (or selected) states which may occur at (and/or may be associated with) the gaming table. In one embodiment, this may include, for example, tracking table game state information relating to multiple players at the gaming table.

Sic Bo

In at least one embodiment, a table game state tracking system may be operable to automatically monitor game play, wagering, and/or other activities at a Sic Bo gaming table, and/or may be operable to automatically identify key conditions and/or events which may trigger a transition of one or more states (e.g., table state(s), game state(s), wagering state(s), etc.) at the gaming table from one state to another. For example, in the case of a Sic Bo table game, such key events or conditions may include one or more of the condition/event criteria stated above.

According to different embodiments, selected game state(s) which occur at a Sic Bo table game may be tracked at various levels such as, for example, one or more of the following (or combinations thereof): table level, individual the player level, dealer level; etc. In at least one embodiment, multiple states of activity at the Sic Bo gaming table may be tracked simultaneously or concurrently. For example, in one embodiment, separate instances of the Table Game State Tracking Procedure may be concurrently initiated for tracking table game state information relating to each respective, active player at the gaming table. In some embodiments, a single instance of the Table Game State Tracking Procedure may be operable to track table game state information relating to all (or selected) states which may occur at (and/or may be associated with) the gaming table. In one embodiment, this may include, for example, tracking table game state information relating to multiple players at the gaming table.

Fantan

In at least one embodiment, a table game state tracking system may be operable to automatically monitor game play, wagering, and/or other activities at a Fantan gaming table, and/or may be operable to automatically identify key conditions and/or events which may trigger a transition of one or more states (e.g., table state(s), game state(s), wagering state(s), etc.) at the gaming table from one state to another. For example, in the case of a Fantan table game, such key events or conditions may include one or more of the condition/event criteria stated above.

According to different embodiments, selected game state(s) which occur at a Fantan table game may be tracked at various levels such as, for example, one or more of the following (or combinations thereof): table level, individual the player level, dealer level; etc. In at least one embodiment, multiple states of activity at the Fantan gaming table may be tracked simultaneously or concurrently. For example, in one embodiment, separate instances of the Table Game State Tracking Procedure may be concurrently initiated for tracking table game state information relating to each respective, active player at the gaming table. In some embodiments, a single instance of the Table Game State Tracking Procedure may be operable to track table game state information relating to all (or selected) states which may occur at (and/or may be associated with) the gaming table. In one embodiment, this may include, for example, tracking table game state information relating to multiple players at the gaming table.

User Interface System Examples

FIGS. 14-22 illustrate example embodiments of various different user interface systems which may be used, for example, by an SWP, for implementing various side wager-related operations. In at least one embodiment, one or more user interface systems may be implemented at a wireless or mobile device and used by an SWP for performing various side wager-related operations. In other embodiments, user interface system 1400 may be implemented at other devices/systems such as, for example, one or more of the following (or combinations thereof): EGMs, gaming tables, kiosks, etc. For example, in one embodiment, a separate user interface system 1400 may be provided at each player station at a gaming table to provide each player at the gaming table access to side wager functionality.

Figure 14:
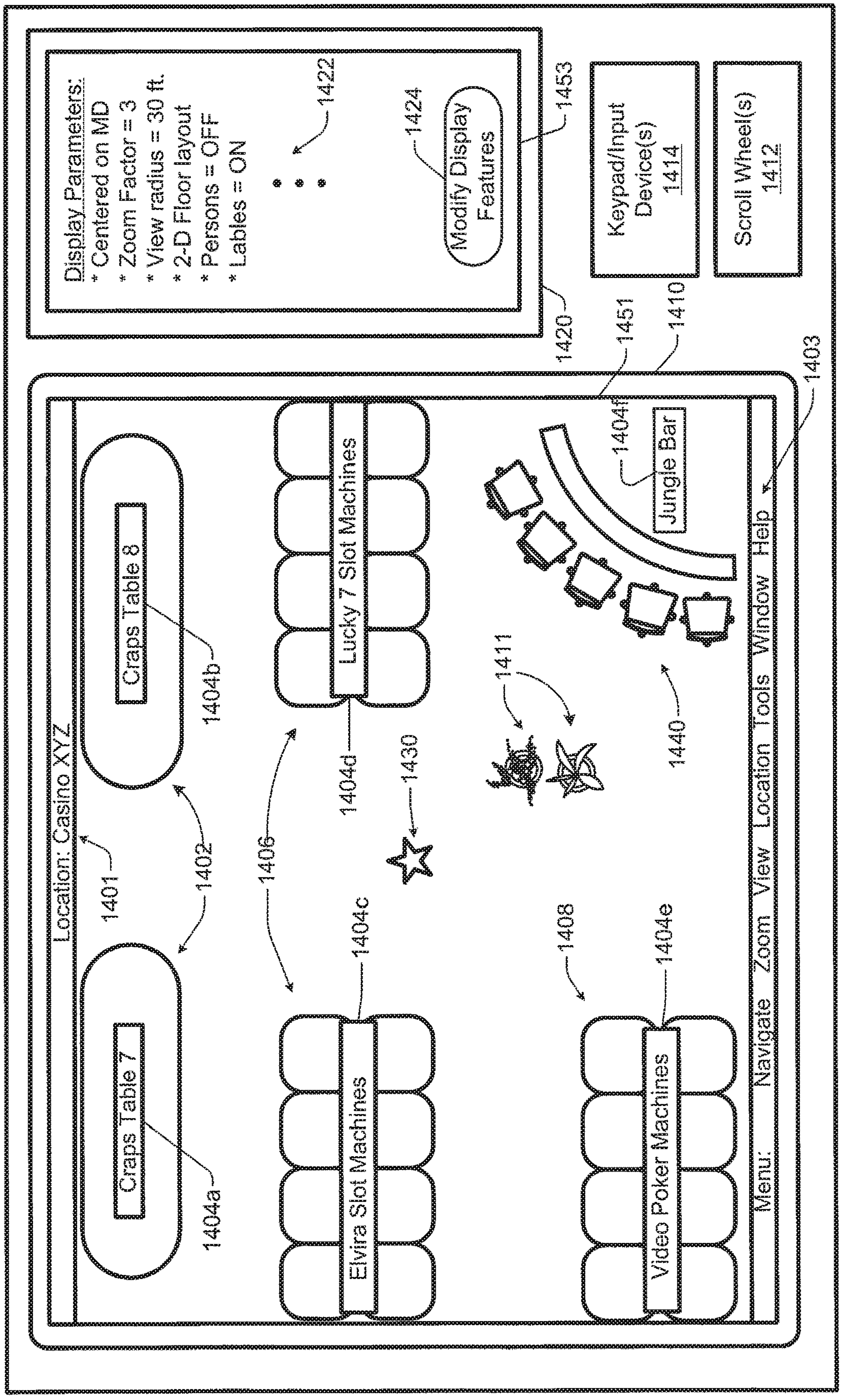
FIGS. 14-22 illustrate example embodiments of various different user interface systems which may be used, for example, by a patron, for implementing various side wager-related operations.

FIG. 14 shows a specific embodiment of a user interface system 1400 which may be used, for example, by an SWP, for implementing various side wager-related operations.

As illustrated in the example of FIG. 14, user interface system 1400 may include a primary display 1410. In some embodiments, user interface system 1400 may also include one or more auxiliary displays 1406, and/or one or more user input devices (e.g., 1412, 1414) such as, for example, keys, buttons, scroll wheels, jog wheels, touch screens, cursors, joysticks, touchpads, etc.

In the example of FIG. 14, there is provided a graphical user interface 1451 within the primary display 1410. In one embodiment, the graphical user interface 1451 is arranged to display information provided by an application or function which generates casino environment image information. In addition, in one or more embodiments, the graphical user interface 1451 is arranged to display information provided from other applications or functions, and particularly those associated with individual functions or systems of a casino.

In a preferred embodiment, the graphical user interface (GUI) 1451 includes a main window adapted to display a variety of objects having a variety of shapes and sizes. In a preferred embodiment, when displayed, the main window may be adapted to provide gaming system environment information for facilitating interaction with an application executed by or function being performed by the user interface system 1400 and/or one or more other devices.

As shown in the example of FIG. 14, GUI 1451 may be adapted to display a two-dimensional or three-dimensional representation of a gaming environment. The specific embodiment illustrated in FIG. 14 corresponds to a two-dimensional gaming environment representation. In at least one implementation, the representation of the gaming environment displayed in GUI 1451 may include information which has been filtered and/or customized based on a variety of different filter parameters such as those described herein and/or other filter parameters which are commonly know to one having ordinary skill in the art. For example, as illustrated in the example of FIG. 14, the information displayed in GUI 1451 may include:

- Objects representing individual gaming machines and/or banks of gaming machines (e.g., 1406, 1408).
- Objects representing game tables (e.g., 1402) and/or other non-electronic game play stations.
- Labels (e.g., 1404*a-f*) for use in identifying different objects displayed in GUI 1451.
- Objects representing user interface systems (e.g., 1430).
- Objects representing persons in the gaming environment (not shown) such as, for example, players, casino employees, etc.
- Objects representing physical features of the gaming environment (e.g., plants 1411, chairs and bar 1414).
- Information (e.g., 1401) relating to the location or portion of the of the gaming environment being displayed.
- Menu Information (e.g., 1403) adapted to provide the user with access to different features and functionalities provided by the user interface system 1400.

Figure 15:
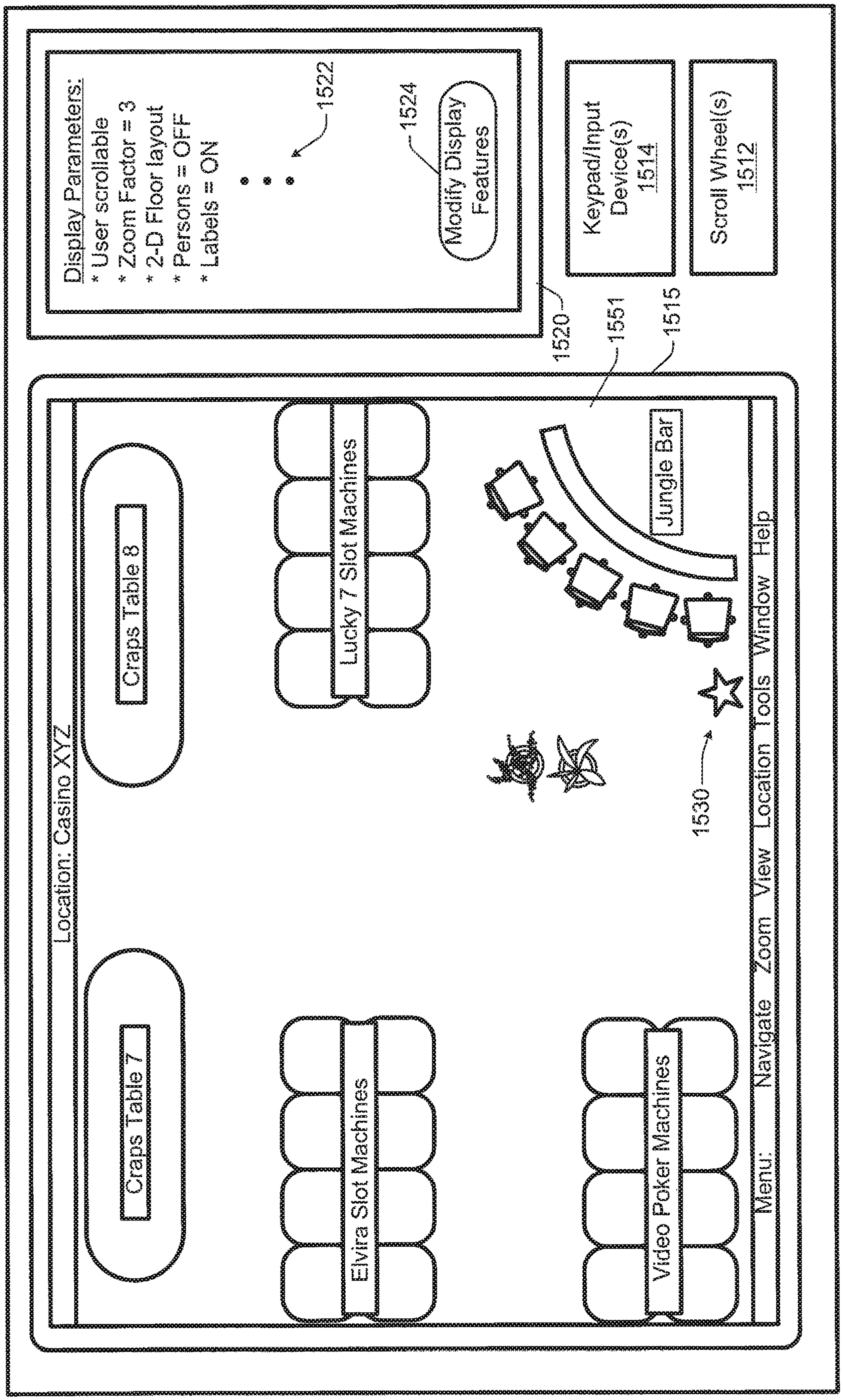

For purposes of illustration it is assumed in the examples of FIGS. 14-15 that the user interface system 1400, 1500 are implemented at a wireless mobile device which, for example, may be in the possession of an SWP.

As illustrated in the example of FIG. 14, at least a portion of the different filter parameters may be displayed to the user, for example, via auxiliary display 1420 and GUI 1453. For example, as shown at 1422, the user is provided with information relating to enabled and/or disabled filter parameters which are being used (or not being used) for generating the filtered information displayed in GUI 1451. In this particular example, the displayed filter parameters shown at 1422 indicate the following with regard to the information displayed in GUI 1451:

- The information displayed within GUI 1451 is dynamically and automatically modified based on the current position of the user interface system (indicated by icon 1430), which, in this example, is positioned in the center of GUI 1451. According to a specific embodiment, as the user moves around the casino floor with the user interface system, the user interface system icon 1430 will remain in the center of GUI 1451 while the positions of other objects displayed in GUI 1451 will automatically and dynamically change to reflect their current positions relative to the user interface system.
- The information displayed within GUI 1451 has been filtered to show only a portion of the casino gaming environment which is within an approximate radius of 30 feet from the current position of the user interface system.
- The information displayed within GUI 1451 is rendered as a 2-dimensional representation of the gaming environment.
- A "Display Labels" feature is enabled to allow label information (e.g., 1404*a-f*) to be included in the information displayed in GUI 1451.
- A "Display Persons" feature has been disabled, which prevents information relating to persons located in the displayed gaming environment (e.g., players, casino employees, etc.) from being displayed or represented in GUI 1451.
- The portion of the gaming environment displayed in GUI 1451 corresponds to a relative Zoom Factor of 3. In the examples illustrated in FIGS. 14-21, it is assumed that a relatively lower Zoom Factor value results in a more "zoomed in" view of the gaming environment, as compared to a relatively higher Zoom Factor value which results in a more "zoomed out" view of the gaming environment.

In at least one implementation, at least a portion of the filter parameters may be selected and/or configured by the user. For example, in one implementation, the user may select the displayed "Modify Display Features" button 1424 to activate a GUI (not shown) which enables the user to select, modify, activate and/or deactivate desired parameters associated with the information being displayed on primary display 1410 and/or auxiliary display(s) 1420.

FIG. 15 shows an alternate embodiment of a user interface system 1500 which may be used for implementing various aspects described herein. In at least one embodiment, the user interface system embodiment of FIG. 15 is similar to that of FIG. 14. However, as shown in FIG. 15, the display parameters at 1522 indicate that a "user scrollable" feature has been enabled to allow the user to scroll, pan, navigate, or otherwise change the portion of gaming environment being displayed in GUI 1551. In this embodiment, the information displayed within GUI 1551 is not centered on the current position of the user interface system (indicated by icon 1530). Rather, in one implementation, the user interface system may be adapted to display a fixed portion of the gaming environment in GUI 1551, and to display the current position of the user interface system (e.g., 1530) relative to the displayed portion of gaming environment. As the user moves around the casino floor with the user interface system, the position of icon 1530 (representing the user interface system) will dynamically change to reflect its current position relative to other displayed objects of the gaming environment.

Additionally, in at least one implementation, the user interface system may be adapted to allow the user to scroll, pan, navigate or otherwise change the portion of gaming environment being displayed in GUI 1551 via at least one user input device. For example, using navigation buttons, the user may navigate across different sections of the casino to view desired portions of the casino floor and/or other regions of the casino. According to a specific embodiment, if the user interface system is not within the selected portion of gaming environment being displayed in GUI 1551, additional may be included in GUI 1551 to indicate, for example, the relative direction and distance to the user interface system.

Figure 16:
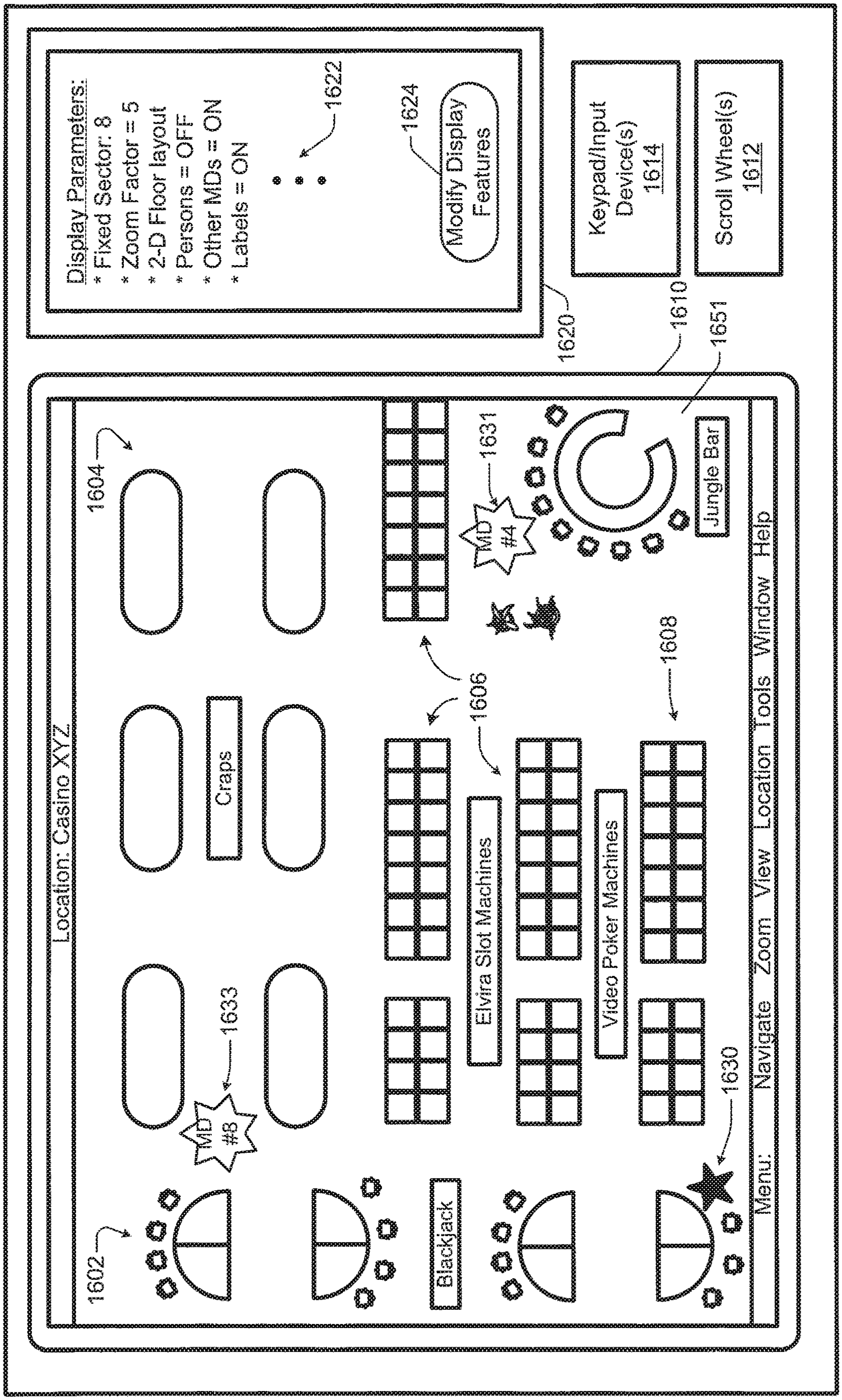

FIG. 16 shows an alternate embodiment of a user interface system 1600 which may be used for implementing various aspects described herein. As shown in FIG. 16, the portion of gaming environment displayed in GUI 1651 is set to a different zoom level in order to display more of the surrounding area, as compared, for example, to GUI 1551 of FIG. 15.

In at least one implementation, the representation of the gaming environment displayed in GUI 1651 may include information which has been filtered and/or customized based on a variety of different filter parameters such as those described herein and/or other filter parameters which are commonly know to one having ordinary skill in the art. For example, as illustrated in the example of FIG. 16, the information displayed in GUI 1651 may include:

- Objects representing individual gaming machines and/or banks of gaming machines (e.g., 1606, 1608).
- Objects representing game tables (e.g., craps tables 1604, blackjack tables 1602) and/or other non-electronic game play stations.
- Labels for use in identifying different objects displayed in GUI 1651.
- Objects representing user interface systems (e.g., 1630, 1633, 1631).

At least a portion of the different filter parameters may be displayed to the user, for example, via auxiliary display 1620 and GUI 1653. Thus, for example, as shown at 1622, the user is provided with information relating to enabled and/or disabled filter parameters which are being used (or not being used) for generating the filtered information displayed in GUI 1651. In this particular example, the displayed filter parameters shown at 1622 indicate the following with regard to the information displayed in GUI 1651:

- The information displayed within GUI 1651 represents a fixed portion of the gaming environment corresponding to "Sector 8" of the casino floor. In this embodiment, the user interface system is adapted to display a fixed portion of the gaming environment in GUI 1651, and to display the current position of the user interface system (e.g., 1630) relative to the displayed portion of gaming environment. In one embodiment where the user interface system is implemented at a mobile device, as the user moves around the casino floor with the user interface system, the position of icon 1630 (representing the user interface system 1600) may dynamically change to reflect its current position relative to other displayed objects of GUI 1651.
- The information displayed within GUI 1651 is rendered as a 2-dimensional representation of the gaming environment.
- A "Display Labels" feature is enabled to allow label information to be included in the information displayed in GUI 1651.
- A "Display Other MDs" feature has been enabled, which allows information relating to other mobile devices (MDs) (e.g., 1631, 1633) to be displayed or represented in GUI 1651.
- A "Display Persons" feature has been disabled, which prevents information relating to persons located in the displayed gaming environment (e.g., players, casino employees, etc.) from being displayed or represented in GUI 1651.
- The portion of the gaming environment displayed in GUI 1651 corresponds to a relative Zoom Factor of 5.

In at least one implementation, at least a portion of the filter parameters may be selected and/or configured by the user. For example, in one implementation, the user may select the displayed "Modify Display Features" button 1624 to activate a GUI (not shown) which enables the user to select, modify, activate and/or deactivate desired parameters associated with the information being displayed on primary display 1610 and/or auxiliary display(s) 1620.

Figure 17:
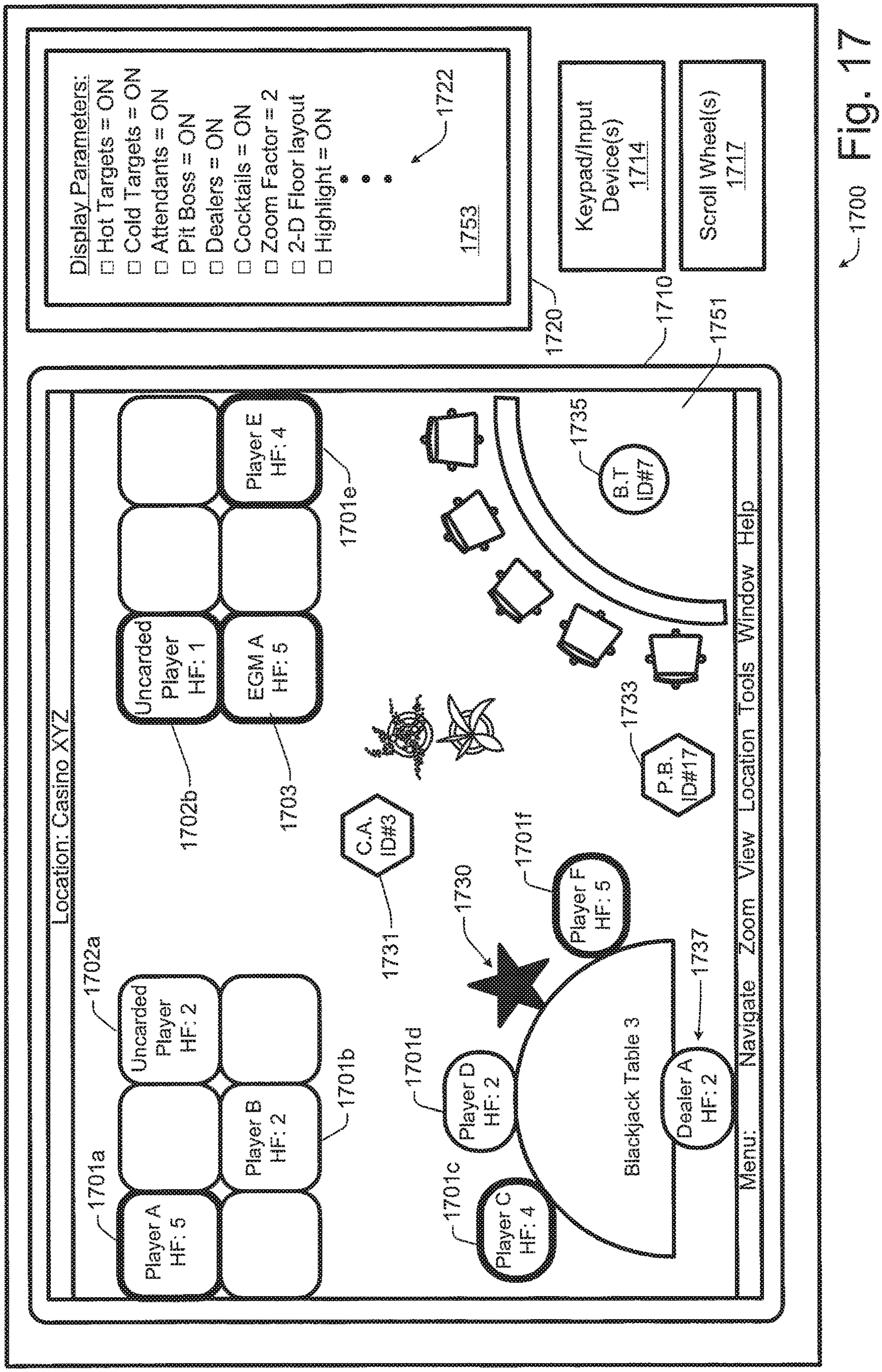

FIG. 17 shows an alternate embodiment of a user interface system 1700 which may be used for implementing various aspects described herein.

In at least one implementation, the representation of the gaming environment displayed in GUI 1751 may include information which has been filtered and/or customized based on a variety of different filter parameters such as those described herein and/or other filter parameters which are commonly know to one having ordinary skill in the art. For example, as illustrated in the example of FIG. 17, the information displayed in GUI 1751 may include:

- Objects and/or text representing persons and/or players in the gaming environment, such as, for example, identified players (e.g., 1701*a-f*), anonymous players (e.g., 1702*a-b*), gaming machines (e.g., 1703), casino employees (e.g., Casino Attendant (C.A) 1731, Pit Boss (P.B.) 1733, Dealers 1737, Bar Tenders (B.T.) 1735, etc.), etc.
- Labels for use in identifying different objects displayed in GUI 1751.
- Objects representing the current user's position/location (e.g., 1730).

At least a portion of the different filter parameters may be displayed to the user, for example, via auxiliary display 1720 and GUI 1753. Thus, for example, as shown at 1722, the user is provided with information relating to enabled and/or disabled filter parameters which are being used (or not being used) for generating the filtered information displayed in GUI 1751. In this particular example, the displayed filter parameters shown at 1722 indicate the following with regard to the information displayed in GUI 1751:

- The information displayed within GUI 1751 may be modified to identify and/or highlight selected "Hot Targets" and/or "Cold Targets" in the displayed gaming environment which meet predetermined criteria, conditions, and/or rules. In one implementation, such identified players may be represented in GUI 1751 using particular icons, objects, colors and/or shapes.

- Another display property/filter may be implemented to identify players in a selected region of the casino who may need assistance and/or education in game play or wagering. In one implementation, such identified players may be represented in GUI 1751 using a different icon, object, color and/or shape.
- Additionally, as shown in the example of FIG. 17, anonymous or uncarded players (e.g., 1702) may also be identified and/or highlighted which meet the specified filter criteria.
- The information displayed within GUI 1751 may be modified to identify selected casino employees (e.g., 1731, 1733, 1735) who are located in the displayed gaming environment. For example, as illustrated in the example of FIG. 17, GUI 1751 may be adapted to display representations of Casino Attendants, Pit Bosses, Dealers, Cocktail Hostesses, etc.
- The information displayed within GUI 1751 is rendered as a 2-dimensional representation of the gaming environment.
- The portion of the gaming environment displayed in GUI 1751 corresponds to a relative Zoom Factor of 2.

In at least one embodiment, "hot" target may include, but are not limited to, one or more of the following (or combinations thereof): hot identified players (e.g., 1701*a, b, c, e, f*); hot anonymous players (e.g., 1702*b*); hot EGMs (e.g., 1703); and/or other types of targets which may be assigned a respective "hot" index rating (herein referred to as a Hot Factor (HF) value. In at least one embodiment, "cold" (e.g., non-hot) targets may include, but are not limited to, one or more of the following (or combinations thereof): cold identified players (e.g., 1701*d*); cold anonymous players (e.g., 1702*a*); cold EGMs; and/or other types of targets which may be assigned a respective "hot" index rating and/or "cold" index rating.

For example, as illustrated in the example of FIG. 17, one display property/filter may be implemented to identify and highlight targets (e.g., 1701*a*, 1702*b*, 1701*e*, 1701*c*, 170*f*) in the vicinity of the user interface system which have a current Hot Factor (HF) value exceeding a predetermined value (e.g., HF value greater than 3).

In at least one implementation, at least a portion of the filter parameters may be selected and/or configured by the user. For example, in one implementation, the user may select one or more of the displayed filter parameters (e.g., by tapping the touchscreen on the box icon associated with the filter parameter to be modified) to activate a GUI (not shown) which enables the user to select, modify, activate and/or deactivate the selected filter parameter(s) associated with the display of information on primary display 1710 and/or auxiliary display(s) 1720.

Figure 18:
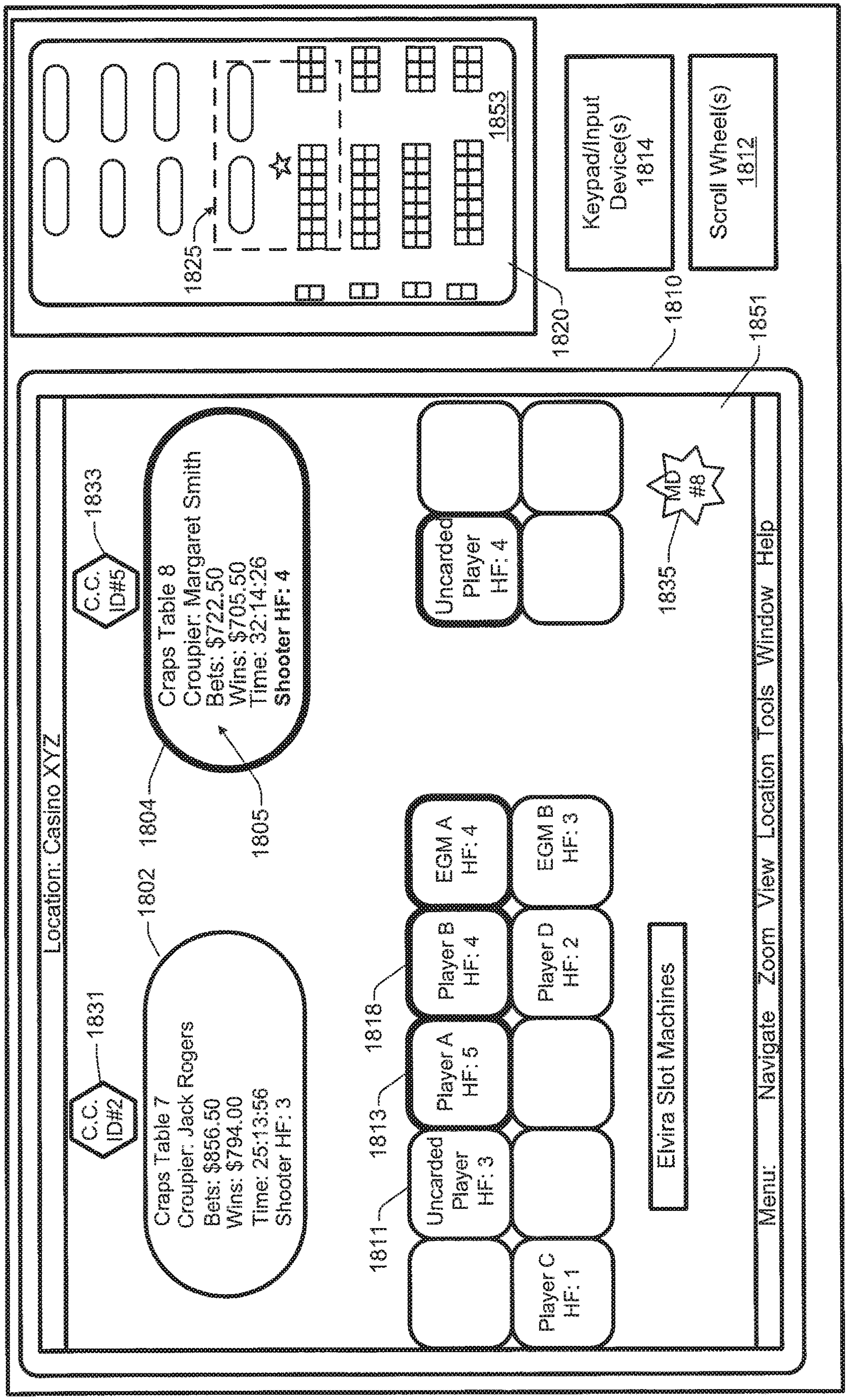

FIG. 18 shows an alternate embodiment of a user interface system 1800 which may be used for implementing various aspects described herein. In at least one implementation, the representation of the gaming environment displayed in GUI 1851 may include information which has been filtered and/or customized based on a variety of different filter parameters such as those described herein and/or other filter parameters which are commonly know to one having ordinary skill in the art.

For example, as illustrated in the example of FIG. 18, the information displayed in GUI 1851 may include information relating to desired characteristics associated with gaming machines (e.g., 1815), players (e.g., 1813), devices (e.g., 1835), game tables (e.g., 1802, 1804) and/or other objects in the displayed gaming environment. For example, as shown in FIG. 18, representations of individual game tables (e.g., 1802, 1804, etc.) may be displayed which include information relating the gaming activities being conducted at such game tables. Such gaming activity information may include one or more of the following: game table ID; type of game; betting limits; casino employee information (e.g., dealer, croupier, etc.); wager information; financial information (e.g., monies wagered, amounts collected, amounts paid out, etc.); game play information; player tracking information; timestamp information; game scheduling information (e.g. keno); side wager related information; statistical information; "hot" factor information (e.g., relating to the game, players, shooters, and/or dealers at the gaming table); etc. Additionally, as shown in FIG. 18, representations of individual casino employees (e.g., casino croupiers 1831, 1833) may also be displayed.

According to at least one implementation, the user interface system may be adapted to display a second GUI (e.g., GUI 1853) which may also present filtered/customized information to the user. For example, as shown in the embodiment of FIG. 18, auxiliary display 1820 is adapted to display GUI 1853 which includes a graphical representation of a casino gaming environment. In this particular example, the casino gaming environment represented in GUI 1853 corresponds to an overhead "overview map" of a portion of a casino floor. As illustrated, the overview map illustrated in GUI 1853 includes box 1825 which corresponds to that portion of the casino floor which is illustrated in greater detail in GUI 1851 of primary display 1810. Additionally, GUI 1853 includes representations of other portions of the casino floor which are adjacent to the portion of the casino floor represented within box 1825. Such visual information allows of the user to quickly determine his or her current position relative to other regions/objects of the casino floor which are not displayed within primary display 1810. In at least one implementation, the user interface system may be adapted to swap, rotate, and/or otherwise modify the GUIs displayed on the primary and auxiliary displays in response to appropriate input from the user.

Figure 19:
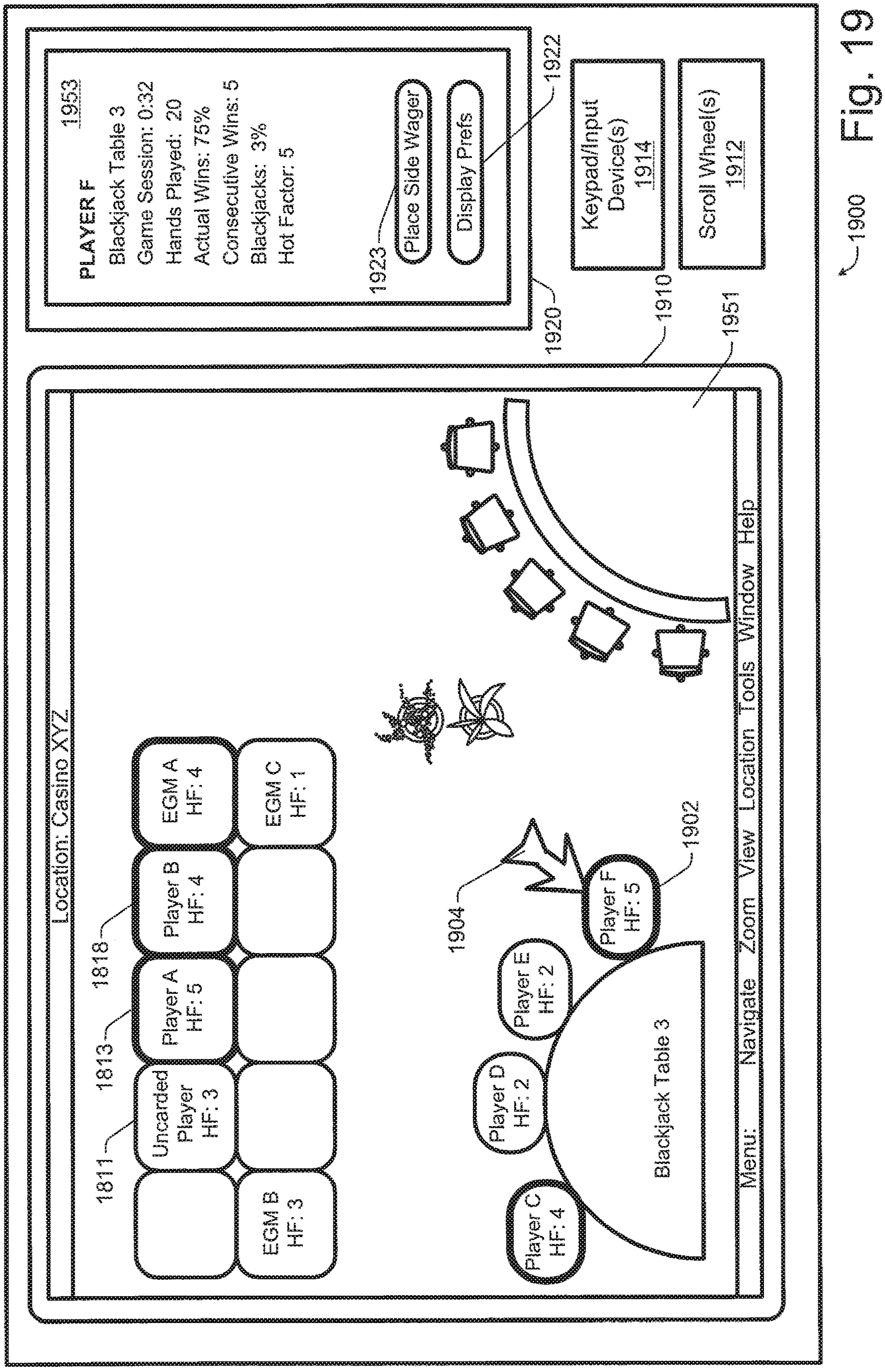

FIG. 19 shows an alternate embodiment of a user interface system 1900 which may be used for implementing various aspects described herein. As shown, for example, in FIG. 19, auxiliary display 1920 may be used for displaying additional information relating to one or more selected objects of the gaming environment. For example, it is assumed in the example of FIG. 19 that the user desires to view additional information relating to Player F (object 1902), which is currently indicated as a "hot" player at a blackjack table game.

According to different embodiments, the user may select desired objects displayed in GUI 1951 via different input mechanisms such as, for example, cursors (e.g., 1904), touchscreens, keypads, etc. In at least one implementation, when the user selects a particular object (e.g., object 1902), the object may be highlighted, and additional information relating to the selected object may be displayed, for example, on primary display 1910 and/or auxiliary display 1920.

In the example of FIG. 19, additional information relating to selected Player F is displayed in auxiliary display 1920. Such additional information may include, for example, one or more of the following (or combinations thereof): current game being played (e.g., blackjack), current length of gaming session, actual wins/losses (e.g., expresses a percent of total wins), amounts wagered, consecutive wins/losses, special wins/bonuses (e.g., blackjacks, jackpots, etc.), hot factor information, game play information, game state information, and/or other types of criteria/information described herein which, for example, may be used to assist an SWP in making a decision as to whether or not to place a side wager.

Further, in at least one implementation, the mobile device 1900 may be adapted to allow the user to initiate a variety of other actions and/or responses based upon the information displayed to the user via the mobile device. For example, as shown in FIG. 19, an interface (e.g., GUI button 1922) may be provided for allowing the user to change, update and/or modify the types of information displayed in GUI 1951 and/or GUI 1953.

Additionally, as shown in FIG. 19, another interface (e.g., GUI button 1923) may be provided for allowing the user to initiate or place a side wager on an identified target (e.g., Player F).

Figure 20:
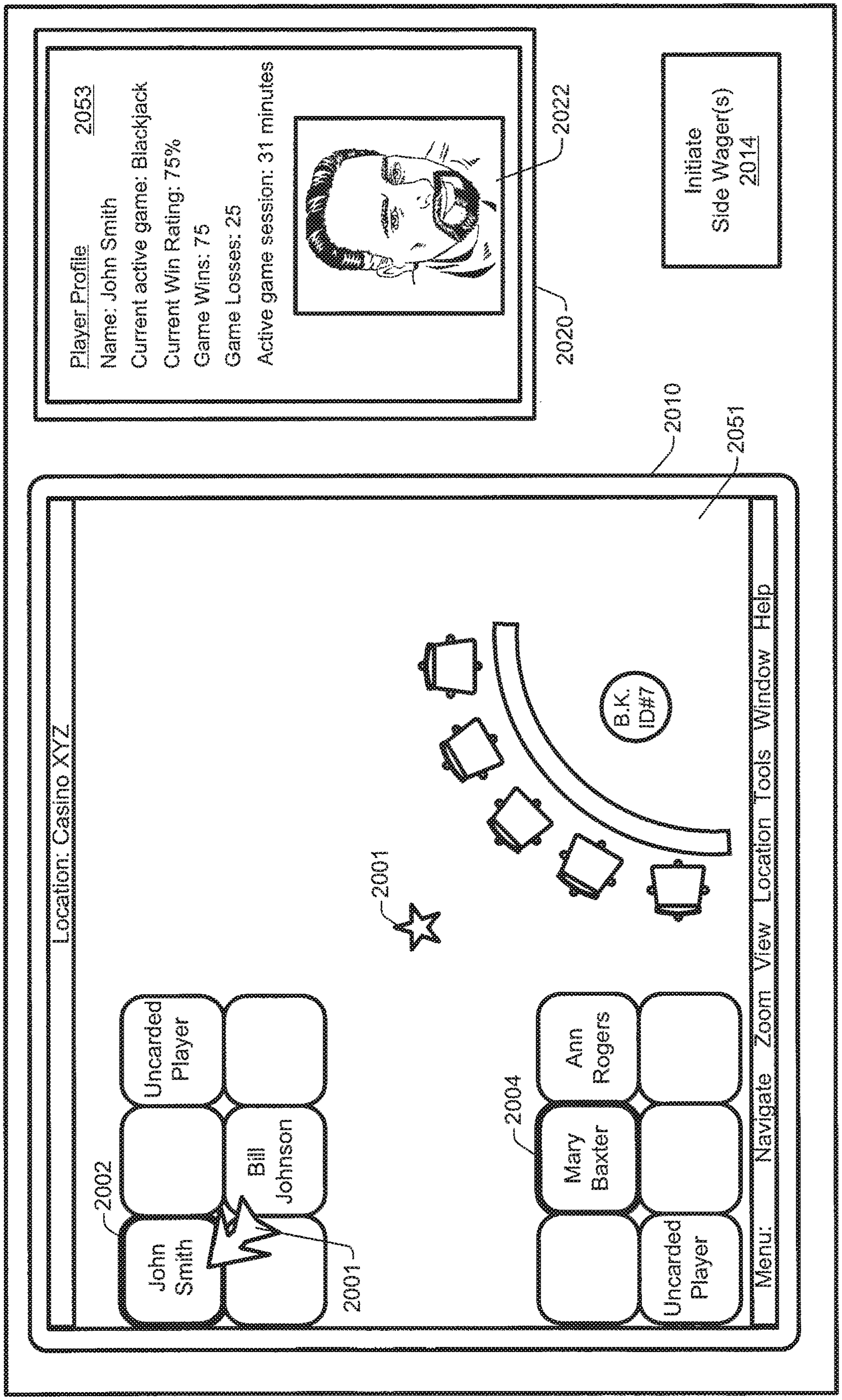

FIG. 20 shows an alternate embodiment of a user interface system 2000 which may be used for implementing various aspects described herein. As shown, for example, in FIG. 20, auxiliary display 2020 may be used for displaying additional information relating to one or more selected objects of the gaming environment. For example, it is assumed in the example of FIG. 20 that the user desires to view additional information relating to a particular player (e.g., John Smith) at gaming machine 2002. According to different embodiments, the user may select desired objects displayed in GUI 2051 via different input mechanisms such as, for example, cursors (e.g., 2001), touchscreens, keypads, etc. In at least one implementation, when the user selects a particular object (e.g., object 2002), the object may be highlighted, and additional information relating to the selected object may be displayed, for example, on primary display 2010 and/or auxiliary display 2020.

In the example of FIG. 20, additional information relating to the selected player, John Smith, is displayed at auxiliary display 2020. Such additional information may include, for example: player profile information (e.g., player name, player tracking ID, address, contact information, photo, etc.); player membership information; player preference information; player tracking information (e.g., arrival dates, departure dates, games played, etc.); game play session information (e.g., length of current gaming session, game type/theme/denomination/paytable information); game state/status information; coins, cash, and/or credits wagered; coins, cash, and/or credits won; information relating to actual wins/losses; information relating to theoretical wins/losses; Hot Factor rating; location; etc.

In at least one implementation, one or more of the user interface systems described herein may be operable to allow a user to view additional information about other selected persons and/or devices which may be displayed in the gaming environment such as, for example: casino employees (e.g., dealers, attendants, hosts, pit bosses, etc.); players; user interface systems; gaming machines; gaming tables; etc. Depending upon the characteristics of the object which has been selected by the user, various detailed information relating to the selected object may be displayed on primary display 2010 and/or auxiliary display(s) 2020.

Additionally, in at least one embodiment, one or more of the user interface systems described herein may be operable to allow a user (e.g., SWP) to access and/or display side wager session information relating to one or more side wagers placed by the SWP. For example, in one embodiment, an SWP may utilize the user interface system to display a variety of information such as, for example, one or more of the following (or combinations thereof):

- information relating to completed side wagers;
- information relating to pending side wagers which have been placed;
- information relating to pending side wagers which have not yet been placed;
- accounting information relating to completed, placed and/or pending side wagers;
- information relating to customized side wager related criteria/preferences associated with the SWP (such as, for example, preferred target criteria, customized Hot factor or hot index rating criteria/preferences, etc.)
- personal profile information;
- etc.

FIG. 24 shows an example of a user interface system display 2400 in accordance with a specific embodiment. As illustrated in the example of FIG. 24, display 2400 may be used to provide (e.g., to an SWP) a variety of different types of information relating to side wager activities, promotions, etc., such as, for example: information (e.g., 2404) relating to completed, pending, placed, and/or active side wager sessions; information (e.g., 2406) relating to selected available side wager opportunities and/or promotions; etc.

According to specific embodiments, various types of content displayed on display 2400 may include, but are not limited to, one or more of the following (and/or some combination thereof):

- information relating to side wager session identifiers;
- information relating to side wager targets;
- information relating to different types of side wagers;
- information relating to wager criteria;
- information relating to current or real-time values of placed side wagers;
- information relating to side wager timing criteria;
- information relating to side wager promotions and/or bonuses;
- etc.

According to different embodiments, such information may be displayed on individual displays and/or common displays throughout the casino, and/or may be displayed in one or more salons.

Figure 21:
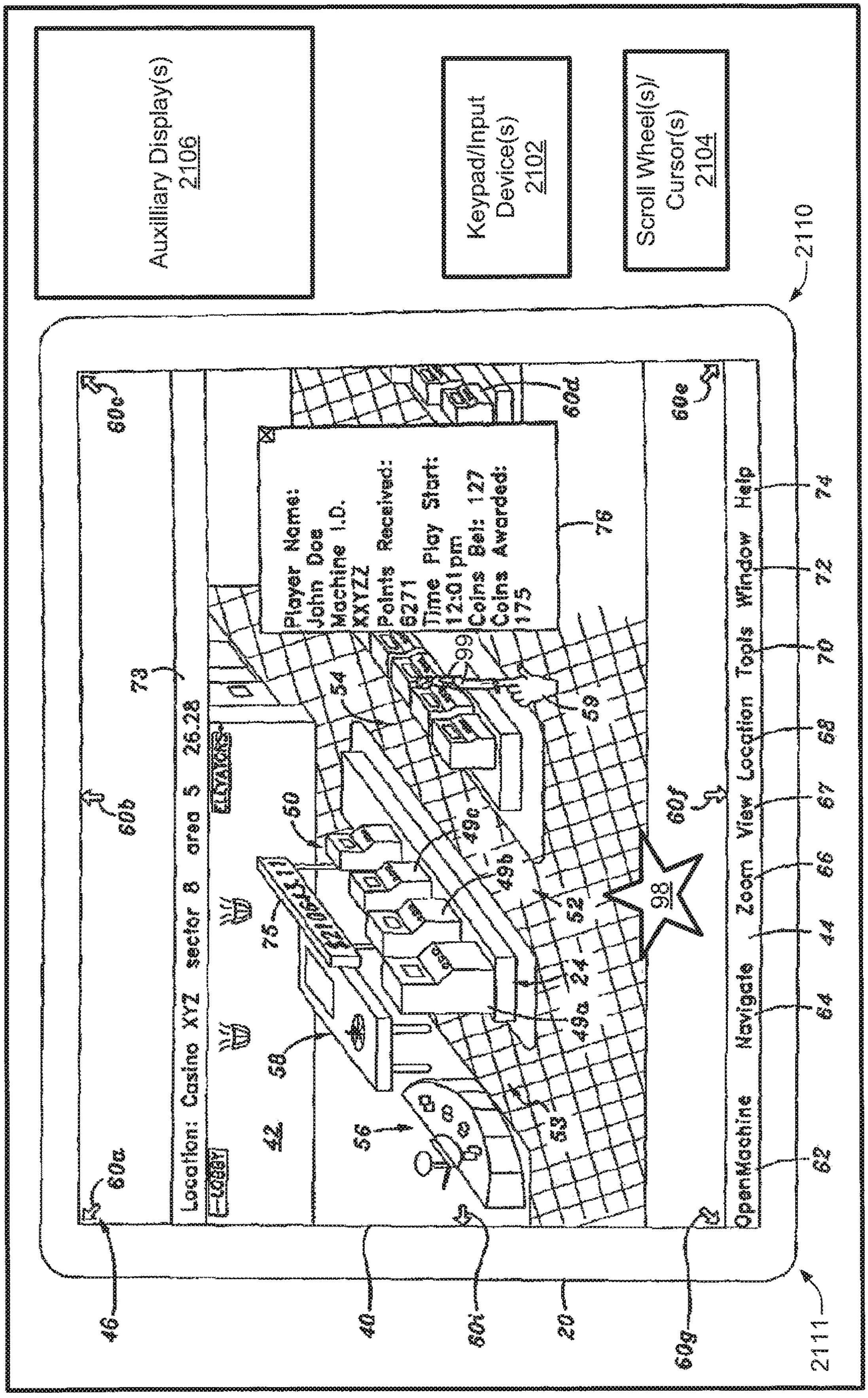

FIG. 21 shows a specific embodiment of a user interface system 2100 which may be used, for example, by an SWP, for implementing various side wager-related operations.

As illustrated in the example of FIG. 21, user interface system 2100 may include a primary display 2110. In some embodiments, user interface system 2100 may also include one or more auxiliary displays 2106, and/or one or more user input devices (e.g., 2102, 2104) such as, for example, keys, buttons, scroll wheels, jog wheels, touch screens, cursors, joysticks, touchpads, etc.

In the example of FIG. 21, there is provided a graphical user interface 2111 which may be displayed on one or more of the displays (e.g., 2110) of the user interface system. In a preferred embodiment of the invention, the graphical user interface 2111 is associated with at least one main application but capable of displaying information associated with one or more sub-applications or functions.

In one embodiment, the graphical user interface 2111 is arranged to display information provided by an application or function which generates casino environment image information. In addition, in one or more embodiments, the graphical user interface 2111 is arranged to display information provided from other applications or functions, and particularly those associated with individual functions or systems of a casino. These other applications or functions may be player tracking, casino accounting, security and the like.

In a preferred embodiment, the graphical user interface 2111 includes a main window 40. The main window 40 may comprise a variety of elements having a variety of shapes and sizes. In general, the main window 40 comprises an element displayed on or by a device, such as a video screen.

In a preferred embodiment, when displayed, the main window 40 provides a gaming system environment information and permits interaction with an application executed by or function being performed by the user interface system 2100 and, as described below, one or more other devices. In the embodiment illustrated, the main window 40 includes a display area 42, one or more menu elements 44 and one or more control or navigation icons 46.

In one implementation, graphical information regarding or representing a gaming environment is illustrated in the display area 42. The display area 42 preferably comprises a portion or field of the main window 40. This display area 42 portion of the main window 40 may be referred to as the data panel, window or viewport.

According to different embodiments, the information which is displayed in the display area 42 comprises a two-dimensional or three-dimensional representation of a gaming environment. The specific embodiment illustrated in FIG. 21 corresponds to a three-dimensional gaming environment representation. By gaming environment, it is meant the physical arrangement of components of the gaming system along with the related physical environment in which that system or its components reside. This environmental information may include, but is not limited to, the components of the gaming system, the physical arrangement of the components of the gaming system, and one or more portions of the physical environment in which the system is located, including the relationship of the components to the environment.

One example of such information is illustrated in FIG. 21. As illustrated, the information includes the representation of one or more of the gaming system devices 24 (as described above, the term gaming system device may include, but is not limited to, any component of the gaming system, including electronic, electromechanical, mechanical or other devices, elements or structures). These representations preferably comprise images, either actual images such as photographic information in digital form, or generated representations, of the gaming system devices 24 of a casino gaming network (or portion thereof). Preferably, if not an actual image of the gaming system device 24, the representation portrays information useful in identifying the gaming system device 24, such as the particular type of gaming system device. By "type" it is meant slot type machine, video type machine, table game, server, workstation or the like. In addition, the representation may more particularly identify the device 24, such as by particular game or manufacturer.

In a preferred embodiment, the representation of each gaming system device 24 is illustrated in a location on the display relative to all other gaming system devices 24 which represent the actual relative locations of the gaming system devices 24 of the casino gaming network being portrayed in their actual physical environment.

In one embodiment, one or more aspects of the actual physical environment in which the components of the casino gaming network are located is displayed. Once again, the aspects of the casino or other physical environment are preferably illustrated in relative and representative form to the actual physical environment, including size, relative location and the like.

An example of a portrayal of an actual gaming environment is illustrated in FIG. 21. As illustrated, the gaming system includes gaming system devices such as gaming machines 49*a, b, c* arranged in a first bank 50 of gaming devices. An isle 53 separates the first bank 50 of gaming devices from a second bank 54 of gaming devices. An isle 54 also separates the first bank 50 of gaming devices from a number of other gaming devices including a Blackjack table 56 and a Roulette wheel 58. Again, these displayed images correspond to an actual (in this case, exemplary) physical gaming environment.

Preferably, the information which is displayed to the user aids the user in correlating the illustrated information with the actual physical environment. A wide variety of information may be displayed to aid this function. For example, referring to FIG. 21, the information which is illustrated preferably includes details regarding the physical environment of the casino gaming network, which details aid the user of the user interface system in identifying the corresponding physical location of the individual components or devices of the system. This detail may include the illustration of casino walls, hallways, isles, significant fixtures such as light fixtures and signage, doors and the like. The detail may also include information such as the type of flooring, including reproduction of carpet designs, wall covering and a variety of other information.

Preferably, a variety of functions are provided for manipulating the information which is displayed in the display area 42. In one embodiment, a selector 59 is provided for selecting elements in the window 40. This selector 59 may comprise, as is known in the art, a mouse pointer or as illustrated, a hand with pointed finger. The selector 59 may be gPPDed by a mouse, track-ball or a wide variety of other user input devices. Other means may be provided for selecting elements, such as by a menu or selection buttons, screen icons, etc, As described, a plurality of navigation elements 46 may be provided. In one embodiment, the navigation elements 46 comprise directional arrows 60*a, b, c, d, e, f, g, h, i*. Selection of one of these arrows 60*a-i* preferably results in the display of information regarding an area of the gaming environment which is available in the direction of the arrow. For example, if a user selects the arrow 60*d*, then the field of view is shifted to the right. Information regarding the gaming system and related environment which lies in this direction is thus displayed in replacement of the information regarding the current location. In one embodiment, selection of a particular arrow 60 results in a predetermined distance of movement.

In addition, functions may be performed via menu selections. As illustrated, the menu 44 includes a number of menu elements. In one embodiment, the menu elements comprise "open machine" 62, "navigate" 64, "zoom" 66, "view" 67, "location" 68, "tools" 70, "window" 72, and "help" 74.

Upon selecting one of the menu selections, one or more functions associated with that selection may be presented to the user. These functions or selections may be illustrated in a hierarchical or other menu format. With respect to the "open machine" 62 selection, a user may be provided with a number of sub-selections, such as "open accounting," "open security," "open operating data" and the like. Each one of these sub-selections preferably results in the generation or display of certain information regarding a gaming system device which is illustrated in the display area 42, which device and information corresponds to an actual gaming system device of the casino gaming network.

With respect to the "navigate" 64 selection, a user may be provided with sub-selections such as "move right," "move left,", "move up," "move down," and the like. Other selections may be provided, such as a user's selection of a specifically designated area.

With respect to the "zoom" 66 selection, a user may be provided with sub-selections such as "zoom in," "zoom out," "percentage zoom," "zoom to specified radius" (e.g., zoom to a radius of 30 feet from the current location of the user interface system), etc. Such selections may be used to change the magnitude of the size of displayed information. For example, "zoom out" preferably causes the scale of the displayed elements to reduce or become smaller, such that a larger representative area of the gaming environment is displayed in the display area 42. The "zoom in" features preferably causes the scale of the displayed elements to increase or become larger, such that a smaller representative area of the gaming environment is displayed in the display area 42.

With respect to the "view" 67 selection, a user may be provided with a number of sub-selections such as "camera view" or "archive view." As described below, using such features a user may obtain a photographic image of a particular component or live video feed from a camera including the component within its field of view.

With respect to the "location" 68 selection, a user may be provided with options for the display of specific areas of a gaming environment. These locations may be pre-designated, such as "entrance" or the like.

With respect to the "tools" 70 selection, a user may be provided with a variety of function options such as changing the color of displayed information, contrast, importing and exporting of information, saving of data and the like.

With respect to the "window" 72 option, a user may be provided with options such as sizing of the window, closing or reducing the window 40. The user may also be provided with the option of making the display area 42 a full screen (i.e. no borders displayed). The user may also be provided with the option of changing the format of information displayed in the window 40, such as adding visible tool bars, changing the style of the navigation elements, and adding or removing information bars or areas. For example, in one embodiment, a "location" bar 73 may be displayed in the window 40. The "location" bar 73 may display information regarding the information of the location of the graphical components which are presently illustrated in the display area 42, such as the name of the casino and more detailed mapping information.

With respect to the "help" 74 selection, a user may be provided with a variety of help functions. These functions may include an index of help topics.

In one embodiment, the various functions which are provided by the menu 44 are enabled by software and/or hardware. For example, the user interface system 2100 may include computer executable code arranged to "zoom" the information which is displayed in the display area 42. The user interface system may also be adapted to dynamically modify the filtered and/or customized information displayed, based on user input or user interaction. A variety of other menu selections may be provided, as is known. For example, menu selections may include "print" for printing displayed information.

In one or more embodiments, one or more of the elements which are displayed in the display area 42, such as represented gaming system devices, may comprise a container element. In general, a container element is an element which contains other elements or information. One or more of the elements displayed in the display area 42 may comprise application initiating elements. Application initiating elements comprise elements which, when selected, cause an application to be initiated or run.

In one embodiment, when a particular displayed element is selected, data associated with that element is displayed. The information which is displayed is dependent upon the element which is selected. For example, if the selected element is the gaming machine or table game, then information regarding the physical gaming machine or gaming table to which the displayed element corresponds is displayed. If the selected element is a progressive meter 75, then information regarding that device is displayed.

The manner by which the information is generated and displayed may vary. As described, the displayed element may comprise a container with which information is associated. For example, a displayed gaming system device may be configured similar to a file folder in a computer-based application window. Data from other applications or elements may be associated with the container so that when the container is selected, the associated information is accessible, accessed or displayed.

In another embodiment, the selection of a display element causes an underlying function or application to be initiated. Preferably, this function or application is arranged to generate and then display information associated with the display element. For example, upon selecting a particular gaming system device, an application may be initiated which polls various of the devices of the gaming system, such as servers or hosts, for information regarding that device.

The information may be displayed in a wide variety of manners. In one embodiment, the information may be displayed in a new window 76 which has characteristics separate from the main window 40. For example, the new window 76 may be moved, re-sized, and closed independent of the main window 40. In another embodiment, the information may be displayed in the main window 40.

In one embodiment, a user may be required to select by a menu or by touching the appropriate area on the display. In another embodiment, information may be presented when the selector 59 is moved over a particular element or as the user navigates through the virtual environment. For example, a window may automatically open and present information regarding a component positioned under the selector 59 or when touched by the user in a touch-display format.

The type of information which may be displayed may vary. In one embodiment, the information may comprise one or more selectable elements themselves, such as a menu of selections for the user. In another embodiment, specific information may be automatically configured and displayed. Such an arrangement is illustrated in FIG. 21. As illustrated, a variety of information may be displayed regarding the selected device. In the case of a gaming system device 24, the information may include the identification of the device, such as by serial number or other identifier. The information may include the location of the device. As described below, in an instance where the graphical gaming system information is arranged based upon predetermined grid arrangement which is correspondingly associated with the physical environment of the gaming system, then grid coordinates (i.e. 26:28 as illustrated) may be displayed.

The information may include a wide variety of information obtained from the actual gaming system device 24 which corresponds to the graphical representation. The information may also come from other sources, such as the individual servers or hosts. For example, accounting information such as total coins (or money) in and coins (or money) paid out by the gaming system device during periods of time may be displayed. Other information such as the operating status of the gaming system device and specific information about operating software may be provided from the gaming system device 24 via the game server 26.

The graphical user interface 2111 may be configured in a wide variety of manners. For example, the navigation element, menu elements and the like may comprise text, buttons, symbols or take other forms. These elements, such as the arrows 60, menu elements and the like may have a variety of shapes and sizes.

In one embodiment, the display may be touch sensitive, allowing a user to select a display element directly. In such event, the various elements such as navigation arrows 60 and menu elements may be arranged as buttons which are sized for selection by the finger-tip touch of a user.

In one or more embodiments, one or more external windows (not shown) or other elements may be associated with the graphical user interface 2111. Such windows or elements may be associated with, but not form a portion of, the main window 40 or its components. In one or more embodiments, the element may comprise a window in which information may be displayed, or may comprise a button, or panel including information, or other graphical elements having a variety of forms and configurations. In one embodiment, such an external window may be associated with an entirely different application from that which the graphical user interface 2111 is associated. In another embodiment, a window may be displayed which is associated with an element of the graphical user interface 2111.

In accordance with the present invention, there is provided a method of configuring a graphical user interface, such as the graphical user interface 2111 described above. One embodiment of the invention comprises displaying a graphical representation of at least a portion of a gaming environment comprising a physical gaming system and its associated environment, and displaying filtered and/or customized information regarding one or more components of that gaming system.

A variety of other methods are contemplated as within the scope of the invention, and the steps may of the methods of the invention may be performed in a variety of sequences. In one embodiment, the method includes the step of generating a graphical user interface and displaying generated graphical gaming environment or gaming system information using the interface, such as in the display area of the interface. The method also includes the steps of accepting input from a user, such as for effecting navigation or requesting information regarding a particular displayed element.

In one embodiment, each gaming system device 24 or component is uniquely identifiable, and a graphical representation of a component is uniquely associated with an identified physical component. When a user selects a particular graphically represented gaming system device, a request for information regarding that gaming system device from a server or host is made by using the identifier for that device. This identifier may comprise a machine I.D., serial number or the like.

A variety of other embodiments of the invention are contemplated. In one embodiment of the invention, the user interface system 2100 may be provided with a communication link to one or more cameras, such as casino security cameras. If desired, a user of the graphical user interface may be permitted to view the physical device to which the graphical representation corresponds using information from such a camera or cameras. As described above, a "view" 67 menu selection may be provided. By selecting a particular element in the display area 42 and the "view" selection, actual photographic information of the component in the physical environment may be presented to the user.

In one embodiment, when the user selects the "view" option, the user interface system 2100 is arranged to obtain photographic information. Such information may be obtained from a particular camera or cameras through a communication link directly with the camera(s), or through a centralized security or other monitoring system through which data feeds from the one or more cameras is provided. The information may also comprise an archived image of the component.

For example, in one implementation, a camera or other image collection device may be configured to collect image information regarding one or more gaming system devices 24 and/or activities and objects (including players). By selecting the "view" 67 menu selection, a user may be permitted to select a particular camera, gaming system device 24 and/or area for which collected image information is desired. This image information may then be displayed to the user. The image information may comprise individual frame or streaming video information.

The photographic information may be displayed in a variety of manners. In one embodiment, the information is displayed in a new window located in the display area 42, in similar manner to the window 76. In one embodiment, the image information may be stored by the user. For example, when particular image information is selected, the user may utilize a "store" feature (such as provided in a sub-menu) to store the information for later use.

Of course, a wide variety of information may be provided to the user who is viewing the graphical user interface 2111. For example, audio or audio and video information from the physical gaming environment may be provided.

The various components or elements of the graphical user interface 2111 may be arranged in a variety of configurations. In general, it is desired, however, that the interface 2111 provide a user with a consolidated "picture" of one or more portions of the gaming system and be capable of providing specific information regarding one or more components of that gaming system. In this regard, the gaming environment which is depicted may be referred to as a "virtual casino" in that it represents the casino in computer generated/presented format.

While it is preferred that the gaming system be represented in a three-dimensional form, other formats may be provided. In one embodiment, the gaming system may be represented in a two-dimensional format. In another embodiment, the gaming system may be represented using actual images of the gaming environment. For example, photographs may be taken of each gaming device 24 and the image of each particular gaming machine may be displayed in the represented environment with its photograph or other image. In another embodiment, live video information may be displayed to represent the environment. Other information may be imposed upon that image information to aid the user in identifying features and obtaining information. Alternatively, the image information may be imposed over a template, whereby when the user selects a particular displayed element, such as a particular gaming machine, the selection results in selection of the gaming machine as identified by its underlying template.

According to different embodiments, the graphical user interface 2111 may also include an icon 98 representing a current position of location of the user interface system relative to other objects in the displayed gaming environment. In one implementation, the user interface system icon 98 may remain in a fixed position (e.g., in the center) of the graphical user interface 2111 while other objects of the displayed gaming environment may automatically and dynamically change as the position of the user interface system changes. In an alternate embodiment, the user interface system icon 98 does not remain in a fixed position on the graphical user interface 2111, and the user is able to scroll, pan, or otherwise change the portion of gaming environment which is being displayed.

In one embodiment of the invention, information regarding activities or events located remote from the user are displayed in real-time to the user. When a user selects a particular gaming system device 24, information regarding that device is displayed to the user in real time. For example, when a user selects a particular gaming machine 59, as illustrated in FIG. 21, information which is being generated by the gaming machine 59 is preferably provided to the user as it is generated. This information may comprise, for example, player events such as a player's input of a player card, coins in and coins out, and a wide variety of other information, such as identification of a game currently being played, results of games and the like.

In another embodiment, as also described, the user may obtain historical information. As illustrated in FIG. 21, such information may comprise information previously generated or information which was generated from previously generated information, such as actual win or hold percentage over time, coins in and coins out over time, number of games played over time, and similar information.

It will be appreciated that one or more components of a gaming environment or system may be located in more than one geographic location. For example, International Game Technology's MEGABUCKS™. system includes gaming system devices which are located in multiple casinos. In an embodiment of the invention, it is contemplated that the system may be modeled or represented in similar manner to that described above. In such an embodiment, at one "zoom" level, an overview graphical representation of the system may be provided, such as one in which all of the casinos having such machines are illustrated. A user may then select a particular casino or location and another level of information, such as a casino level detail as illustrated in FIG. 1 may be illustrated.

In this regard, the method and apparatus of the invention is not limited to presentation of information regarding a single gaming system or a portion of a gaming system at only a single location. It is contemplated that a user may be presented information regarding gaming systems at different casinos or a gaming system spread among or including multiple casinos. In such an embodiment, as described above, the user may be provided with a means for selecting the particular portion or area of the gaming system or the particular gaming system or casino property which the user would like information about. In an embodiment such as where the gaming system is distributed among multiple casinos or locations, the user interface system 2100 may communicate with gaming system devices 24 at the individual casinos.

In one or more embodiments, means other than arrows or the like may be provided for changing the illustrated information or otherwise "navigating" the information. In one embodiment, navigation may be permitted using the selector 59. For example, as a user moves the selector 59 (such as with a track-ball) over the displayed gaming system information, the displayed information may "move" as well. For example, in the embodiment illustrated in FIG. 21, if a user were to move the selector 59 towards the area marked "elevators," this portion of the displayed area would move towards the bottom of the display area 42, and additional information above that area would be displayed.

As noted, a variety of information regarding individual gaming system devices or components may be presented. This information may include device or structural data such as serial number, manufacturer and the like. The information may also include operational data, such as power on/off, malfunction and the like. The information may also include game-related information, such as amounts bet and awarded, percentage hold and the like. In one or more embodiments, the statistics from more than one gaming system device may be aggregated, such as by selecting an entire bank of gaming machines or a group of table games.

In one embodiment, graphical representations of players (e.g., 99) may be included. For example, in the event information is received that a particular gaming machine is in play by a player, the graphical representation of the environment may be updated to add a graphical representation of a player at that particular gaming machine. Likewise, graphical representation of players and dealers may be illustrated with respect to table games. In this manner, a user of the system may easily identify the gaming system devices which are current in use from those which are not.

In a preferred embodiment of the invention, as illustrated in FIG. 21, a user may obtain information regarding players and/or other persons or devices in the gaming environment such as, for example, casino employees, service technicians, gaming regulators, gaming machines, other user interface systems, etc. In one embodiment, the user may select a player (e.g., 99) to obtain information regarding that player. Information may be obtained whether the identity of the player is known or not. For example, if the identity of the player is not known, the gaming machine 9 may still provide information that a player is playing. In that event, a graphical representation (or actual image, such as obtained from a camera) of the player may be provided. When the user selects that representation, information may be displayed, such as collected and generated information regarding the time play began, coins in and coins out and the like.

As described above, a player may identify themselves by using a player tracking card or the like. In such an event, the user may obtain specific information regarding the player and the player's activities, such as tracked by a player tracking server (see, e.g., FIG. 1). This information may comprise any of the wide variety of information which is known to be collected or generated with such a system, such as the name of the player, bonus or awards points accrued to the player or the like, as illustrated in FIG. 21.

In this embodiment, a user may obtain information which allows the user to make decisions regarding the player. For example, by viewing the historical and/or real time play of a player as illustrated in FIG. 21, the user may elect to award the player a special bonus, such as a bonus number of accrued points which the player may utilized for free game play or prizes, as is known in the art of player rewards programs. In one embodiment, menu features may be provided for permitting the user to perform such functions, such as via the graphical user interface 2111. In one embodiment, such actions may be transmitted over the gaming system (e.g., 22, FIG. 1) back to the player, so that the player is made aware of the award.

In a similar manner, a user may obtain information regarding other persons. For example, a user may obtain information regarding a dealer at a Blackjack table 56. A dealer may be required to log in when they begin dealing at a particular table 56. Further, equipment may be used, as described, for tracking game play, including bets and amounts paid at the table. By selection upon the representation of the dealer, the user may obtain information such as the identity of the dealer, their time at the table and related information.

In one or more embodiments, other options may be provided for manipulating the graphical information. For example, in one embodiment, a user may be permitted to move graphical elements, such as individual gaming system devices (such as representations of gaming machines or table games). In this manner, a user may be permitted to reconfigure the virtual gaming environment or casino and visually inspect the new configuration. This information may be useful in changing the actual physical environment/arrangement of the system.

For example, a user may utilize the graphical representation to reconfigure the gaming environment. For example, a casino may wish to reconfigure their gaming floor, such as by moving one or more gaming machines. A user may obtain a visual representation of the gaming floor as reconfigured by moving the representations of the gaming system devices 24. In one embodiment, the user may "drop and drag" the representations, or may use input commands to effect the movement.

In one embodiment, once one or more of the representations of the gaming devices 24 have been moved, reconfiguration information may be generated and output. This information may comprise, for example, the identification of moved devices and their new locations, such as in coordinate or other form. Technicians or workers may then utilize those instructions to move the physical devices to their intended locations.

In another embodiment, the physical gaming devices may be moved and then the system of the invention may utilize input information to change the represented environment. For example, technicians may input new location information for moved devices, and the system may then utilize that information to generate a new graphical representation for use by the user. In this manner, the representation is always accurate of the true environment.

In one embodiment, the user may be permitted to interact with individual gaming system device by sending information, such as control instructions, to the device. For example, a technician may query a device using the system and then send information to the device, such as a reset code. A user may also use the system to update control code, such as gaming machine game code using the system. In this arrangement, information or instructions are provided the virtual information host 56 to the one or more devices.

In one embodiment, a user may cause information to be transmitted to a gaming system device for use by a technician or similar party. For example, a user may obtain information regarding a particular gaming machine using the interface 2111 and determine that the gaming machine should be reconfigured. The user may cause a work ticket to be printed from a ticket printer or dispenser at that gaming machine for use by the technician. Such work tickets may also be printed to provide trouble-shooting or similar information to a technician or other party at the gaming system device. Alternatively, the user of the user interface system may transmit a wireless message to an appropriate entity (e.g., service technician who also has a user interface system), to cause at least a portion of desired information to be displayed on the display of the receiving entity.

In general, the graphical user interface and system permit a party to obtain information regarding gaming system devices and transmit information to those devices. Advantageously, the interface provides a convenient means for recognizing and utilizing the information.

A variety of methods have been described above which, as indicated, may be implemented via the user interface system 2100. For example, embodiments of the invention can be implemented as computer software in the form of computer readable code executed on a general purpose computer or other electronic device, or in the form of bytecode class files executable within a Java™ runtime environment running on such a computer/device, or in the form of bytecodes running on a processor (or devices enabled to process bytecodes) existing in a distributed environment (e.g., one or more processors on a network).

It will be appreciated that the features and/or functionalities of the user interface systems described herein represent only an exemplary portion of a wide variety of features and/or functionalities which may be accessible to a given user. In addition to the features/functionalities of the user interface systems described above, other embodiments of the user interface system of the present invention may include one or more of the following features and/or functionalities:

- Functionality for enabling notification of alerts from a pager (or other device) to the user interface system.
- Functionality for enabling receipt of notification of desired events and/or for initiating responses to selected events.
- Functionality for accepting and paying out funds for a gaming session.
- Functionality for enabling communication between other persons in the casino.
- Etc.

Figure 22:
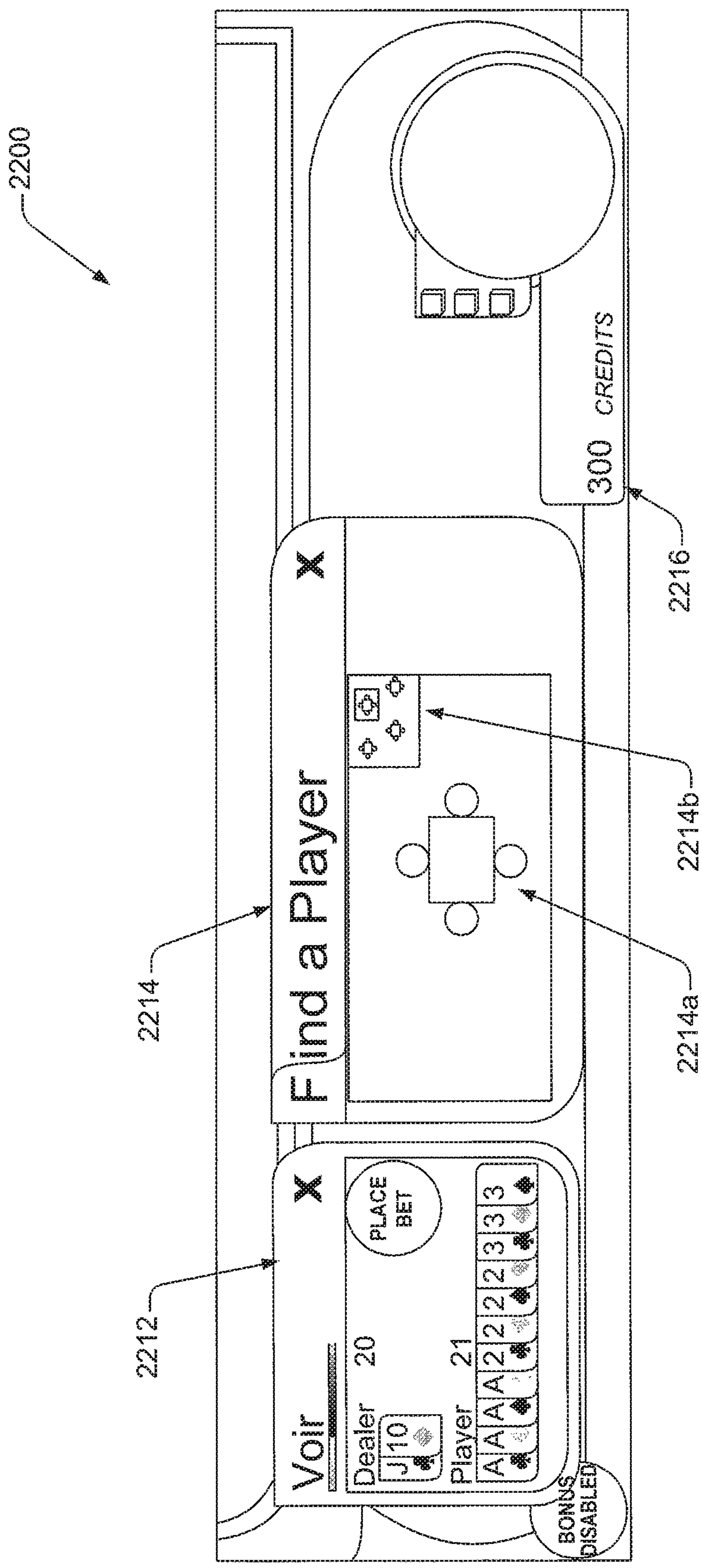

FIG. 22 shows another example of a user interface system 2200 in accordance with a specific embodiment. In one embodiment, the user interface system 2200 may be implemented as part of an interactive gaming table display such as, for example, interactive display 102 of FIG. 1.

In at least one embodiment, user interface system 2200 may be implemented as an interactive graphical user interface (GUI) which, for example, may be used by an SWP for implementing various side wager-related operations.

For example, in at least one embodiment, user interface system 2200 may be utilized to access available side wager opportunities and/or to identify potential side wager targets.

For example, as illustrated in the example of FIG. 22, user interface system 2200 may be used to display content 2214 representing an interactive map of a portion of the casino. In one embodiment, and SWP may use the interactive map to search for and/or locate potential side wager targets.

In the embodiment of FIG. 22, interactive map portion 2214 is shown to display a representation 2214*a* of a first portion of the casino floor (e.g., which, for example, includes a gaming table with 4 player stations). Additionally, as illustrated, the interactive map portion 2214 includes boxed portion 2214*b* which corresponds to that portion of the casino floor which is illustrated in greater detail in portion 2214*a*. Additionally, boxed portion 2214*b* includes representations of other portions of the casino floor which are adjacent to the portion of the casino floor represented within the boxed region. Such visual information allows of the user to quickly determine his or her current position relative to other regions/objects of the casino floor which are not displayed within primary display 2214*a*.

As illustrated in the example of FIG. 22, user interface system 2200 may also be used to display content 2212 corresponding to a virtual representation of real-time game play associated with one of the SWP's side wagers. For example, in the example of FIG. 22, it is assumed that the SWP has placed a side wager on a blackjack game being played by another player. Accordingly, display content portion 2212 may be operable to display a virtual representation of real-time game play between the dealer of the blackjack game and the target player). In one embodiment, the user interface system may be configured or designed to permit the SWP to view/monitor only selected portions of remote game play which relate to one or more side wagers placed by the SWP. In other embodiments, the user interface system may be configured or designed to permit the SWP to view/monitor other portions of remote game play which may or may not relate to one or more side wagers placed by the SWP. For example, in one embodiment, the SWP may monitor the game play (e.g., via user interface system 2200) of a potential side wager target, for example, without having yet placed any side wager on the target. At a later time when the SWP feels it is appropriate, he or she may select the "Place Bet" button (e.g., in content portion 2212), for example, in order to initiate placement of a side wager on that particular target (and/or other desired targets).

Additionally, as illustrated in the example of FIG. 22, user interface system 2200 may be operable to display available credit content (e.g., 2216), which, for example, may be used to display information relating to the number of credits which are available to the SWP for placing primary game wagers and/or side wagers.

In at least one embodiment, user interface system 2200 may be operable to display other portions of side wager related content such as, for example, one or more of the various types of content/information described herein.

Additional details relating to various aspects of gaming technology are described in U.S. Patent Publication No. US20050159212, entitled "METHOD AND SYSTEM FOR REMOTE WAGERING ON LIVE GAMES OF CHANCE," the entirety of which is incorporated herein by reference for all purposes.

Additional details relating to various aspects of gaming technology are described in U.S. Patent Publication No. US20030109306, entitled "RESTRICTED EPISODE DISTRIBUTION WITH REPEATED BIOMETRIC AUTHENTICATION," the entirety of which is incorporated herein by reference for all purposes.

Additional details relating to various aspects of gaming technology are described in U.S. Pat. No. 6,527,638, entitled "SECURE IMPROVED REMOTE GAMING SYSTEM," the entirety of which is incorporated herein by reference for all purposes.

Additional details relating to various aspects of gaming technology are described in U.S. Pat. No. 6,508,709, entitled "VIRTUAL DISTRIBUTED MULTIMEDIA GAMING METHOD AND SYSTEM BASED ON ACTUAL REGULATED CASINO GAMES," the entirety of which is incorporated herein by reference for all purposes.

Additional details relating to various aspects of gaming technology are described in U.S. Pat. No. 6,527,638, entitled "SECURE IMPROVED REMOTE GAMING SYSTEM," the entirety of which is incorporated herein by reference for all purposes.

Additional details relating to various aspects of gaming technology are described in U.S. Pat. No. 6,508,709, entitled "VIRTUAL DISTRIBUTED MULTIMEDIA GAMING METHOD AND SYSTEM BASED ON ACTUAL REGULATED CASINO GAMES," the entirety of which is incorporated herein by reference for all purposes.

Additional details relating to various aspects of gaming technology are described in U.S. Pat. No. 5,800,268, entitled "METHOD OF PARTICIPATING IN A LIVE CASINO GAME FROM A REMOTE LOCATION," the entirety of which is incorporated herein by reference for all purposes.

Other Features/Benefits/Advantages

Some embodiments of the intelligent multi-player electronic gaming system may include, but are not limited to, one or more of the following features (or combinations thereof):

- Support for multiple simultaneous touch points (e.g., up to 500 multiple simultaneous touch points), for real-time multi-player interaction
- visual computing surface
- Infrared object recognition
- Communal gaming experience
- Ability to provide play of multiple different game themes, game types (e.g., multi-player blackjack, craps, poker, baccarat, roulette, pai gow, sic bo, fantan, etc.), denominations, paytables, etc.
- Ability to provide concurrent of simultaneous play of multiple different game themes, game types (e.g., multi-player blackjack, craps, poker, baccarat, roulette, pai gow, sic bo, fantan, etc.), denominations, paytables, etc.
- Ability to provide play of wheel bonus games (e.g., via networked, multi-table, progressive, etc.)
- Ability to provide play of promotional games
- Ability to detect, recognize and/or identify physical props placed on the surface (e.g., via use of infrared and/or other technologies) to activate various functions/modes of the table
- Ability to automatically detect, recognize and/or identify other objects such as, player tracking cards, hotel keys, gaming chips or wagering tokens, currency, etc.
- Ability to automatically detect, recognize and/or identify promotional player chips, and/or to award promotional credits go to the player based on identified chip information
- Ability to automatically detect, recognize and/or identify PPD devices (e.g., set it down on the display surface, tags and/or computer readable code/patterns on the device are recognized and used to activate the device and sync with wireless audio/video channels of the device, etc)

In one embodiment, the intelligent multi-player electronic gaming system may be configured or designed to be compatible with an O/S platform based, for example, on the Microsoft Windows Vista Operating System, and/or may be configured or designed to use industry standard PC technology for networking, wireless and/or other applications.

The various intelligent multi-player electronic gaming system embodiments described herein provide the first commercially available surface computing gaming table which turns an ordinary gaming tabletop into a vibrant, interactive surface. The product provides effortless interaction with digital content through natural gestures, touch and physical objects. In one embodiment, surface is a 30-inch display in a table-like form factor that's easy for individuals or small groups to interact with in a way that feels familiar, just like in the real world. In essence, it's a surface that comes to life for exploring, learning, sharing, creating, buying and much more.

In at least one embodiment, intelligent multi-player electronic gaming system embodiments described herein use cameras and/or other sensors/input mechanisms to sense objects, hand gestures and touch. This user input is then processed and the result is displayed on the surface using rear projection.

Surface computing is a new way of working with computers that moves beyond the traditional mouse-and-keyboard experience. It is a natural user interface that allows people to interact with digital content the same way they have interacted with everyday items such as photos, paintbrushes and music their entire life: with their hands, with gestures and by putting real-world objects on the surface. Surface computing opens up a whole new category of products for users to interact with.

Various attributes of surface computing may include, but are not limited to, one or more of the following (or combinations thereof):

- Direct interaction. Users can actually "grab" digital information with their hands and interact with content by touch and gesture, without the use of a mouse or keyboard.
- Multi-player, multi-touch contact. Surface computing recognizes many points of contact simultaneously, not just from one finger, as with a typical touch screen, but up to dozens and dozens of items at once.
- Multi-user experience. The horizontal form factor makes it easy for several people to gather around surface computers together, providing a collaborative, face-to-face computing experience.
- Object recognition. Users can place physical objects on the surface to trigger different types of digital responses, including the transfer of digital content.

The various intelligent multi-player electronic gaming system embodiments described herein break down the traditional barriers between people and technology, providing effortless interaction with live table gaming digital content. The various intelligent multi-player electronic gaming system embodiments described herein may change the way people will interact with all kinds of everyday content, including photos, music, a virtual concierge and games. Common, everyday table game play activities now become entertaining, enjoyable and engaging, alone or face-to-face with other players.

In at least one embodiment, the various intelligent multi-player electronic gaming system embodiments described herein enables the next evolution of communal gaming experiences on a casino floor, facilitating, for example:

- Simultaneous play
- Natural social interaction
- Communal as well as Competitive play Player versus House and Player versus Player have traditionally encompassed most casino game designs in the past. True Communal games have never been commercialized. This platform opens a whole new range of game mechanics.

The vision system/object recognition system can recognize various machine readable content (e.g., infrared tags, UPC symbols, etc.) some of which may be invisible to the naked eye. By tagging physical props, the table can perform a host of functions when these props are placed on the surface of the table. Invisible tags can be placed on common items, like hotel keys and player cards to facilitate promotional rewards or games. Tags can also be used for hosted table experiences, like card shoes and discard racks, etc. Cell phones and PDAs can be tagged to access onboard communication systems like Bluetooth.

In at least one embodiment, the intelligent multi-player electronic gaming system may utilize a modern PC platform running the Microsoft Windows Vista Operating System, and using off the shelf technology like USB and Ethernet, thereby allowing this table model and future models to always be network capable, via both wired and/or wireless interfaces. There is enough computing power for stand alone "thick client" gaming, and/or thin client and CDS gaming modes where game decisions are made at a server.

In at least one embodiment, the intelligent multi-player electronic gaming system may include a rugged, yet stylish "wrapper" around the core display system, which, for example, may be provided from another vendor. In at least one embodiment, the "wrapper" may be configured or designed to handle the rigors of a bar and casino environment. Peripheral devices like player tacking interfaces, bill validators and other casino specific hardware and software may be included and/or added so that the device can be used as a casino gaming device.

In at least one embodiment, various intelligent multi-player electronic gaming system embodiments described herein use cameras to "see" the surface of the main display. It is not simply a touch screen type interface. Rather, the intelligent multi-player electronic gaming system may be configured or designed to see everything on the surface of the table and/or adjacent player station zones. It may simultaneously detect and process, in real time, multiple different touches from multiple different players. In at least one embodiment, each different touch point may be dynamically and automatically associated with or linked with a respective player (or other person) at the gaming table. Additionally, it is able to see things (e.g., computer readable markings) that are invisible to humans.

In at least one embodiment, the intelligent multi-player electronic gaming system may provide additional functionality which is not able to be provided by conventional touch screen type interfaces. For example, in one embodiment, four people can have all ten fingers on the surface at the same time. All forty touch points of their fingers are recognized by the computer at the same time, and linked to their associated owners. So if all four were play a tile game, all four of them could simultaneously and independently move or arrange tiles according to each player's preference. In this way, the intelligent multi-player electronic gaming system may enable multiple players to concurrently engage in multiple independent activities at the same time, on the same screen, display surface, and/or input surface. As a result, no one has to take turns, no one has to track anything. Secure, communal gaming applications can be a reality.

In at least one embodiment, the intelligent multi-player electronic gaming system may enable functionality relating to other game play concepts/features such as, for example: tournament play with multiple tables; head to head play on and/or between tables; etc. This is in addition to the simple social factor of allowing people to play together on a table, versus playing against each other or against a dealer. Also, it opens the door for traditional types of player input and/or real-time object recognition. For example, players can simply gesture to make something happen, versus pressing a button. For example, in one embodiment, a game of blackjack may be played on an intelligent multi-player electronic gaming system, and a player may be able to split their hand (e.g., of paired 8's) by simply placing their fingers over the virtual cards and spreading their cards out to cause the computer to recognize the split action.

Other System Embodiments

Figure 25:
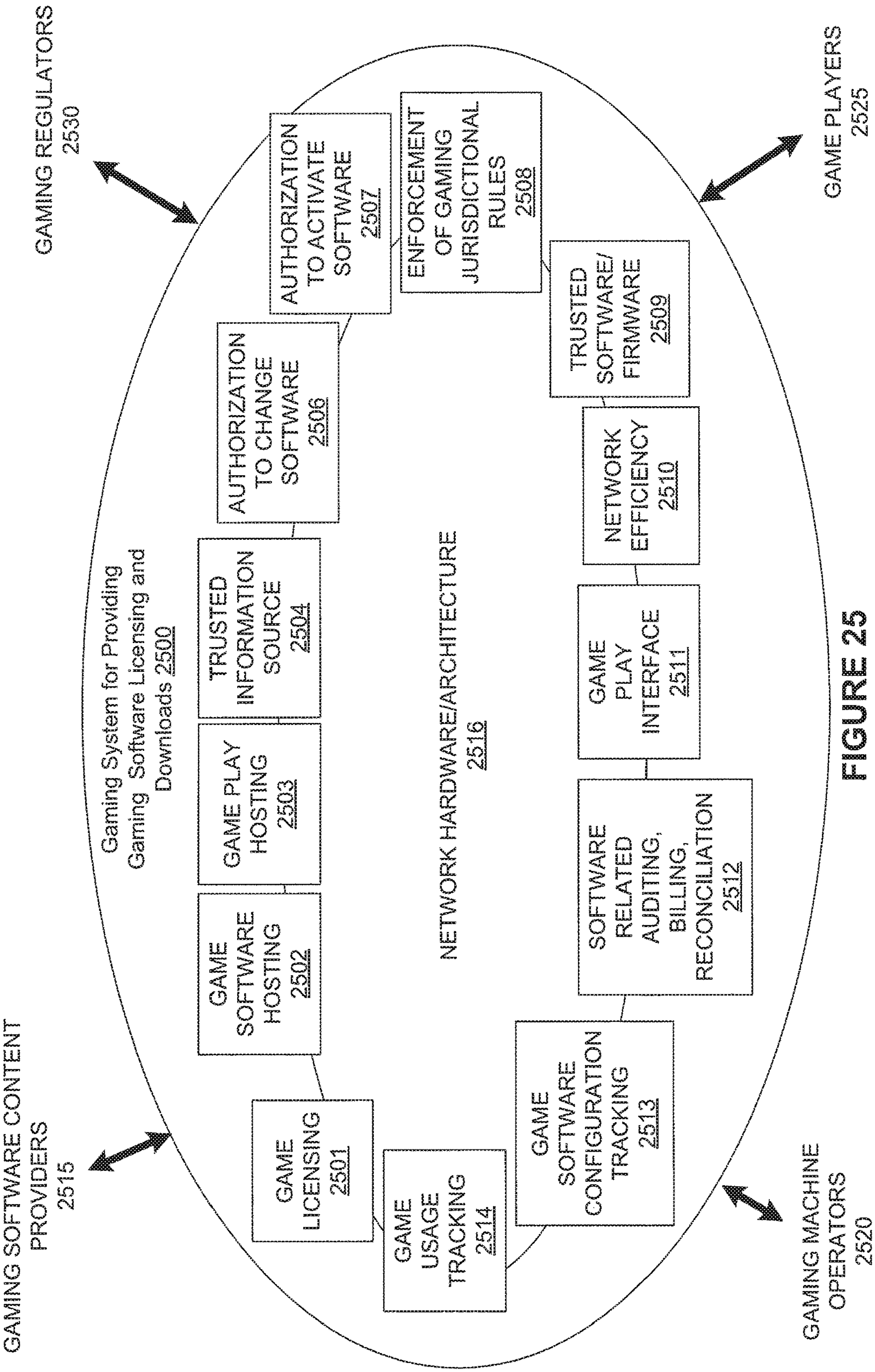
FIG. 25 shows a block diagram illustrating components of a gaming network 2500 which may be used for implementing various aspects of example embodiments.

FIG. 25 shows a block diagram illustrating components of a gaming network 2500 which may be used for implementing various aspects of example embodiments. In FIG. 25, the components of a gaming network 2500 for providing game software licensing and downloads are described functionally. The described functions may be instantiated in hardware, firmware and/or software and executed on a suitable device. In the gaming network 2500, there may be many instances of the same function, such as multiple game play interfaces 2511. Nevertheless, in FIG. 25, only one instance of each function is shown. The functions of the components may be combined. For example, a single device may comprise the game play interface 2511 and include trusted memory devices or sources 2509.

The gaming network 2500 may receive inputs from different groups/entities and output various services and or information to these groups/entities. For example, game players 2525 primarily input cash or indicia of credit into the gaming network, make game selections that trigger software downloads, and receive entertainment in exchange for their inputs. Game software content providers 2515 provide game software for the gaming network and may receive compensation for the content they provide based on licensing agreements with the gaming machine operators. Gaming machine operators select game software for distribution, distribute the game software on the gaming devices in the gaming network 2500, receive revenue for the use of their software and compensate the gaming machine operators. The gaming regulators 2530 may provide rules and regulations that must be applied to the gaming network and may receive reports and other information confirming that rules are being obeyed.

In the following paragraphs, details of each component and some of the interactions between the components are described with respect to FIG. 25. The game software license host 2501 may be a server connected to a number of remote gaming devices that provides licensing services to the remote gaming devices. For example, in other embodiments, the license host 2501 may 1) receive token requests for tokens used to activate software executed on the remote gaming devices, 2) send tokens to the remote gaming devices, 3) track token usage and 4) grant and/or renew software licenses for software executed on the remote gaming devices. The token usage may be used in utility based licensing schemes, such as a pay-per-use scheme.

In another embodiment, a game usage-tracking host 2514 may track the usage of game software on a plurality of devices in communication with the host. The game usage-tracking host 2514 may be in communication with a plurality of game play hosts and gaming machines. From the game play hosts and gaming machines, the game usage tracking host 2514 may receive updates of an amount that each game available for play on the devices has been played and on amount that has been wagered per game. This information may be stored in a database and used for billing according to methods described in a utility based licensing agreement.

The game software host 2502 may provide game software downloads, such as downloads of game software or game firmware, to various devious in the game system 2500. For example, when the software to generate the game is not available on the game play interface 2511, the game software host 2502 may download software to generate a selected game of chance played on the game play interface. Further, the game software host 2502 may download new game content to a plurality of gaming machines via a request from a gaming machine operator.

In one embodiment, the game software host 2502 may also be a game software configuration-tracking host 2513. The function of the game software configuration-tracking host is to keep records of software configurations and/or hardware configurations for a plurality of devices in communication with the host (e.g., denominations, number of paylines, paytables, max/min bets). Details of a game software host and a game software configuration host that may be used with example embodiments are described in U.S. Pat. No. 6,645,077, by Rowe, entitled, "Gaming Terminal Data Repository and Information System," filed Dec. 21, 2000, which is incorporated herein in its entirety and for all purposes.

A game play host device 2503 may be a host server connected to a plurality of remote clients that generates games of chance that are displayed on a plurality of remote game play interfaces 2511. For example, the game play host device 2503 may be a server that provides central determination for a bingo game play played on a plurality of connected game play interfaces 2511. As another example, the game play host device 2503 may generate games of chance, such as slot games or video card games, for display on a remote client. A game player using the remote client may be able to select from a number of games that are provided on the client by the host device 2503. The game play host device 2503 may receive game software management services, such as receiving downloads of new game software, from the game software host 2502 and may receive game software licensing services, such as the granting or renewing of software licenses for software executed on the device 2503, from the game license host 2501.

In particular embodiments, the game play interfaces or other gaming devices in the gaming network 2500 may be portable devices, such as electronic tokens, cell phones, smart cards, tablet PC's and PDA's. The portable devices may support wireless communications and thus, may be referred to as wireless mobile devices. The network hardware architecture 2516 may be enabled to support communications between wireless mobile devices and other gaming devices in gaming network. In one embodiment, the wireless mobile devices may be used to play games of chance.

The gaming network 2500 may use a number of trusted information sources. Trusted information sources 2504 may be devices, such as servers, that provide information used to authenticate/activate other pieces of information. CRC values used to authenticate software, license tokens used to allow the use of software or product activation codes used to activate to software are examples of trusted information that might be provided from a trusted information source 2504. Trusted information sources may be a memory device, such as an EPROM, that includes trusted information used to authenticate other information. For example, a game play interface 2511 may store a private encryption key in a trusted memory device that is used in a private key-public key encryption scheme to authenticate information from another gaming device.

When a trusted information source 2504 is in communication with a remote device via a network, the remote device will employ a verification scheme to verify the identity of the trusted information source. For example, the trusted information source and the remote device may exchange information using public and private encryption keys to verify each other's identities. In another example of an embodiment, the remote device and the trusted information source may engage in methods using zero knowledge proofs to authenticate each of their respective identities. Details of zero knowledge proofs that may be used with example embodiments are described in US publication no. 2003/0203756, by Jackson, filed on Apr. 25, 2002 and entitled, "Authentication in a Secure Computerized Gaming network, which is incorporated herein in its entirety and for all purposes.

Gaming devices storing trusted information might utilize apparatus or methods to detect and prevent tampering. For instance, trusted information stored in a trusted memory device may be encrypted to prevent its misuse. In addition, the trusted memory device may be secured behind a locked door. Further, one or more sensors may be coupled to the memory device to detect tampering with the memory device and provide some record of the tampering. In yet another example, the memory device storing trusted information might be designed to detect tampering attempts and clear or erase itself when an attempt at tampering has been detected.

The gaming network 2500 of example embodiments may include devices 2506 that provide authorization to download software from a first device to a second device and devices 2507 that provide activation codes or information that allow downloaded software to be activated. The devices, 2506 and 2507, may be remote servers and may also be trusted information sources. One example of a method of providing product activation codes that may be used with example embodiments is describes U.S. Pat. No. 6,264,561, the entirety of which is incorporated herein by reference for all purposes.

A device 2506 that monitors a plurality of gaming devices to determine adherence of the devices to gaming jurisdictional rules 2508 may be included in the gaming network 2500. In one embodiment, a gaming jurisdictional rule server may scan software and the configurations of the software on a number of gaming devices in communication with the gaming rule server to determine whether the software on the gaming devices is valid for use in the gaming jurisdiction where the gaming device is located. For example, the gaming rule server may request a digital signature, such as CRC's, of particular software components and compare them with an approved digital signature value stored on the gaming jurisdictional rule server.

Further, the gaming jurisdictional rule server may scan the remote gaming device to determine whether the software is configured in a manner that is acceptable to the gaming jurisdiction where the gaming device is located. For example, a maximum bet limit may vary from jurisdiction to jurisdiction and the rule enforcement server may scan a gaming device to determine its current software configuration and its location and then compare the configuration on the gaming device with approved parameters for its location.

A gaming jurisdiction may include rules that describe how game software may be downloaded and licensed. The gaming jurisdictional rule server may scan download transaction records and licensing records on a gaming device to determine whether the download and licensing was carried out in a manner that is acceptable to the gaming jurisdiction in which the gaming device is located. In general, the game jurisdictional rule server may be utilized to confirm compliance to any gaming rules passed by a gaming jurisdiction when the information needed to determine rule compliance is remotely accessible to the server.

Game software, firmware or hardware residing a particular gaming device may also be used to check for compliance with local gaming jurisdictional rules. In one embodiment, when a gaming device is installed in a particular gaming jurisdiction, a software program including jurisdiction rule information may be downloaded to a secure memory location on a gaming machine or the jurisdiction rule information may be downloaded as data and utilized by a program on the gaming machine. The software program and/or jurisdiction rule information may used to check the gaming device software and software configurations for compliance with local gaming jurisdictional rules. In another embodiment, the software program for ensuring compliance and jurisdictional information may be installed in the gaming machine prior to its shipping, such as at the factory where the gaming machine is manufactured.

The gaming devices in game system 2500 may utilize trusted software and/or trusted firmware. Trusted firmware/software is trusted in the sense that is used with the assumption that it has not been tampered with. For instance, trusted software/firmware may be used to authenticate other game software or processes executing on a gaming device. As an example, trusted encryption programs and authentication programs may be stored on an EPROM on the gaming machine or encoded into a specialized encryption chip. As another example, trusted game software, i.e., game software approved for use on gaming devices by a local gaming jurisdiction may be required on gaming devices on the gaming machine.

In example embodiments, the devices may be connected by a network 2516 with different types of hardware using different hardware architectures. Game software can be quite large and frequent downloads can place a significant burden on a network, which may slow information transfer speeds on the network. For game-on-demand services that require frequent downloads of game software in a network, efficient downloading is essential for the service to viable. Thus, in example embodiments, network efficient devices 2510 may be used to actively monitor and maintain network efficiency. For instance, software locators may be used to locate nearby locations of game software for peer-to-peer transfers of game software. In another example, network traffic may be monitored and downloads may be actively rerouted to maintain network efficiency.

One or more devices in example embodiments may provide game software and game licensing related auditing, billing and reconciliation reports to server 2512. For example, a software licensing billing server may generate a bill for a gaming device operator based upon a usage of games over a time period on the gaming devices owned by the operator. In another example, a software auditing server may provide reports on game software downloads to various gaming devices in the gaming network 2500 and current configurations of the game software on these gaming devices.

At particular time intervals, the software auditing server 2512 may also request software configurations from a number of gaming devices in the gaming network. The server may then reconcile the software configuration on each gaming device. In one embodiment, the software auditing server 2512 may store a record of software configurations on each gaming device at particular times and a record of software download transactions that have occurred on the device. By applying each of the recorded game software download transactions since a selected time to the software configuration recorded at the selected time, a software configuration is obtained. The software auditing server may compare the software configuration derived from applying these transactions on a gaming device with a current software configuration obtained from the gaming device. After the comparison, the software-auditing server may generate a reconciliation report that confirms that the download transaction records are consistent with the current software configuration on the device. The report may also identify any inconsistencies. In another embodiment, both the gaming device and the software auditing server may store a record of the download transactions that have occurred on the gaming device and the software auditing server may reconcile these records.

There are many possible interactions between the components described with respect to FIG. 25. Many of the interactions are coupled. For example, methods used for game licensing may affect methods used for game downloading and vice versa. For the purposes of explanation, details of a few possible interactions between the components of the gaming network 2500 relating to software licensing and software downloads have been described. The descriptions are selected to illustrate particular interactions in the game system 2500. These descriptions are provided for the purposes of explanation only and are not intended to limit the scope of example embodiments described herein.

Techniques and mechanisms of the present invention will sometimes be described in singular form for clarity. However, it should be noted that particular embodiments include multiple iterations of a technique or multiple instantiations of a mechanism unless noted otherwise.

This application incorporates by reference for all purposes U.S. patent application Ser. No. 11/472,585 entitled "MOBILE DEVICE FOR PROVIDING FILTERED CASINO INFORMATION BASED ON REAL TIME DATA."

This application incorporates by reference for all purposes U.S. patent application Ser. No. 11/642,410 entitled "DYNAMIC SIDE WAGERING SYSTEM FOR USE WITH ELECTRONIC GAMING DEVICES."

Although several preferred embodiments of this invention have been described in detail herein with reference to the accompanying drawings, it is to be understood that the invention is not limited to these precise embodiments, and that various changes and modifications may be effected therein by one skilled in the art without departing from the scope of spirit of the invention as defined in the appended claims.

The invention is claimed as follows:

1. A gaming system comprising:

a processor; and a memory device which stores a plurality of instructions, which when executed by the processor, cause the processor to:

following a selection, by a first player, of a second player associated with a qualifying side wager target rating value, initiate a search for any side wagers available to be placed on any events associated with the selected second player, responsive to the search identifying a side wager available to be placed on an event associated with the second player, communicate, via a wireless data network, data to a mobile device which results in the mobile device displaying to the first player the identified side wager available to be placed on the event, wherein responsive to the second player being associated with a first qualifying side wager target rating value, the identified side wager on the event is associated with a first probability of being a randomly determined winning side wager, and responsive to the second player being associated with a second, different qualifying side wager target rating value, the identified side wager on the event is associated with a second, different probability of being the randomly determined winning side wager, and receive, via the wireless data network and from the mobile device, data associated with a placement of the identified side wager on the event.

2. The gaming system of claim 1, wherein the qualifying side wager target rating value of the second player comprises a value corresponding to game play information over a designated period of time.

3. The gaming system of claim 2, wherein the event comprises a game subsequently played by the second player.

4. The gaming system of claim 1, wherein the event comprises an event associated with a play of a skill-based game.

5. The gaming system of claim 1, wherein the event comprises an event associated with a play of a table game occurring at a gaming table.

6. The gaming system of claim 1, wherein the event comprises an event associated with a play of a wagering game occurring at an electronic gaming machine.

7. The gaming system of claim 1, wherein when executed by the processor, the plurality of instructions cause the processor to filter the initiated search based on a criteria specified by the first player.

8. The gaming system of claim 7, wherein the criteria specified by the first player comprises one of, for an electronic gaming machine, percentage of wins or losses over one or more specified time intervals, winning or losing streaks, duration of a currently active gaming session, number of consecutive wins or losses over one or more specified time intervals, amounts wagered, amounts won or lost, statistical analysis of actual wins or losses as compared to theoretical wins or losses over one or more specified time intervals, and game play speed.

9. The gaming system of claim 1, wherein when executed by the processor responsive to not receiving data associated with the placement of the side wager on the event, the plurality of instructions cause the processor to, based on a criteria specified by the first player, automatically place the side wager on the event.

10. The gaming system of claim 1, wherein the side wager comprises a single proposition bet dependent on outcomes of a plurality of players across a plurality of games.

11. The gaming system of claim 1, wherein when executed by the processor, the plurality of instructions cause the processor to:

receive a request to subscribe to messages related to the side wager on the event;

authenticate, via the mobile device, the first player; and response to successful authentication of the first player, provide the messages related to the side wager to the first player, wherein the messages are encrypted.

12. A gaming system comprising:

a processor; and a memory device which stores a plurality of instructions, which when executed by the processor, cause the processor to:

initiate a search for any side wagers available to be placed on any events associated with any plays of any games by a first player associated with a value corresponding to game play information over a designated period of time which exceeds a predetermined value, responsive to the search identifying a side wager available to be placed on an event associated with a play of a game by the first player, communicate, via a wireless data network, data to a mobile device which results in the mobile device displaying to a second, different player the identified side wager available to be placed on the event associated with the play of the game by the first player, receive, via the wireless data network and from the mobile device, data associated with a placement of the identified side wager on the event associated with the play of the game by the first player; and responsive to not receiving data associated with the placement of the identified side wager on the event associated with the play of the game by the first player and based on a criteria specified by the second player prior to initiating the search, automatically place the identified side wager on the event associated with the play of the game by the first player.

13. A method of operating a gaming system, the method comprising:

following a selection, by a first player, of a second player associated with a qualifying side wager target rating value, initiating, by a processor, a search for any side wagers available to be placed on any events associated with the second player, responsive to the search identifying a side wager available to be placed on an event associated with the second player, communicating, via a wireless data network, data to a mobile device which results in the mobile device displaying to the first player the identified side wager, wherein responsive to the second player being associated with a first qualifying side wager target rating value, the identified side wager on the event is associated with a first probability of being a randomly determined winning side wager, and responsive to the second player being associated with a second, different qualifying side wager target rating value, the identified side wager on the event is associated with a second, different probability of being the randomly determined winning side wager, and receiving, via the wireless data network and from the mobile device, data associated with a placement of the identified side wager on the event.

14. The method of claim 13, wherein the qualifying side wager target rating value of the second player comprises a value corresponding to game play information over a designated period of time.

15. The method of claim 14, wherein the event comprises a game subsequently played by the second player.

16. The method of claim 13, wherein the event comprises an event associated with a play of a skill-based game.

17. The method of claim 13, wherein the event comprises an event associated with a play of a table game occurring at a gaming table.

18. The method of claim 13, wherein the event comprises an event associated with a play of a wagering game occurring at an electronic gaming machine.

19. The method of claim 13, further comprising filtering, by the processor, the initiated search based on a criteria specified by the first player.

20. The method of claim 13, further comprising, responsive to not receiving data associated with the placement of the side wager on the event and based on a criteria specified by the first player, automatically placing, by the processor, the side wager on the event.

* * * * *